(12) United States Patent  (10) Patent No.: US 7,646,919 B2
Olsson et al.  (45) Date of Patent: Jan. 12, 2010

(54) GRAPHICS ENGINE FOR HIGH PRECISION LITHOGRAPHY

(75) Inventors: Martin Olsson, Linköping (SE); Stefan Gustavson, Norrköping (SE); Torbjörn Sandström, Pixbo (SE); Per Elmfors, Huddinge (SE)

(73) Assignee: Micronic Laser Systems AB, Taby (SE)

( * ) Notice: Subject to any disclaimer, the term of this patent is extended or adjusted under 35 U.S.C. 154(b) by 230 days.

(21) Appl. No.: 11/934,485

(22) Filed: Nov. 2, 2007

(65) Prior Publication Data

US 2008/0080782 A1    Apr. 3, 2008

Related U.S. Application Data

(62) Division of application No. 09/954,721, filed on Sep. 12, 2001, now Pat. No. 7,302,111.

(51) Int. Cl.
G06K 9/48 (2006.01)
G06K 9/40 (2006.01)

(52) U.S. Cl. ........................ 382/199; 382/266

(58) Field of Classification Search ................ 382/199, 382/190, 202, 260, 266, 209, 289; 358/3.15, 358/462, 1.2, 1.11
See application file for complete search history.

(56) References Cited

U.S. PATENT DOCUMENTS 4,758,965 A    7/1988  Liang et al.
4,879,605 A   11/1989  Warkentin et al.
4,908,780 A    3/1990  Priem et al.
5,103,101 A    4/1992  Berglund et al.
5,278,949 A    1/1994  Thayer
5,323,002 A    6/1994  Sampsell et al.
5,477,272 A *  12/1995 Zhang et al. ........... 375/240.06
5,504,504 A    4/1996  Markandey et al.
5,533,170 A    7/1996  Teitzel et al.
5,586,199 A   12/1996  Kanda et al.
5,589,851 A * 12/1996  Valdes et al. ................. 345/611
5,594,854 A    1/1997  Baldwin et al.
5,671,297 A    9/1997  Koppe et al.
5,673,376 A    9/1997  Ray et al.
5,684,510 A   11/1997  Brassell et al.

(Continued)

FOREIGN PATENT DOCUMENTS

EP              0344952           12/1989

(Continued)

OTHER PUBLICATIONS

International Search Report from the International Searching Authority for International Application No. PCT/SE02/01609 mailed Feb. 4, 2003.

(Continued)

*Primary Examiner*—Jerome Grant, II
(74) *Attorney, Agent, or Firm*—Ernest J. Beffel, Jr.; Haynes Beffel & Wolfeld LLP

(57) ABSTRACT

The present invention includes a method to use a phase modulating micromirror array to create an intensity image that has high image fidelity, good stability through focus and good x-y symmetry. Particular aspects of the present invention are described in the claims, specification and drawings.

13 Claims, 50 Drawing Sheets

U.S. PATENT DOCUMENTS

| | | | |
|---|---|---|---|
| 5,754,618 A * | 5/1998 | Okamoto et al. | 378/4 |
| 5,801,708 A * | 9/1998 | Alcorn et al. | 345/587 |
| 5,822,504 A | 10/1998 | Ishibashi et al. | |
| 5,872,902 A | 2/1999 | Kuchkuda et al. | |
| 5,903,273 A | 5/1999 | Mochizuki et al. | |
| 5,949,913 A | 9/1999 | Shimazu et al. | |
| 6,072,510 A | 6/2000 | Ogletree et al. | |
| 6,169,282 B1 | 1/2001 | Maeda et al. | |
| 6,188,427 B1 | 2/2001 | Anderson et al. | |
| 6,201,545 B1 | 3/2001 | Wong et al. | |
| 6,339,479 B1 | 1/2002 | Kishimoto et al. | |
| 6,542,161 B1 | 4/2003 | Koyama et al. | |
| 6,542,171 B1 | 4/2003 | Satou et al. | |
| 6,611,241 B1 | 8/2003 | Firester et al. | |
| 6,618,185 B2 | 9/2003 | Sandstrom et al. | |
| 6,690,836 B2 * | 2/2004 | Natarajan et al. | 382/250 |
| 6,829,382 B2 * | 12/2004 | Lee et al. | 382/151 |
| 6,850,236 B2 * | 2/2005 | Deering | 345/428 |
| 6,978,045 B1 * | 12/2005 | Hashimoto et al. | 382/199 |
| 7,151,863 B1 * | 12/2006 | Bradley et al. | 382/299 |
| 7,239,735 B2 * | 7/2007 | Nozaki | 382/141 |
| 7,302,111 B2 * | 11/2007 | Olsson et al. | 382/266 |
| 2003/0038811 A1 | 2/2003 | Gritz et al. | |

FOREIGN PATENT DOCUMENTS

| | | |
|---|---|---|
| EP | 0814431 | 12/1997 |
| EP | 0851387 | 7/1998 |
| WO | WO-0049577 | 8/2000 |
| WO | WO-0193303 | 12/2001 |

OTHER PUBLICATIONS

Written Opinion of the International Preliminary Examining Authority for International Application No. PCT/SE02/01609 mailed Aug. 12, 2003.

International Preliminary Examination Report for International Application No. PCT/SE02/01609 completed Dec. 4, 2003.

Larry J. Hornbeck "From Cathode Rays to Digital Micromirrors: A History of Electronic Projection Display Technology" Digital Light Processing—Introduction TI Technical Journal Jul.-Sep. 1998 pp. 7-45.

* cited by examiner

FIG. 16A  FIG. 16B

FIG. 16D m = number of substrips
n = number of stamps per strip n = number of stamps per strip

GRAPHICS ENGINE FOR HIGH PRECISION LITHOGRAPHY

RELATED APPLICATION INFORMATION

This application is a divisional of application Ser. No. 09/954,721 filed on 12 Sep. 2001 in the United States Patent and Trademark Office, entitled GRAPHICS ENGINE FOR HIGH PRECISION LITHOGRAPHY, by the same inventors. The related application is incorporated herein by reference, as if set forth in its entirety.

FIELD OF THE INVENTION

The invention relates to rendering high precision images with sub-pixel resolution. This invention is applicable to production of reticles and large area masks, direct writing of patterns and inspection of reticles or other patterned work pieces. Aspects of the invention can apply to both SLM and scanning technologies.

BACKGROUND OF THE INVENTION

Equipment for semi-conductor manufacturing includes writers and inspection equipment for producing images on reticles and large area masks, for direct writing of patterns for chips, and for inspection of patterned work pieces. Over time, chips have become increasingly complex and dense, as processors, memory circuits and other semi-conductors have gained greater capacity. Memory circuits, in particular, and all circuits with small feature sizes, in general, have become denser. Patterns for these circuits have become even more complex than the circuits, as optical proximity and laser proximity correction features have been added to the patterns. The equipment and writing strategies have become increasingly sophisticated, in response to requirements for smaller features on chips and tighter critical dimensions. One description of equipment and writing strategies developed years ago to meet the needs for semi-conductor manufacturing equipment is found in U.S. Pat. No. 5,533,170 issued to Teitzel et al. on Jul. 2, 1996.

Another challenge for manufacturers is to compensate for variations in process chemistries, such as variations in responsiveness of resists to exposing radiations. Variations are found in the response of different types and even batches of resists to exposure. Resists sometimes respond differently near the edges and in the corners of coated work pieces.

As manufacturers strive to keep pace with the Moore's law, there is a continuing need for writers and inspection equipment that can process large volumes of geometric figures and produce precise patterns on work pieces. There is a corollary need for techniques, methods and equipments that compensate for variations in resist and other process variables, while producing the needed precise patterns.

SUMMARY OF THE INVENTION

Aspects of the present invention may be combined to process large volumes of geometric figures and generate precise patterns on work pieces using SLM projection technology, for instance. Additional aspects of the present invention facilitate compensation for variations in resist response and other process variable.

One embodiment of the present invention is a data path and plurality of processor that accept fractured geometry data as input and generate driving values for micromirrors in a micromirror array as output. In this embodiment, the method includes mapping the work piece into overlap regions, corresponding to patterns of intended energy contributions from a plurality of overlapping exposures onto regions of the work piece; rendering fractured polygons to gray scale pixel values using dual resolution memories for a pixel map and for micropixel arrays corresponding to pixels in the pixel map; calculating exposure values for the grayscale pixel values, taking into account the overlap regions; contouring the exposure values based on individual micromirror characteristics; and outputting the contoured exposure values. The mapping step may produce nine overlap regions, 81 overlap regions or some other number of overlap regions, depending on the number of passes for printing. The calculating step may use the overlap regions to take into account the cumulative dose resulting from multiple exposures. This method may further include buffering contoured exposure values in at least one segmented buffer, which is coupled to a set of mirror pixel drivers. The buffer may be dual segmented, having a first segmentation corresponding to rendering engines and a second segmentation corresponding to regions of a micromirror array. The first segmentation and second segmentation of the buffer may be different. A plurality of buffers may be used to collect data for output. Output from the buffer may be directed to digital to analog converters. A further aspect of this embodiment is that the overlap regions or zones is to take into account pulse to pulse variations in energy applied to the work piece. During the course of printing, the illumination of the overlap zones may be adjusted to take into account resist affects on the work piece, such as aging of the resist, activation of the resist by multiple exposures, and variations in the sensitivity of the resist, especially at edges or corners of the work piece.

Various sub combinations of the first embodiment are useful in their own right. The application of overlap zones in a stamp oriented process is useful. Rendering geometric figures to gray scale pixel values in dual resolution memories, including a pixel map and micropixel arrays corresponding to pixels in the pixel map is useful. Computations take into account overlaps between stamps, to take into account overlaps between multiple passes, and to take into account pulse to pulse variations in exposing energy are all useful, individually or in combination. Contouring of exposure values based on individual micromirror characteristics, instead of general characteristics of the micromirror array, is useful. Pair-wise combinations of these aspects of the first embodiment are also useful.

An additional embodiment of the present invention is use of the guard zone as an alternative to clipping. This includes providing a smaller address window corresponding to a memory; providing a larger address window creating a guard zone around the smaller addressing window, which is addressable but does not correspond to the memory; receiving a polygon contained within the larger addressing window; rendering at least sections of the polygon into the larger address window; and writing data for the rendered sections of the polygon within the smaller address window to the memory while discarding rendered sections of the polygon outside the smaller window. A further aspect of this embodiment is that the rendering step may be carried out without distinction between portions of the polygon that are inside, versus outside the smaller addressing window. This method may be carried out without clipping the polygon to fit the smaller addressing window. The discarding of rendered sections of the polygon may take place before data is sent to a memory controller, by a filter, or in the memory controller, by comparing memory address signals with valid addresses of the smaller addressing window in using the result of the comparison to control one or more memory arbitration signals, such as write enable signals. This embodiment and its various aspects may be further enhanced by including a stamp of filtering a set of polygons so that at least a portion of the polygon received and rendered lies inside the smaller addressing window.

A variation on the alternative embodiment is a method of rendering polygons to a larger addressing window, the larger addressing window comprising a smaller addressing window corresponding to a memory and a guard zone outside the smaller addressing window, the guard zone being addressable but not corresponding to the memory. This method may include receiving a polygon contained within the larger addressing window; repeatedly selecting a section of the polygon and converting it into rasterized representation data; processing the rasterized representation data so that portions within the smaller addressing window are written to memory and portions outside that window are not written to memory. The aspects of this variation may be similar to the first variation on this embodiment. The converting step may be carried out without the distinction between portions of the polygon inside, versus outside the smaller addressing window. Clipping the polygon to fit the smaller addressing window may be avoided. The rasterized representation data may be filtered before it is written to a memory controller or to memory. Alternatively, it may be filtered in a memory controller, as described above. The input polygons may be filtered so that at least a portion of each polygon lies inside the smaller addressing window. This variation may further include constraining polygons received or input so that those polygons are small enough to fit within the guard zone.

A device corresponding to the preceding embodiment may render a polygon contained within a larger addressing window, the larger addressing window comprising a smaller addressing window in a guard zone outside the smaller address window. This device may include a renderer connected to input lines, adapted to receive a polygon contained within a larger addressing window and to repeatedly convert a section of the polygon into rasterized representation data; a memory, corresponding to the smaller addressing window.

A memory controller, connected to the renderer, adapted to process the rasterized representation data and to write rasterized representation data that is within the smaller addressing window to the memory and to discard portions of the rasterized representation data outside the smaller addressing window. The renderer of this device may be adapted to convert sections of the polygon into rasterized representation data without distinction between the portions of the section inside, versus outside the smaller addressing window. The device may operate without clipping received polygons to fit within the smaller addressing window and without requiring that received polygons be contained within the smaller addressing window. A further variation of this device is a device for writing to memory a section of a polygon contained within a larger addressing window, the larger addressing window comprising a smaller addressing window in a guard zone outside the smaller addressing window, the section represented by rasterized representation data and a device including: input lines; a memory corresponding to the smaller address window; and the memory controller connected to the input lines and the memory adapted to receive the rasterized representation data referencing the larger addressing window, to write portions of the rasterized representation data within the smaller addressing window to the memory, and to discard portions of the rasterized representation data within the guard zone. The aspects of this variation may be drawn from either of the preceding methods or the other variation on this embodiment.

A further embodiment of the present invention is a method of representing an area utilizing at least two levels of resolution, including: receiving a polygon representation bounded by edges; repeatedly selecting a section of the polygon for rendering, the section corresponding to pixels; representing the pixels in a first data structure is filled, empty or partially filled, based on the edges of the polygon representation; in representing the partially filled pixels in a second data structure by arrays of sub-pixels that are filled or empty, set arrays defining the edges of the polygon representation and set arrays including at least 3×3 sub-pixels. Alternatively, the arrays may include 4×4 or 8×8 sub-pixels. The polygon may be a quadrangle, a convex quadrangle, a trapezoid or a triangle. Either a quadrangle or a trapezoid representation may have one side of zero length. The pixel representation for filled, empty or partially filled may use two data bits. The method may further include maintaining summaries of the partially filled pixels corresponding to filled or empty sub-pixels in the arrays. These summaries may consist of counts of filled or empty sub-pixels or weighted evaluations of the sub-pixels.

A related embodiment of the present invention is a method of representing an area utilizing at least two levels of resolution, including: receiving a polygon representation bounded by edges; repeatedly selecting a section through the polygon representation for rendering, the section corresponding to pixels; classifying the pixels as filled, empty or partially filled, based on the edges of the polygon representation; and representing partially filled pixels by arrays of sub-pixels that are assigned an intensity level, instead of a filled or empty value. The arrays of sub-pixels define the edge of the polygon representation. These arrays may include at least 3×3 sub-pixels, 4×4 sub-pixels, 8×8 sub-pixels, or 16×16 sub-pixels. As above, the polygon may have several different forms. The pixel map classifying the pixels is filled, empty or partially filled may consist of two bits for each pixel. The method may further include maintaining summaries of the partially filled pixels, corresponding to the intensity levels of the sub-pixels in the arrays. These summaries may be summations of sub-pixel intensity levels or weighted evaluations of the sub-pixels.

A data structure embodiment representing an area having at least one edge, utilizing two levels of resolution, includes; at least one memory; at least one pixel map stored in the memory, representing a pixel as filled, empty or partially filled; and at least one sub-pixel map stored in the memory, corresponding to the pixel map, representing the partially filled pixel by an array of sub-pixels that are filled or empty, the sub-pixels defining the edge of the area, the sub-pixel arrays including at least 3×3 sub-pixels; and the filled or empty pixels being represented without using sub-pixel values to represent them. Another aspect of this embodiment is that it may further include a sub-pixel summary that summarizes filled or empty sub-pixels in the arrays. This embodiment may further include separately addressable memories for the pixel map and the sub-pixel arrays. It may further include separately addressable memories for the pixel map and the sub-pixel summary map.

A variation on this embodiment is a data structure representing at least one trapezoid utilizing two levels of resolution, the trapezoid having first and third parallel edges that are parallel to each other and to a reference axis and having second and fourth opposing edges, the data structure including: at least one memory; at least one pixel map stored in the memory, representing pixels as filled, empty, or partially filled; and at least one sub-pixel array stored in the memory, corresponding to a pixel in the pixel map, representing pixels on the parallel edges and the opposing edges by arrays of sub-pixels. The sub-pixels in these arrays may be filled or empty. These arrays may include at least 3×3 sub-pixels, 4×4 sub-pixels, 8×8 sub-pixels or 16×16 sub-pixels. This data structure may further include a gray value summary memory, summarizing the sub-pixels that are either filled or empty. The summary may be based on a count of sub-pixels that are filled or empty or a weighted evaluation of sub-pixels. The sub-pixels may have binary values or may additionally have intermediate intensity values. The pixel map and sub-pixel arrays may be stored in separately addressable memory. One of the parallel edges of the trapezoid may have a zero length.

A further embodiment of aspects of the present invention is a protocol for transmitting graphic data representing a polygon having a plurality of edges, utilizing two levels of resolution, including: representing a section of the polygon by an array of pixels, the pixels being assigned a value of filled, empty or partially filled; representing the partially filled pixel by a sub-pixel array, the sub-pixels being assigned a value filled or empty defining at least part of an edge, the array including at least 3×3 sub-pixels; and transmitting a representation of the array of pixels and a plurality of arrays of sub-pixels using at least first channel and an independent second channel, the first channel being used for the representation of the array of pixels in the second channel being used for the arrays of sub-pixels. In this embodiment, the sub-pixel array may alternatively include at least 4×4, 8×8 or 16×16 sub-pixels. The representation of the array of pixels may be run length encoded. The polygon may be a trapezoid, the trapezoid having first and third parallel sides being parallel to a reference axis; and a plurality of partially filled pixels along the first or third parallel side may be represented by a single sub-pixel array. This protocol may further include maintaining a sub-pixel summary map summarizing filled or empty sub-pixels in the array. Said summary may be a count of filled or empty sub-pixels in the array or a weighted evaluation of the sub-pixels. The sub-pixels may also have intermediate intensity values, in addition to filled or empty values. The pixels and the sub-pixel arrays may be stored in separately addressable memories. Similarly, the pixels and the sub-pixel summary map may be stored in separately addressable memories. Adjacent pixels of the first or third parallel sides may be represented by the same sub-pixel map. The first or third parallel sides can be assigned a zero length.

Yet another embodiment of the present invention is a method of calculating a value for a multi-value pixel corresponding to at least part of an edge of a polygon, including: providing a sub-pixel array; providing a set of precalculated sub-pixel bar maps, corresponding to edges having particular orientations; representing the part of the edge of the polygon by sub-pixels that are filled or empty, by applying the precalculated sub-pixel bar maps; and super sampling a set of sub-pixels corresponding to a pixel and to assign a gray value to the pixel. In this method, the precalculated sub-pixel bar map may be represented by an array of fill bars and applying the precalculated sub-pixel map may further include applying an offset value to the fill bars corresponding to an intersection of the edge or an extension of the edge with a boundary of an area represented by the array of sub-pixels.

A further aspect of methods utilizing sub-pixel arrays to represent at least part of a polygon edge is a method of defining an edge of a polygon within an area having sides, the area being subdivided into sub-pixels. This method includes: providing a plurality of precalculated sub-pixel bar maps corresponding to potential intercepts and orientations of the polygon edge with the sides of the area, wherein the potential intercepts are limited to discrete positions along the sides of the area in the potential orientations are limited to orientations that connect the discrete positions; determining two out of three of two intercepts of the polygon edge with the sides of the area in an orientation of the polygon edge; and applying one of the pre-calculated sub-pixel bar maps corresponding to two out of three of the two intercepts in the orientation. In one aspect of the present invention, the area is subdivided by no more than 256 sub-pixels and the discrete positions are limited to no more than 65 positions per sub-pixel. Alternatively, the area is subdivided by no more than 64 sub-pixels and the discrete positions are limited to no more than 33 positions per sub-pixel. In yet another configuration, the area is subdivided into no more than 32×16 sub-pixels and there are no more than 17 discrete positions along the edge of the sub-pixel; or the area can be subdivided into no more than 16×8 sub-pixels, an edge of the sub-pixel having no more than nine discrete positions. A further aspect of this embodiment is that the pre-calculated sub-pixel bar maps may be limited to a set of potential orientations forming a range of approximately 45 degrees and this range of pre-calculated sub-pixel bar maps can be transformed to cover a range of approximately 180 degrees. The sides of the area intercepted by the polygon edge may either be opposing sides or adjacent sides. Variations in this embodiment may involve using the polygon edge and an extension of the polygon edge to construct intercepts with sides of the area. The orientation of the polygon edge may be determined and utilized in this method or it may be ignored, as the two intercepts define the polygon edge.

Sub-pixel bar map selection is a further embodiment of the present invention. A method of selecting a sub-pixel bar map to represent an edge intersecting an area, the area having at least first and second sides and the area being subdivided into sub-pixels, the method includes: construction segment between intercepts along the first and second sides, the segment defining first and second regions of the area, wherein the intercepts are limited to discrete positions along the sides of the area; forming candidate sets of sub-pixels to represent the first region, the sub-pixels in the candidate sets being completely or partially within the first region: determining a variance between area coverage of the candidate sets and the area coverage of the first region; evaluating corners formed by combining candidate sets with sub-pixel bar maps for other segments; selecting among the candidate sets based on the determination of variance in the evaluation of corners; and storing the selected set in a memory. This embodiment further may include repeating said method for a set of segments defining potential intercepts along the first side and culling redundant sets. Culling redundant sets may take into account a maximum number of sets to represent the set of segments or it may take into account a maximum acceptable error from using sets to represent the set of segments. A variation on this embodiment is a method of precalculating sub-pixel bar maps for sub-pixels corresponding to pixels, to define part of a polygon edge, including: providing potential first intercepts for a line corresponding to the polygon edge along a side of one of the sub-pixels on a first side of a pixel pair; providing potential second intercepts for the line along a second side of the pixel pair opposed to the first side, wherein the potential first and second intercepts are limited to discrete positions; providing segments connecting the first potential intercepts and the second potential intercepts, spanning a predetermined range of angles; and selecting sub-pixel bar maps to define regions bounded by the segments, wherein the selection of sub-pixel bar maps takes into account variation between area coverage of the sub-pixel bar maps and area coverage of the region, and further takes into account evaluation of corners formed by combining sub-pixel bar maps. The range of angles spanned by the segments may include approximately 45 degrees or may include approximately 90 degrees. Transformation may be provided to apply the sub-pixel maps to a range of potential segment orientations spanning approximately 180 degrees.

A further application of the present invention is a method of calculating a value of a pixel corresponding to a corner and an intersection of first and second edges of a polygon, including: providing a memory including a first array of sub-pixels and a second array of sub-pixels, both first and second arrays corresponding to a pixel; extending the first and second edges into first and second lines; setting the sub-pixels of the first array to filled or empty, corresponding to the first region defined by the first line; setting the sub-pixels of the second array to filled or empty, corresponding to the second region defined by the second line; calculating an intersection of the first array and the second array; and super sampling a set of sub-pixels in the intersection corresponding to a pixel and assigning a gray value to the pixel. In this embodiment, setting the sub-pixels of the first and second arrays may include application of pre-calculated sub-pixel bar maps corresponding to the first and second regions.

BRIEF DESCRIPTION OF THE DRAWINGS

FIGS. 16A-C illustrate construction of a corner in a sub-pixel grid and calculation of a pixel gray value corresponding to the corner. FIG. 16D illustrates the application of access qualifiers to overlaying one geometric figure on another.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

New chip designs require high precision lithographic equipment for mask making and direct writing. Much data needs to be translated from a geometry domain into a format usable by the lithographic equipment to project the desired image. Data translation techniques can be combined with a variety of lithographic projection equipment.

One variety of lithographic projection uses a micromirror or similar system with individual pixels. A micromirror system uses an array, such as a 512 by 2048 array of pixels with 65 gray values per pixel. This size of system, using a pulse rate of one kHz, requires loading approximately one giga pixels of data per second into the micromirror array. A smaller array, such as 256 by 256 grayscale pixels requires smaller, but still substantial data throughput. A greater depth of gray scaling, such as 257 gray values per pixel, would require somewhat greater data throughput. An alternative micromirror system could use a narrow array of micromirrors, e.g., 1×512, 2×512 or 4×512 mirrors, swept across a work piece.

Another technology for lithographic projection involves the use of one or more scanned beams. The beams can either be scanned systematically to create a raster image, similar to the image on a TV screen, or the beams can be vector scanned to create individual features. The beams maybe laser, electron, ion or particle beams. Most generally, any radiation beam can be used. Data rasterized in accordance with aspects of the present invention can be run length encoded or otherwise compressed for use with scanned beams.

Process Overview

Figure 1A:
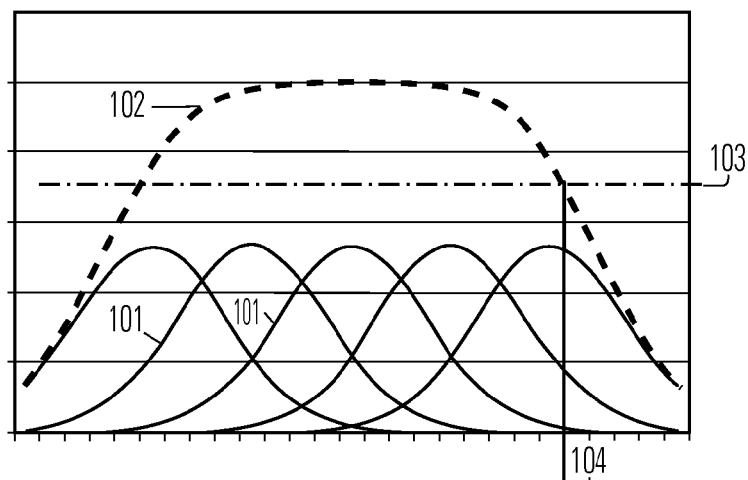
FIGS. 1A-B are a pair of radiation absorption graphs which depict the shifting of an edge by less than one pixel or grid element as a result of reducing the amplitude of exposing radiation at the edge.
Figure 1B:
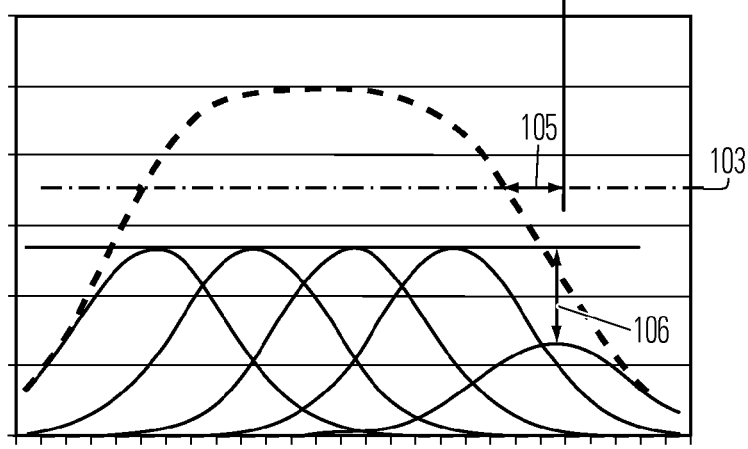

Lithographic equipment is used to project images onto surfaces sensitive to the radiation projected. Typically, a resist is exposed by the radiation. The exposed resist is developed and areas of the resist are removed, corresponding positively or negatively to the projected image. FIG. 1A illustrates two patterns of resist exposure. Individual peaks 101 represent distributions of radiation at evenly spaced positions. For a micromirror system, these positions may represent individual micromirror pixel elements. For a scanned beam system, these positions may represent grid locations to which the beam is intended to scan. The total energy absorbed by the resist is the sum of radiation distributions overlapping the exposed area. The curve 102 represents total absorbed radiation. Resist typically produces very high contrast images. Areas of the resist having total absorbed radiation above a threshold 103 may harden when developed, while areas of resist having less absorbed radiation than the threshold may be removed after development. The width of the feature created at the resist surface corresponds to the distance along the threshold line 103 from one intersection of the total absorbed radiation curve 102 to the other intersection. FIG. 1B illustrates adjustment of the feature size by reducing the radiation dose at one edge of the feature. In FIG. 1B, the edge 104 is moved by a distance 105 when the radiation dose in the right most position is reduced by approximately one half 106. In a micromirror system, an individual mirror element can be adjusted to reduce the radiation dose from a single pixel. In a scanned radiation system, the intensity of the scanning radiation can be reduced at a particular position or the radiation can be blanked out shortly before the beam reaches a particular position in its scan.

System Architecture Overview

Figure 2:
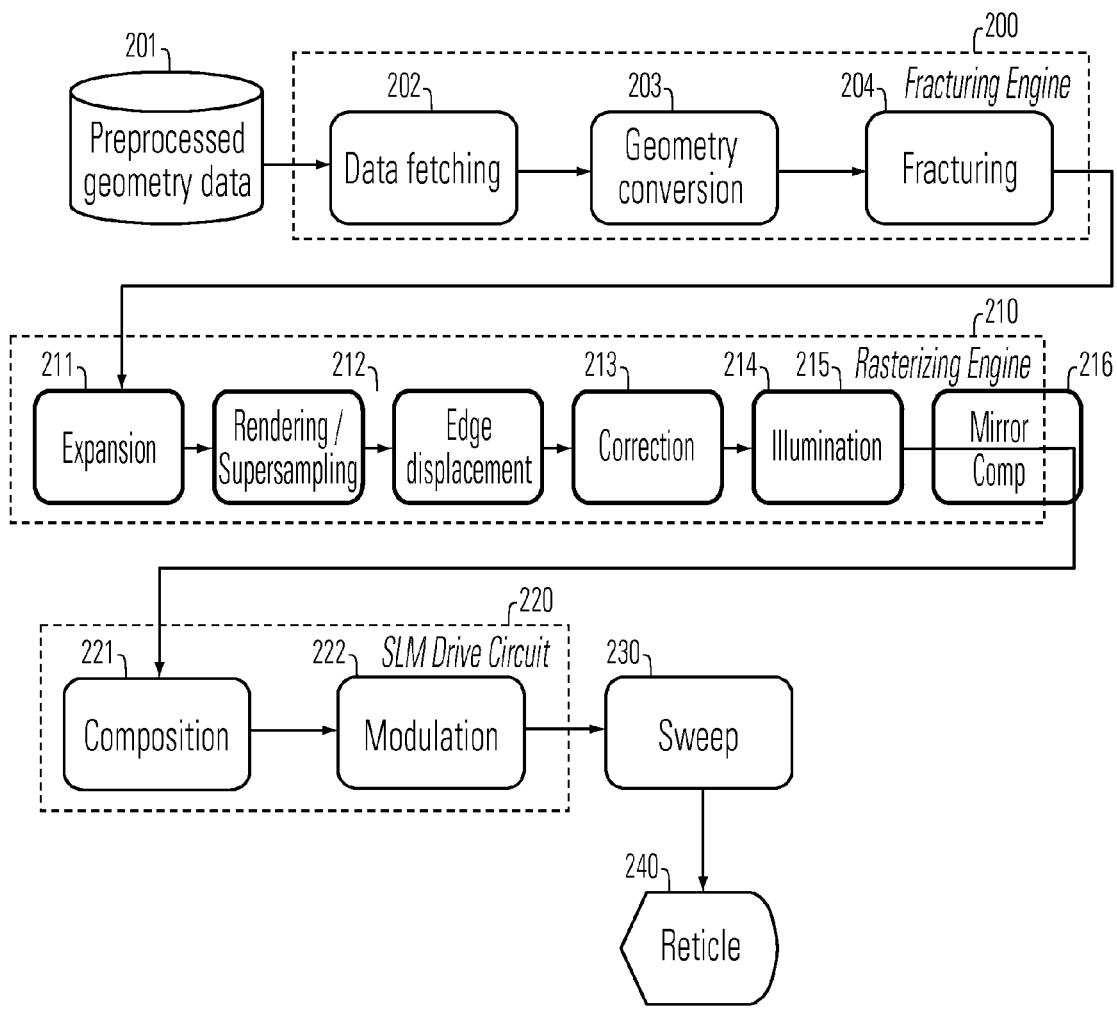
FIG. 2 is a block diagram providing an overview of one data path practicing aspects of the present invention.

The image rendering engine of the present invention can be used in conjunction with a fracturing engine, rasterizing engine and drive circuit. FIG. 2 provides a data path overview. This data path begins with preprocessed geometry data 201 as input. Preprocessed geometry data may be the output of a computer-aided design system. Preprocessing may reduce hierarchical or iterative information and effectively flatten the geometry representation stream. Data fetching 202 typically includes obtaining preprocessed geometry data from a secondary storage device. Geometry conversion 203 is the process in which geometries are converted to renderable fixed-point geometries (RFG). Fracturing 203 is the process of partitioning geometries into different windows and sub windows which correspond, in a micromirror implementation, to stamps and rendering windows of the stamp. The output of the fracturing engine is geometry data in one or more specified record formats. The records represent geometric figures, such as polygons and groups of polygons. It is useful to represent the fractured data as trapezoids, where triangles and rectangles are sub classes of trapezoids. One of the parallel edges of the trapezoid may have a zero or near-zero length, to represent a triangle. Another useful representation of fractured data is as triangles or chains of triangles. Most aspects of the present invention are equally suited to trapezoids, rectangles, triangles or other polygons or geometric figures. Coordinates of the polygon corners may be given with a sub-pixel or half sub-pixel resolution of 7 or bits or more, to support an accuracy of one $64^{th}$ or $128^{th}$ of a pixel or greater. Higher and lower bit resolutions may be used, depending on the desired accuracy and the characteristics of the image projection technology.

The image rendering engine 210 includes a variety of components. Expansion 211 is the process of expanding geometry iteration prior to rendering. Fractured geometry may be received as iterated RFGs, with repeated geometric figures or repeated groups of geometric figures. Expansion ungroups the RFGs so they can be processed individually. Rendering 212 is the process of converting polygons, including renderable fixed-point geometries, to rasterized images. The rendering process is carried out on multiple rendering processors. Super sampling 212 is the process of sampling the micro pixel resolution image and calculating grayscale pixel values. (In this document, sub-pixel and micro pixel generally refer to the same subdivision of a pixel.) Alternative weighting schemes for super sampling are discussed below. Edge displacement 213 is the process of shrinking or expanding geometries, for instance to compensate for proximate and stray radiation by laser proximity correction (LPC) or by optical proximity correction (OPC). Image correction 214 is the process of compensating for non-linearities and minor defects in the optical path, the placement of the stage or another feature of the projection system. This may include non-linear image recoupling. Illumination conversion 215 takes into account factors such as overlap between projected regions, variations in exposing radiation, and multi-pass writing. Mirror compensation 216 applies pre-calibrated factors to compensate for idiosyncrasies of individual mirrors, when the projection system uses a micromirror array. Mirror compensation factors can be used to compensate for differential response to voltages, for change in response during the course of a work cycle, for a dead pixel in an array, or similar characteristics of a micromirror array. Additional components can be added to the rendering engine 210 as needed and as appropriate to the projection system being used.

The drive circuit 220 includes composition 221 and modulation 222 processes. Composition 221 is the process of combining results from several rendering processes into one or more data streams to which modulation is responsive. Use of a composer allows the number of rendering modules 330 to be scaled. For instance, the number of rendering modules may be increased from 10 to 12 by modification of composer parameters, without changing the interface to the modulation system. In one type of micromirror system, one data stream may be used for modulation, to set individual micromirrors before flashing the micromirror array with radiation. In another type of micromirror system, the number of data streams may match the number of micromirrors or a factor of the number of micromirrors, if the micromirrors are used for scanning a work piece. In a conventional scanning system, the number of data streams may match the number of scanning beams used. Modulation 222 is the process that converts concentrated data into driving values for the projection system. For a micromirror system, a digital-to-analog converter can be used to produce analog voltages that are applied to individual mirror elements. For a scanning system, drive signals may be used to control an acousto-optical modulator that modulates the radiation beams or an equivalent control element for electron, ion or particle radiation.

A non-linear transform may require application of a pixel resampling gradient to each pixel being resampled. Alternatively, gradients for each pixel could be sampled by a convolution kernel to produce an output pixel value. The neighborhood of the convolution kernel will depend on the maximum allowed magnitude of the gradient. A one pixel gradient could be sampled by a 3×3 kernel; a two pixel gradient by a 5×5 kernel.

A projection system typically also includes a sweep 230 and a reticle 240. The sweep 230 carries image information across the field of the reticle 240 which is being exposed to radiation. The reticle 240 is the work piece against which the projection system operates.

Raster Cluster Overview

Figure 3:
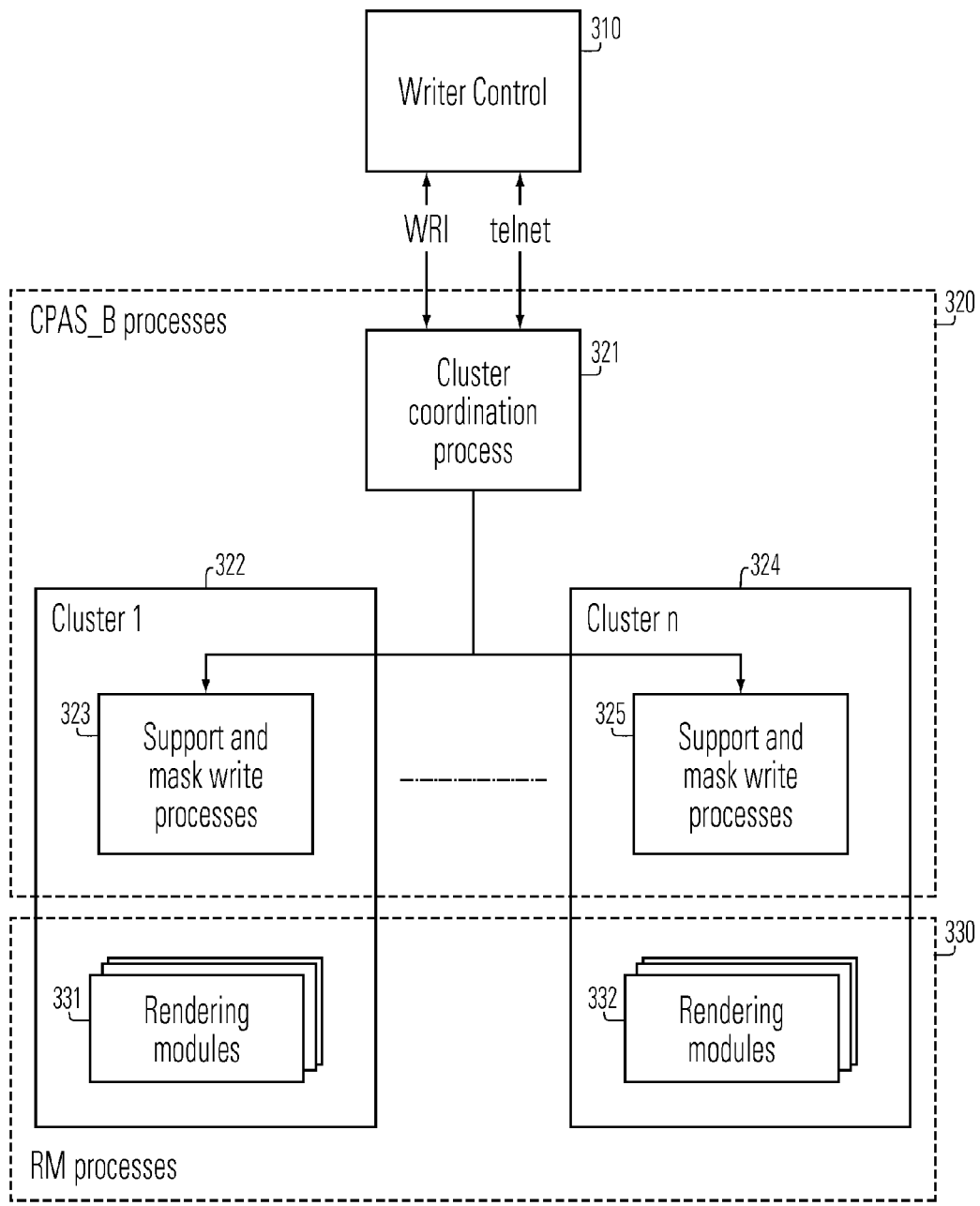
FIG. 3 is a block diagram overview of the hierarchical relationship among a cluster coordination process, support and mask writing processes and rendering modules.

FIG. 3 is a block diagram providing an overview of data processing. A writer controller 310 controls projection of an image onto the work piece. The writer connector 310 may be coupled in communication with a cluster coordination process 321 by one or more interfaces. In FIG. 3, a Telnet interface and a writer to rasterizer interface (WRI) are depicted. A WRI interface may comprise a TCP/IP socket and interface between supervisory control software functioning on the writer control 310 and a cluster coordination process 321. This interface synchronizes the rasterization process with the processes of fetching and computing data in the fracturing engine and exposing the work piece. Across this interface, the cluster coordination process 321 may report to the writer control 310 the position of the stage and the current state of writing functions. The cluster coordination process 321 is one of a group of processes 320 that rely on rendering modules 330 to render the RFG geometries. The cluster level processes 320 support multiple clusters 322, 324. Clusters include a cluster controller 323, which provides support and mask writing processes 323. Clusters further include one or more rendering modules 331. The cluster controller 323 may be designed to support up to seven rendering modules, consistent with existing PCI protocols, or may be designed for more or fewer modules and different bus structures as required to achieve the desired throughput and as consistent with other bus protocols. The organization of tasks depicted in FIG. 3 affords flexibility and scalability. Less flexibility and higher speed operation could be achieved through an alternative hardware organization.

This overview at the cluster controller level is supplemented, below, by additional description of hardware on which various methods of the present invention may be implemented.

Overview of Rasterizing Methods

Figure 4A:
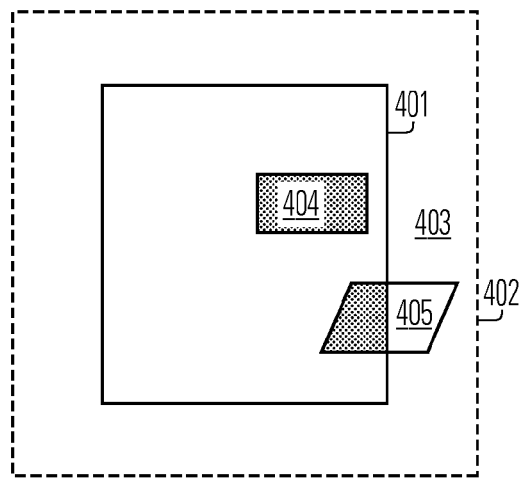
FIGS. 4A-B are a pair of diagrams illustrating rendering windows, guard windows, stamp strips, sub strips and other features relevant to rendering.
Figure 4B:
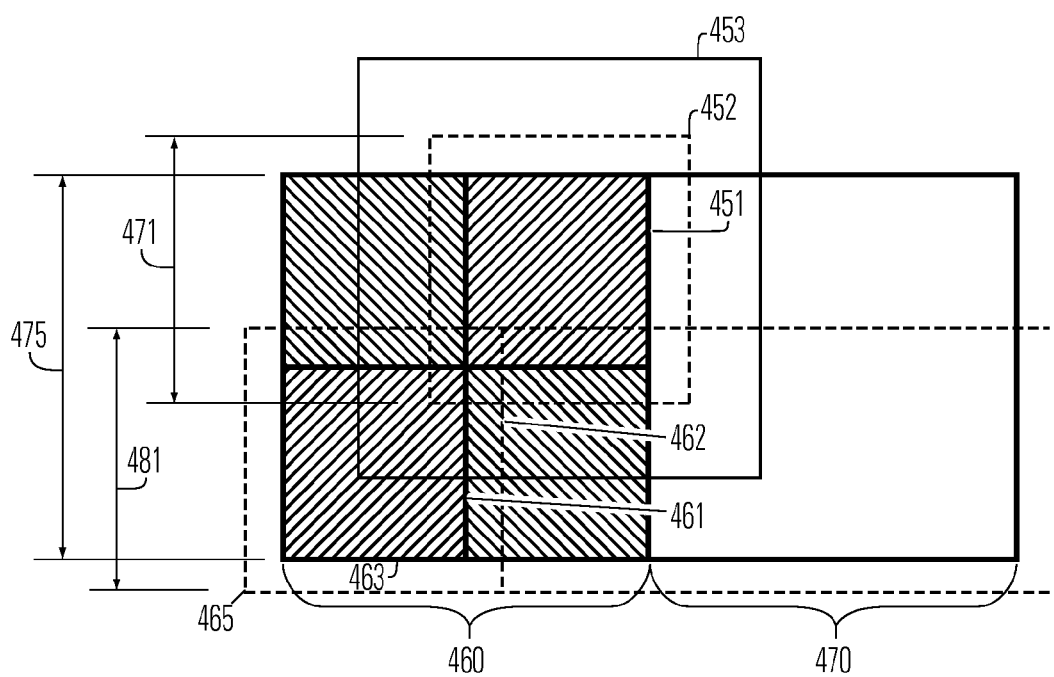
Figure 4C:
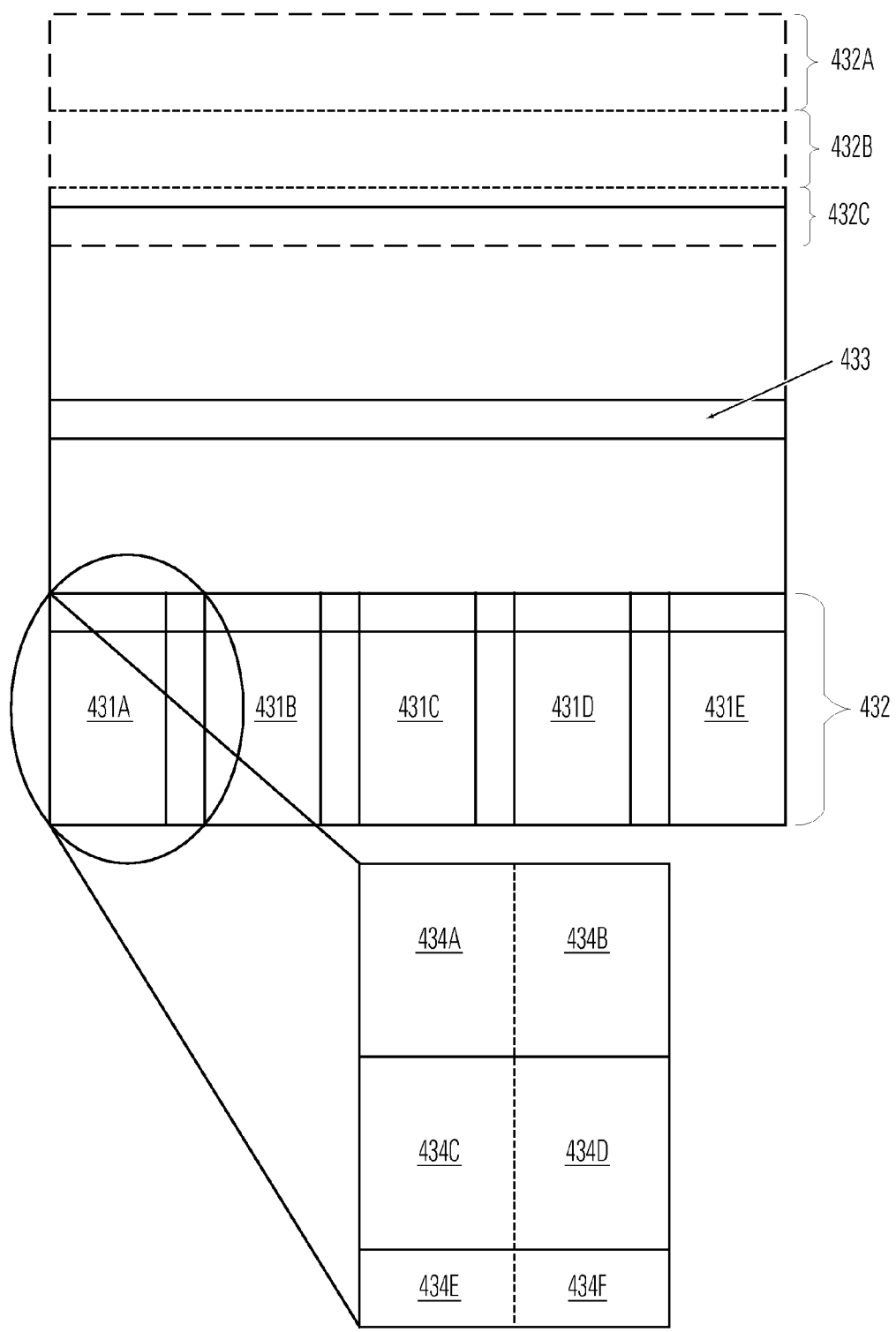
FIG. 4C is a block diagram showing the inner relationship among modulator windows, stamps, strips, sub strips and an image.

FIG. 4C provides a basis for explaining terminology that is helpful in understanding aspects of the present invention. The SLM (Spatial Light Modulator) is, in one embodiment practicing aspect of the invention, a rectangular array of micromirrors used to modulate a laser pulse used for exposure. A stamp (e.g., 431A-431E, individually or 434A-434F, collectively) represents a single exposure of the SLM. A strip (e.g., 432) is a horizontal series of overlapping stamps. Horizontal may or may not be the physical representation of the strip. Horizontal may defined by the orientation of a strip, which is in turn defined by the sweep motion of the SLM across the work piece. The stamp area includes an overlap zone. The height of stamps in a strip may be equal or may vary. The width of the stamps also may vary from stamp to stamp. The time order of the stamps in a strip is most likely to be sequential. It can have either left-to-right or right-to-left orientation, or both. An image is a vertical sequence of strips (e.g., 432 through 432A-432C.) The individual strips of may or may not have the same width. The strips of an image have vertical overlap areas 433, similar to adjacent stamps of a strip. The overlaps among stamps are further discussed below. Stamps may consist of data from one or more modulator windows 434A-434F. Alternatively, a modulator window could include an entire strip 432 or substrip (e.g., 432A) that spans several stamps. The partitioning into rendering windows is used to implement parallelism in the data path of the rasterizing engine. Strips may be divided into two or more substrips 432A-432C. Substrips need not overlap, as they are printed by a single stamp exposure. In the rendering process, their extension zones, as described later, overlap and so the input data for generating substrips overlaps slightly. The divisions of substrips may corresponds divisions between modulator windows in the stamps. Substrips within a strip have the same width, from one side of the image to the other, but need not have to have the same height.

Figure 26:
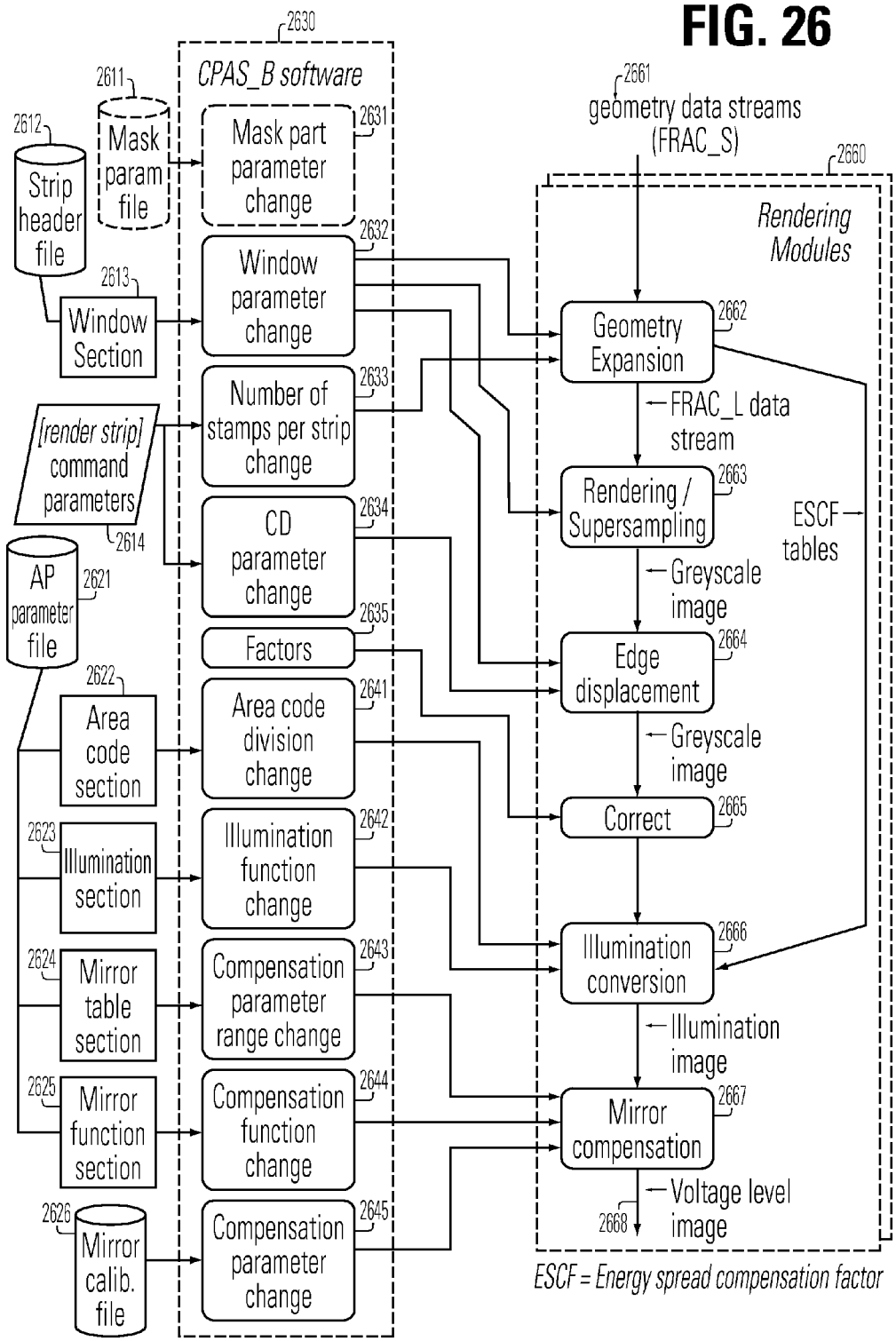
FIG. 26 is a block diagram of several processes that are useful in rasterizing fractured geometry.

FIG. 26 provides a further overview of rasterizing and rendering. It illustrates parameter files (2611-2626), support software (2630-2645), parameter loading, and functional components of rendering modules (2662-2668). The use of many data tables or files may increase the flexibility of the system. Data values preferably stored in tables can, alternatively, be coded into software, firmware or hardware implementing aspects of the present invention. Hard coding typically reduces flexibility but increases performance.

In FIG. 26, the mask parameter file 2611 may be used for parameters that are static. Processing may be done on a strip by strip basis. Process critical information may change from strip to strip. Some of the input files may be the same from strip to strip, from mask-part to mask-part and from job to job. The alteration of parameters loaded in the system is performed on a mask-by-mask or strip-by-strip basis by the CPAS software process of the platform processor. A further aspect of the present invention is that parameters used by the system can be altered within a strip, for instance, as the writing process reaches a corner of work piece where resist baked hotter than in the center of the work piece.

The strip header file 2612, window section 2613, and command parameters 2614 contain information common to all stamps in a strip. It describes the segmentation of the SLM into windows. The parameters that affect the RASE processing are: The number of sub-strips, which represents the Y-axis segmentation of the SLM into modulator windows. This parameter corresponds to the number of modules in the system configuration. A table of sub-strip heights, which affects the RP (Rendering Processor), which uses sub-strip height for the rendering address generation process and the readout process. It also affects pixel data column height parameters. A table of sub-strip Y coordinate offsets, which is used by the geometry pre-processor to give the Y offset for the individual substrips. The rendering window size X, which affects the geometry pre-processor, which uses X window size for the fracturing of complex geometries. It is also used for guard window truncation by the address generator of the RP. The rendering window pitch X, which is the distance between rendering windows. The X overlap zone size can be calculated from the difference between the SLM size and the rendering window pitch. The X pitch is used by the geometry pre-processor (PP) for the fracturing of complex geometries and coordinate offset calculation on the geometries presented to RP. The extension zone size X and Y, which is used by pixel neighborhood operations (edge displacement), and affects fracturing in the PP. The rendering window size minus the extension zone equals the modulator window size. This parameter is an implicit part of the AP, and must always match the design of the AP. The adjustment parameter file 2621 contains several data types. It generally contains control information to the processes implemented in the adjustment processor. This parameter section contains a run-length encoded bitmap of the area codes. The number of area codes for an individual modulator window is limited in one implementation to 128, but the total number of area codes for the SLM may go as high as 512. Each run-length record has two values: Overlap zone ID and Area Code. The number of overlap zone ID-s may be restricted to at maximum 15 per modulator window. The illumination conversion section of the file contains one transfer function table for each of the overlap zone ID-s. The mirror table section contains one scale/offset entry [Cn2/Cn1] for each mirror compensation coefficient [Cn] (n=1 ... 4). The mirror function section of the AP parameter file contains function tables for the two functions of the mirror compensation calculation, and a set of scale/offset for each of the parameters C1 ... C4. The mirror calibration file contains an image map with one entry for each pixel of the SLM with four calibration parameters (C1 ... C4) per pixel. General information regarding bit widths and offsets for the mirror compensation function is stored in the mirror table section of the AP parameter file. This file is in binary format for size reasons, as opposed to most other parameter files, which are text based. The assignment of parameters to these files or sections of these files is not a limitation on the invention, but one embodiment.

The correction factors may be stored in a file for correction of static or systematic features of the optical path, or may be generated in real time for dynamic or random features of the system, such as stage placement.

The CPAS software 2630 supplies parameters from files to the rendering modules 2660. The logical blocks 2631-2645 correspond to the parameter files described above. The CPAS software modifies parameters in the rendering modules in real time, consistent with radiation exposure requirements. At least three resist issues can be addressed by changing parameters in the rendering modules 2660 during the writing of a reticle or direct writing of a chip. Baking of resist on a surface is not entirely uniform. In many cases, the edges or corners of the surface bake faster or more thoroughly than the center of the surface. Parameters can be set that take into account the position on a work piece that is being exposed, corresponding to the bake characteristics of that part of the work piece. The edge displacement and illumination conversion parameters can be used to respond to surface baking characteristics. Next, resist response to exposing radiation depends on how the exposure accumulates. That it, radiation doses do not have a linear additive effect on the resist. Many resists are sensitized by their initial exposure. Radiation doses of A followed by B will produce a greater response than a single dose C, where the energies A+B=C. Resist activation can be taken into account by having the CAPS software load appropriate parameters into the rendering modules in successive printing passes. In addition, resist aging can effect response to exposing radiation. Some resists are short lived, compared to the time required to expose a reticle or chip in multiple passes. As the resist ages, it may become less sensitive. Resist aging can be taken into account by having the CAPS software load appropriate parameters into the rendering modules, based on resist aging. Alternatively, such issues can be addressed by values in the energy spread compensation factor (ESCF) tables, which pass from the geometry expansion module 2662 to the illumination conversion module 2666.

Guard Window Alternative to Clipping

FIG. 4 depicts use of a guard zone and guard window to render individual elements of the fractured geometries. The areas depicted in this figure include a rendering window 401, a guard window 402, and a guard zone 403 between the rendering and guard window. The rendering window is a smaller addressing window and the guard window is a larger addressing window.

FIG. 4A illustrates the use of a guard zone and guard window in the rendering process as alternatives to clipping geometric figures in the fracturing process. A rendering window 401 corresponds to memory in which geometric figure can be rendered for later projection. The rendering window 401 is surrounded by a guard window 402. The guard zone 403 is the part of the guard window 402 outside the rendering window 401. A geometric figure, such as a polygon, trapezoid, rectangle, quadrangle, triangle, etc., is received for rendering. The geometric figures may be convex. The geometric FIG. 404, a so-called renderable fixed-point geometry (RFG), which falls within the rendering window 401, is rendered to a corresponding memory. A geometric FIG. 405, which straddles the rendering window and guard zone, is partially rendered to memory. The guard zone is addressable for rendering, but the data is not written to memory for projection of an image. The data outside the rendering window is discarded. The guard zone may not correspond to memory, in the sense that the rendering window does correspond to memory. Data addressed to the guard zone can be handled very quickly with a filter, because memory transfer is not required. A geometric figure which straddles the rendering window and guard zone is not clipped at the boundary of the rendering window during fracturing. As explained below, hardware can be constructed which simultaneously renders the edges that are inside and outside the rendering window. This rendering may not distinguish between edges inside and outside the rendering window. Rendering the edge and area that are outside the rendering window does not significantly slow rendering of the straddling geometric FIG. 405, in comparison to rendering only the part of the geometric figure inside the rendering window. Rendering of geometric figures can be assisted by restricting the geometric figures in two ways. First, the geometric figures can be limited in size so that no geometric figure can fall within the rendering window 401 and outside the guard window 402. Such geometric figures can fit within the guard zone. Second, the geometric figures can be filtered before rendering so that no geometric figure that is entirely outside the rendering window 401 is processed for the rendering window. Data rendered to the guard zone can be filtered or discarded before it is stored in a cache buffer, as further described below, thereby reducing memory bandwidth loads. Alternatively, addressing circuitry can recognize addresses in the guard zone when geometric figures were translated from a micro pixel cache to a buffer memory corresponding to the rendering window. This addressing circuitry could truncate writes of the geometric figure to the rendering window. The addressing circuitry could compare address signals with the valid addresses of the rendering window and use the result to control the write enable, or another memory arbitration signal. Alternatively, a fixed length fill instruction beginning or ending in the guard zone could be modified to match the portion of the instruction falling within the window. A discrete instruction falling inside the guard window could be ignored by the address processing circuitry. Addressing circuitry or a memory controller implementing a guard zone could be combined with a FIFO memory, as described in conjunction with circuitry implementing an adjustment processor, to achieve load averaging. In a rendering process, sections of a geometric figure are repeatedly selected and micro pixel caches are generated as described below. The micro pixel caches are one alternative set of rasterized representation data that corresponds to the section. A micro pixel buffer is another representation.

An extension of the rendering and guard window concept is an extension zone. An extension zone includes a few pixels outside each edge of the rendering window 401. An extension zone, like the rendering window, corresponds to memory. However, the pixels in the extension zone are not used for projection of an image. Instead, they create a neighborhood of pixels that can be used for convolution of one or more pixels at the edge of the rendering window. The size of the extension zone should support the largest neighborhood of pixels used in any convolution. For instance, if a 5×5 convolution filter or neighborhood is used, or a dual application of 3×3 convolution filters, the extension zone should be at least two pixels, so that pixels on the edge of the rendering zone are surrounded by two pixels in each direction to create a 5×5 neighborhood for convolution.

Rendering Window Configuration

FIG. 4B further illustrates the geometry of rendering windows, as applied to a micromirror array. Two flashes of the micromirror array are depicted 460, 470. The array 460, is divided in this example into four rendering windows, including 451, 461. The array may be divided horizontally, vertically, or both into a suitable number of rendering windows. A 512 by 2048 array might be divided into ten rendering windows, for instance, to distribute the rendering work to ten rendering processors. A rendering window 451, 461 is surrounded by an extension zone 452, 462. Rendering window 451 is further surrounded by the guard zone 453. A stamp strip 475 includes a plurality of stamp projections. A sub strip 471, 481 includes a plurality of rendering windows and their extension zones, which may extend across a plurality of stamps. As the sub strips and extension zones are larger than the rendering windows, an origin for addressing may be at one corner of the extension zone 465. This origin may be used for local addressing, for a particular rendering window and its extension zone, or for global addressing throughout a sub strip or stamp strip. Local addressing reduces the number of bits required for interpolation of geometry edges. Another useful origin for addressing may be one corner of the guard zone 463.

Figure 4D:
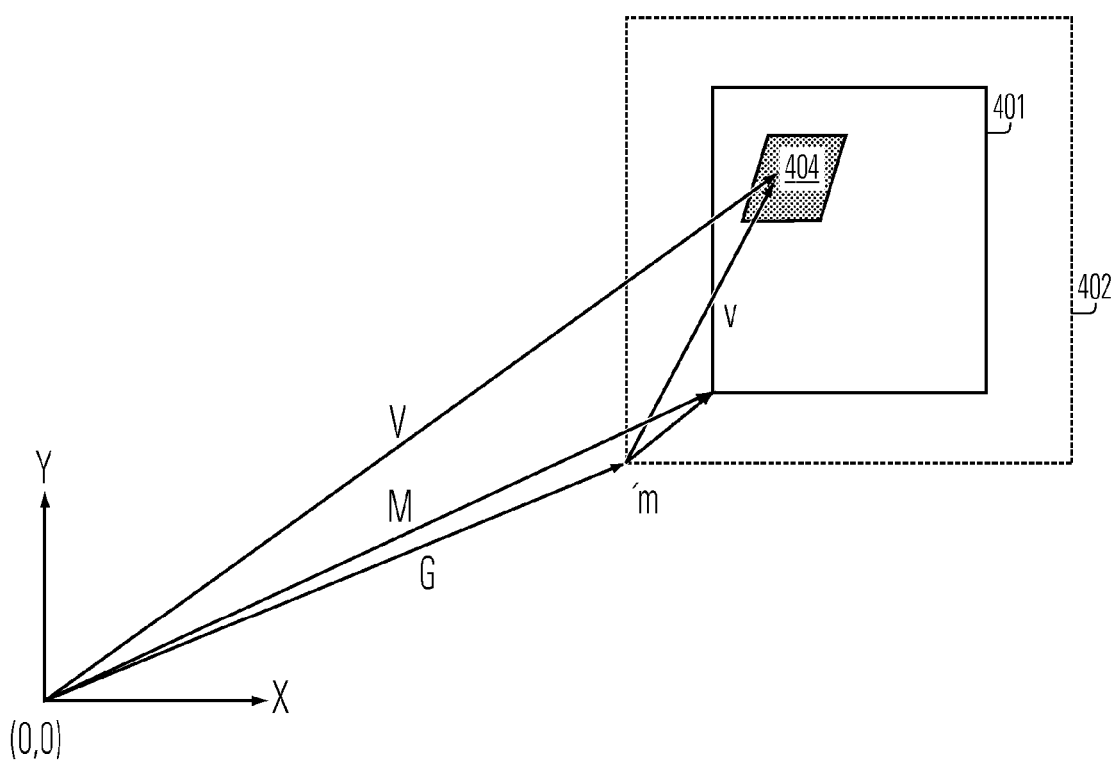
FIG. 4D is a vector diagram illustrating the relationship between global and local coordinate systems.

FIG. 4D depicts transformation of global coordinates to a local coordinate system. In one type of input stream, coordinates are given in soft-pixels relative to current strip. A soft-pixel is one half of a micro pixel. One function of the pre-processor is to prepare coordinates for the rendering processor, converting all coordinates to a relative origin. In this figure, a trapezoid 404 is contained within the rendering window 401, which is within the guard window 402. The coordinate transformation may be described by vector operations shown in the figure. Let $M=(M_x, M_y)$=origin of current modulator window relative strip.

$G=(G_x, G_y)$=origin of current guard window relative strip.

$V=(V_x, V_y)$=geometry coordinates to be transformed.

$m=(m_x, m_y)$=origin of current modulator window relative guard window origin.

$v=(v_x, v_y)$=new geometry coordinates.

Then $$G = M - m$$

$$v = V - G$$

Combining these equations yields:

$$v_x = V_x - M_x + m_x$$

$$v_y = V_y - G_y$$

Parameters $M_x$, $m_x$ and $G_y$ may be stored in registers. $M_x$ may be a 9 bit unsigned integer; $M_x = k*SLM\_PITCH*128$, where k is stamp number, k>=0. $m_x$ may be a 9 bit signed integer. $G_y$ also may be a signed integer, of 11 bits. Note that parameter values may be expressed in macro pixels.

In an alternative embodiment, a rendering window might be wider than a micromirror array, even as wide as an entire sub strip. A single rendering engine or group of rendering engines may generate an entire sub strip or strip of stamps, depending on the performance and organization of the rendering engine, the required throughput (for instance, with large area writers), and the buffering of rendered output. A wide rendering window may be particularly useful for a projection system that uses scanned radiation or for a micromirror-based system with substantial overlap between successive flashes of the micromirror array. In this embodiment, sections of the rendering window could be read out for successive flashes.

Pixels and Sub-Pixels for Enhanced Resolution

Figure 5A:
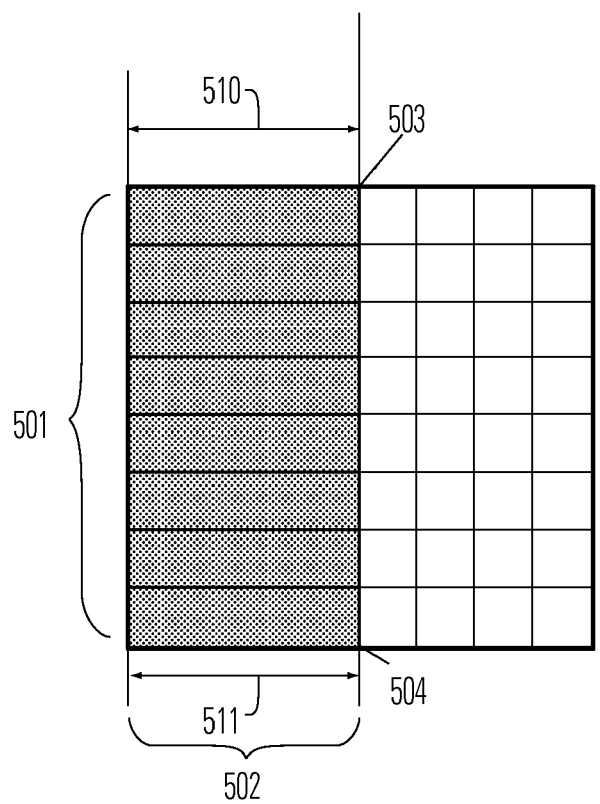
FIGS. 5A-B are a pair of sub-pixel grids that illustrate representation of an edge that intersects a pixel.
Figure 5B:
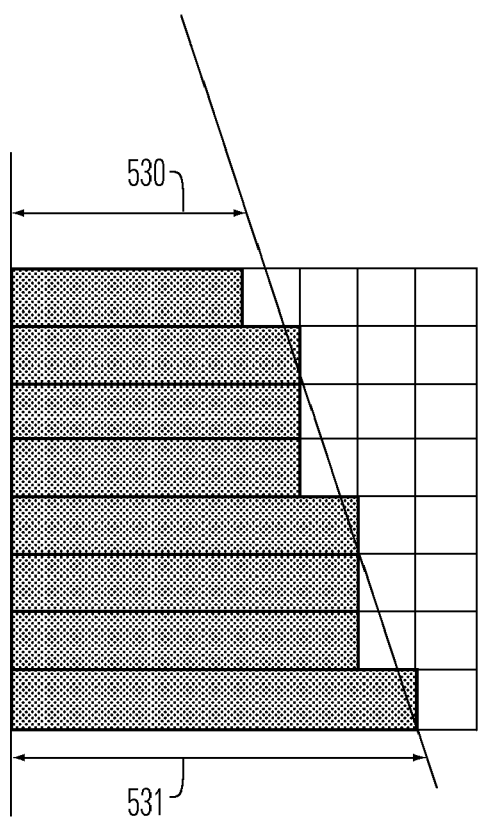

FIGS. 5A-B depict the use of a micro pixel or sub-pixel array to represent a gray value assigned to a pixel. Above, FIGS. 1A-B illustrated the impact of a pixel gray value on an edge location. FIGS. 5A-C, illustrate sub-pixels representing 65 gray levels (including all-white.) The same principles apply to use of 5, 10, 17, 26, 37, 50, 82, 101, 122, 145, 170, 197, 226, 257 or, generally, n squared plus 1 gray levels. Similar principles apply to use of 4, 8, 16, 32, 64, 128 or 256 gray levels. It is convenient to use an 8×8 grid of sub-pixels to represent a pixel. Other grid configurations may include 3×3 sub-pixels, 4×4 sub-pixels, 16×16 sub-pixels or more. These sub-pixels may be referred to as empty or filled or as on or off. Because resists may have a negative or positive response to exposure, negative or positive representation of a sub-pixel is an arbitrary convention. FIG. 5A illustrates a vertical edge of a geometric figure running through the middle of a pixel. The pixel has eight rows 501 and eight columns 502 of sub-pixels. The geometric figure edge intersects 503 at a distance 510 along the top edge of the pixel. In this example, the geometric figure edge intersects 504 at the same distance 511 along the bottom edge of the pixel. The geometric area bounded by the geometric figure edge is exactly half the pixel. This particular edge follows a boundary between sub-pixels. The shaded sub-pixels to the left of the edge are outside or inside the feature defined by the edge, depending on the shading diagram convention; the white sub-pixels to the right of the edge are inside or outside the feature. The 32 shaded sub-pixels represent half the area of the pixel. A gray value of 32 can be assigned to the pixel, corresponding to the number of sub-pixels which are shaded. FIG. 5B illustrates a diagonal edge of a geometric figure. This edge intersects the top pixel edge in the middle, at a distance 530 represented by 4 of 8. This edge intersects the bottom pixel edge 531 at a distance of 7. The geometric area of the region to the left of the geometric figure edge is 68.75 percent of the pixel. This geometric area is represented by 44 sub-pixels in a stair-step pattern, which have an area that exactly matches the geometric area of the shaded region.

The grid representation of sub-pixels can be further refined by allowing a geometric figure edge to intersect between sub-pixel boundaries. It is convenient to subdivide an edge of a sub-pixel into a number of increments that are represented by a power of two, such as 2, 4, 8, 16, 32 or 64 increments, which correspond to 3, 5, 9, 17, 33, or 65 potential intersection positions per sub-pixel, if both edges of the sub-pixel are counted. The number and pattern of sub-pixels used to represent a geometric figure edge that intersects sub-pixel edges between boundaries can be pre-calculated, as described below.

Two Level Rendering

Figure 6:
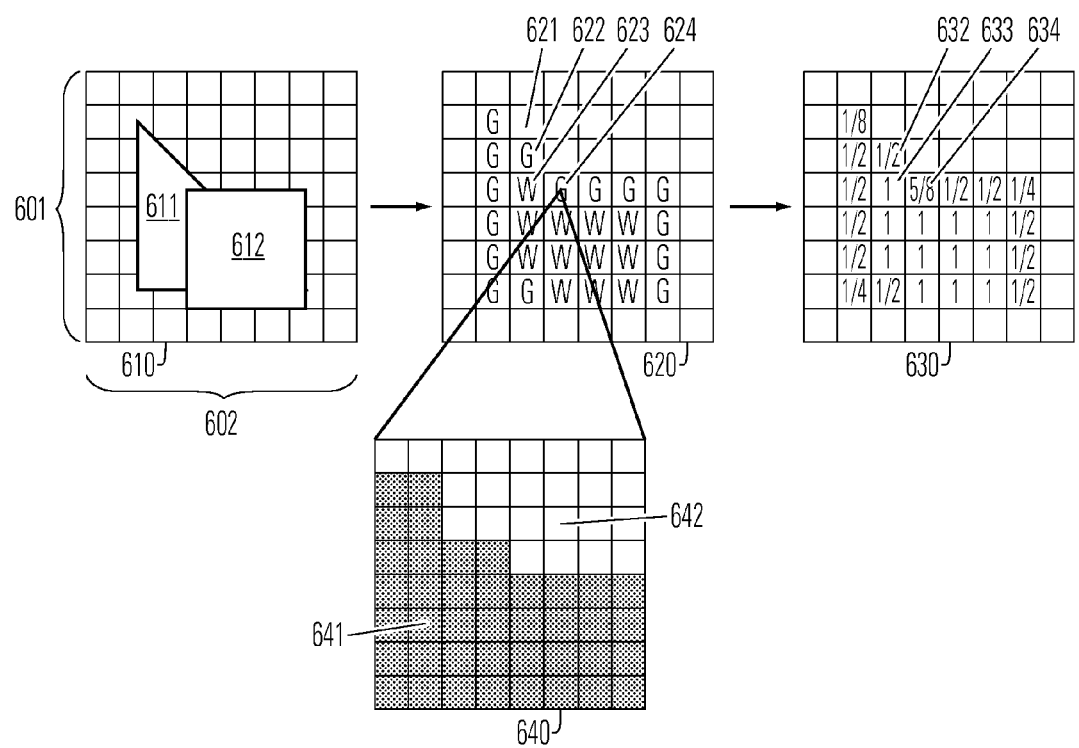
FIG. 6 includes a series of pixel grids and a sub-pixel grid corresponding to one of the pixels. The mapping of a pair of geometric figures onto a pixel grid is illustrated.

FIG. 6 illustrates two geometric figures on a pixel grid, using sub-pixel arrays to represent gray values of the pixels. Grid 610 includes eight rows 601 and eight columns 602 of pixels. Two geometric FIGS. 611, 610 are rendered from the geometry domain onto the pixels. Grid 620 indicates whether individual pixels are white (W), gray (G) or black (B). Pixel 621 is black; pixel 622 is gray; and pixel 623 is white. Two bits of data can be used to represent each pixel, 00=B, 01=W, 10=G and 11=reserved. Pixel 624 is represented by the grid 640 of sub-pixels. Shaded pixels 641 that are white or gray in the pixel grid 620 are on the interior of one of the geometric figures. Other pixels 642 are outside the geometric figures. Grid 630 indicates gray values for individual pixels. For instance, pixels corresponding to the left edge of geometric FIG. 611, where the edge divides pixels in half, have the gray value of ½ (or $^{32}/_{64}$.) Pixel 632, on the hypotenuse of geometric FIG. 611 has a gray value of ½. Pixel 633, on the interior of the geometric figures, has a gray value of 1, representing fully on. Pixel 634 has gray value of ⅝, corresponding to the 40 shaded sub-pixels in grid 640. In a pipeline or other optimized architecture, independent channels may provide access to the first, pixel map resolution and to the second, higher resolution of micro pixel caches.

Sub-pixel representations of pixels can correspond to memory locations, such as 32- or 64-bit words, mapped directly to individual pixels. Alternatively, a pointer structure could be used to map individual gray pixels to locations storing sub-pixel grids. In any case, the sub-pixel grids only need to be updated for gray pixels, not for black or white pixels. A sub-pixel array can effectively be erased by marking the corresponding pixel array element "B", without changing the value of individual sub-pixels. The next time the sub-pixel grid is used, values can be written to the sub-pixel grid without reading the data first.

In an alternative embodiment, sub-pixels could be assigned gray values instead of binary values. Some logical operations for combining pixels would need to be replaced by addition or subtraction operations. Gray values in sub-pixels could be used to further refine resolution.

Two Levels with Summary Cache

Figures 44, 45:
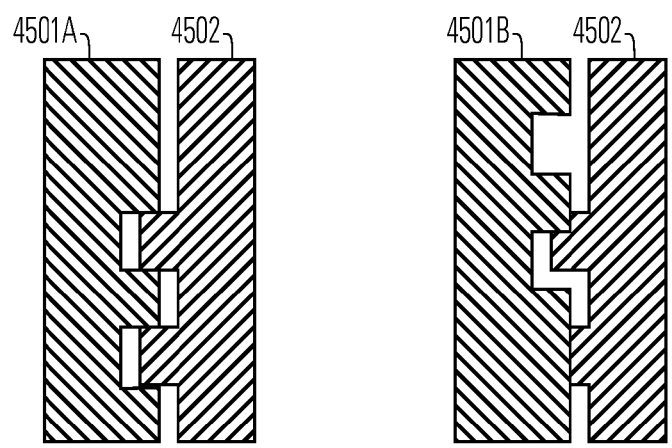
FIG. 44 illustrates symmetrical weighting of sub-pixels representing a pixel.
FIG. 45 illustrates symmetrical and non symmetrical sub-pixel maps representing a particular edge orientation.

One enhancement of this method and apparatus utilizing two levels of resolution would be to introduce a third set of memory locations to summarize a gray value of a sub-pixel array or grid. In some hardware implementations, such as a pipeline architecture, the gray value of a sub-pixel grid could be calculated when data was written to or recorded in a sub-pixel grid. The gray value could be a count of the number of empty or filled sub-pixels or it could be a weighted sum of sub-pixels that are filled or empty. Weighting might be advantageous for either a micromirror array or a laser beam sweep, because the intensity of radiation projected at the focal point of the projected beam is greater than the intensity some distance from the center. The Gaussian distribution of radiation intensities associated with most radiation sources may be better represented by a weighted sum of sub-pixels. FIG. 44 illustrates use of just 10 weights to represent a Gaussian or similar distribution of exposing radiation in an 8×8 array of sub-pixels. By its nature, a Gaussian or similar distribution is symmetrical, so the weights applicable to the four quadrants of a pixel can be taken as the same. Symmetry further allows a single weight or coefficient to be assigned covering pairs of numbered sub-pixels, such as the sub-pixels pairs labeled 2, 3, 4, 6 and 9. With this extent of symmetry, computation can be streamlined by counting the identically weighted 2 sub-pixels in all four quadrants before applying the weight. Processing would proceed from counting to applying weights. The weights and the sum of weights should be calculated using a fixed point numerical representation, with binals. The sum of weights could then be rounded off before use. The weights assigned and even gate programming used in some embodiments of the present invention to implement the weights would be field programmable, using logic such a Xilinx's partial reconfiguration interface. The approach in FIG. 44 extends well to sampling from a more circular or larger neighborhood. Supersampling from a larger neighborhood could be done in a square, with weights in corners of the square set to zero to effectively generate a circular sampling from a square neighborhood. Many variations on supersampling are practical and field programmable, in accordance with the present invention.

An alternative to using a third set of memory locations would be to increase the number of bits used to represent individual pixels, so that a gray value could be represented by the pixel grid.

Figure 7:
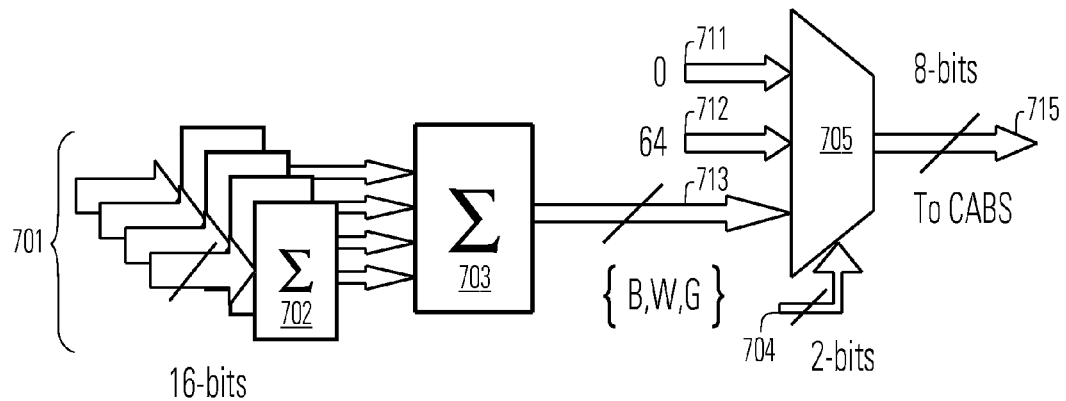
FIG. 7 is a block diagram of a super sampling circuit.

FIG. 7 depicts one hardware architecture that could be applied at read-out or be adopted to apply when writing to a micro pixel cache, to summarize the gray value of a pixel. FIG. 7 illustrates counting the number of on/off micro pixels in a 64 bit microcache, with two levels of resolution. The bits of the micro pixel cache array 701 are fed to four counters or summation circuits 702. In an alternative embodiment, these circuits 702 could apply a weighting scheme to the micro pixels. The results of circuits 702, in turn, are combined by one or more adders 703 to produce a gray value 713 for the micro pixel cache. A two-bit MUX 705 can control the selected output of the overall circuit, for instance, when reading from the micro pixel cache. The two input bits 704 are from the pixel map, which records whether each pixel is black, white, or gray. For gray pixels, the MUX 705 passes through the result of the adder 703. For black or white pixels, the MUX 705 passes through a static value 711, 712 that corresponds to all of the sub-pixels being on or off. In an alternative embodiment, a fetch from or write to the micro pixel cache could be avoided if the pixel map 704 indicates that the pixel is black or white. This reduces the demand for access to micro pixel cache memory. This circuit could be adapted to super sampling when a value is written to a micro pixel cache. Adaptation would involve utilizing the summation hardware 701-703 and assuming that the write was being performed because the pixel was gray. The super sampled value would be written to a gray value memory.

Parallel Processing of Edges

Figure 8:
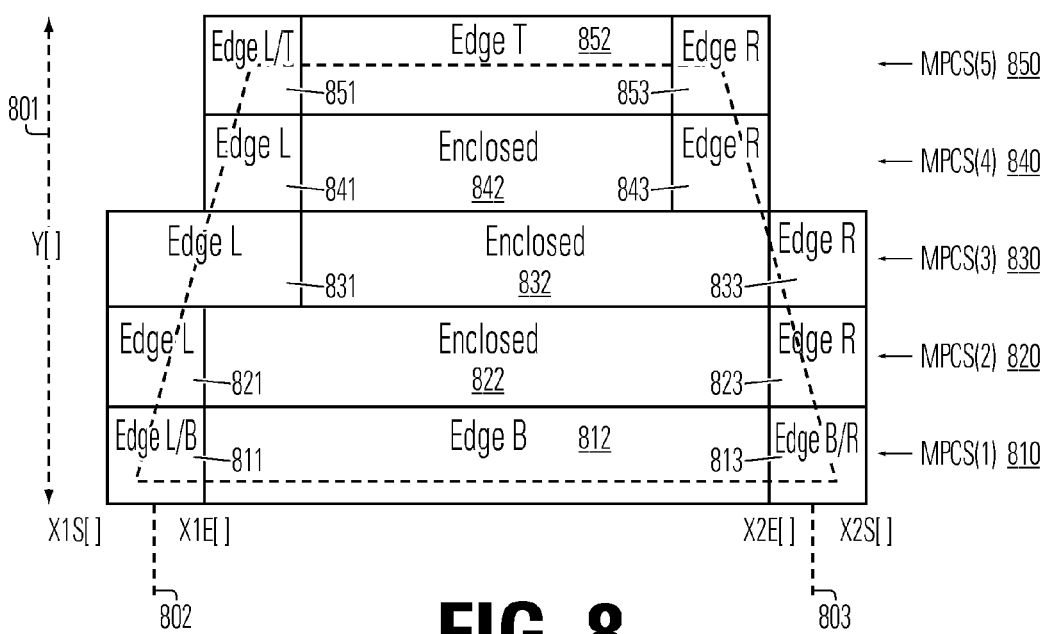
FIGS. 8 through 10 are examples of geometries, micro pixel cache sets and address sets generated from those geometries.

FIG. 8 illustrates the operation of a micro pixel cache generator on a trapezoidal geometry. The micro pixel cache generator contains two Bresenham interpolation units working in parallel on opposite edges 802, 803. One reference which explains the Bresenham rendering algorithm is F. S. Hill, Jr., Computer Graphics, ISBN 0-02-354860-6, pp. 428-433. Bresenham's algorithm uses integer values and avoids multiplication. It is an example of an incremental algorithm that computes the location of each pixel on a line that is being rendered, based on information about the previous pixel. Bresenham is one of a number of curve and line generating methods that might be used with the present invention. The two Bresenham interpolation units are preloaded during initiation with the coordinates for opposing edges of the geometry. Interpolation commences after the preloading. Interpolation iterates from one parallel edge of the trapezoid to the other. If polygons are used instead of trapezoids, iteration may proceed generally in the direction of an axis of the selected coordinate system 801. It begins with one corner of the geometry and proceeds along the axis until an opposite corner is reached. During interpolation, one or more micro pixel cache sets are generated for every interpolation step. These cache sets represent sections through the geometric figure. The micro pixel cache sets are stored in a micro pixel cache buffer. Five micro pixel cache sets 810-50 are depicted in FIG. 8. For a specific coordinate along the interpolation axis 801, when both interpolation units indicate that interpolation is complete, an address set is generated and stored in the micro pixel cache buffer. This address set, together with individual micro pixel caches generated since the last address set was assembled, forms a micro pixel cache set. In the address set, a first edge (e.g., 811, 821, 831, 841, 851) in a cache set (e.g., 810) is represented by addresses X1S and X1E. In this notation, "X" indicates the orientation of the axis, "1" represents the first edge, "S" represents the starting pixel for rendering part of the edge and "E" represents the ending pixel for rendering part of the edge. In the address set, a second edge is represented by addresses X2S and X2E. The interval between the X1 and X2 addresses for the first and second edges represents an area of enclosed data which may not contain any sub-pixel information. When a trapezoid with top and bottom edges parallel to the coordinate system is rendered, a single micro pixel cache may be used to represent all of the pixels along the top or bottom edge (812, 852), between the corners (811, 813 and 851, 853). When the geometric figure rendered does not have a top or bottom edge parallel to the coordinate system, there may not be any enclosed area between the edges. Above the bottom edge and below the top edge, the enclosed area (822, 832, 842) is completely filled and can be represented without a micro pixel cache, implicitly or using the two-bit coding scheme described above, or, for consistency, it can be represented by a filled micro pixel cache.

Figure 9:
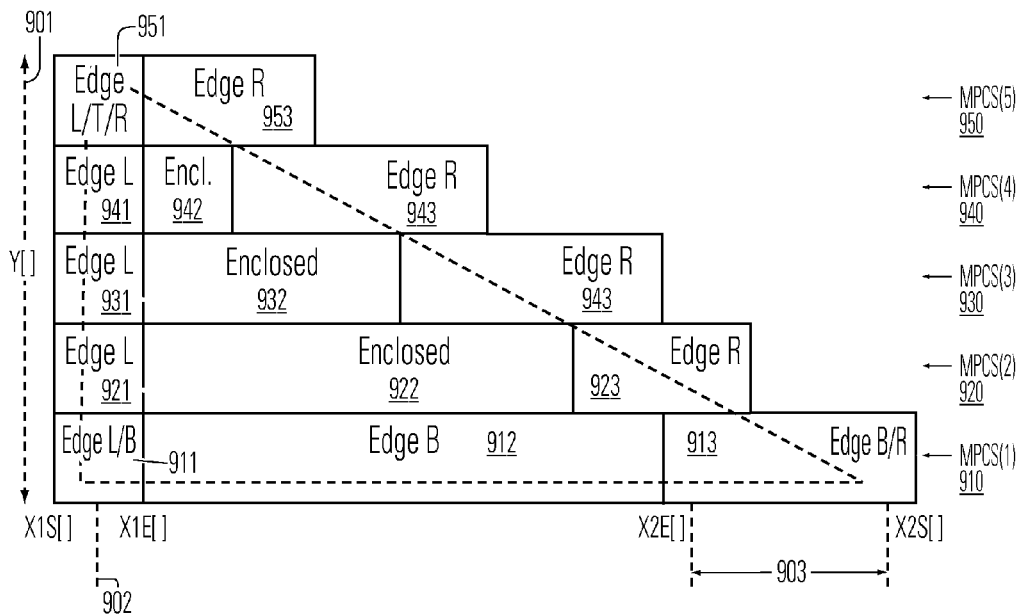

FIG. 9 presents a special case of rendering a trapezoid, where two points in the trapezoid have the same or nearly the same location, effectively reducing the trapezoid to a triangle. For consistency, four address points may be included in the data stream provided by the fracturing engine. Five micro pixel cache sets, 910-50, are again represented in this figure. The interpolation axis 901 is vertical. The first edge (911-951) is also vertical. The second edge (913-953) is the hypotenuse of the triangle. The bottom enclosed edge 912 lies between the interpolated edges. There is no top edge. Micro pixel cache sets 920, 930, and 940 include completely filled pixels 922, 932, and 942. The distance 903 between addresses X2S and X2E corresponds to the number of pixels which have sub-pixel grids representing parts of the slanted hypotenuse.

Figure 10A:
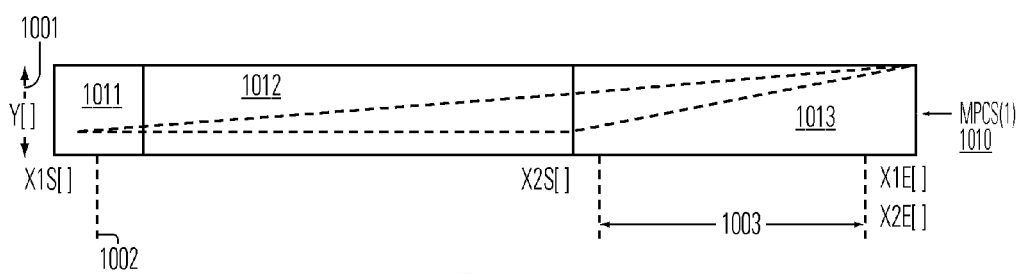

FIG. 10A represents a further special case, where the geometric feature is represented by a single micro pixel cache set 1010. The interpolation axis is 1001. As in FIG. 9, the trapezoid has been reduced to a triangle. The left edge extends through all three cells 1011, 1012, and 1013. The right edge is contained in cell 1013, having a pixel width indicated by 1003. Because the intervals X1S . . . X1E and X2S . . . X2E overlap, the overlap represents an area where the micro pixel caches are combined with a logical and-operation. Further because the entire geometric feature is represented by single micro pixel cache set, the micro pixel caches representing the bottom edge of the triangle need to be combined with micro pixel caches for part of the left edge with a logical and-operation.

Figures 10B, 10C, 10D:
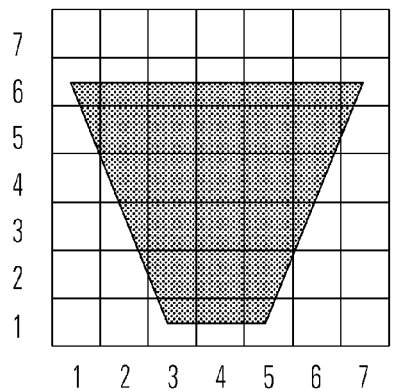

FIGS. 10B-D illustrate part of the data transmitted with a micro pixel cache set. FIG. 10B depicts a trapezoid with a narrower base than top. It fits in a 7×7 pixel grid. The micro pixel caches generated by parallel processing of top and bottom, and left and right edges for this trapezoid generally begin with top and bottom and proceed from bottom to top:

| Left processor | Cache Pair | Right processor |
|---|---|---|
| L 6.1 | 9 | R 6.7 |
| L 5.1 | 8 | R 5.7 |
| L 4.1 | 7 | R 5.6 |
| L 4.2 | 6 | R 4.6 |
| L 3.2 | 5 | R 3.6 |
| L 2.2 | 4 | R 2.6 |
| L 2.3 | 3 | R 2.5 |
| L 1.3 | 2 | R 1.5 |
| T 6.1 | 1 | B 1.3 |

Processing the edges in a fixed order, such as the order listed above, can increase throughput of various blocks of rendering logic. In an alternative embodiment, the edges could be processed in a different order, the parallel edges of the geometric figure could be vertically oriented, or the geometric figure might not be a trapezoid. In this example, the top (T) and bottom (B) edges are parallel edges of the trapezoid. In the first iteration, horizontal lines are rendered corresponding to the top and bottom edges, using the pixels in which they intersect with the left edge, i.e., the top in pixel 6.1 and the bottom in pixel 1.3. Successive iterations render the left and right edges. In the second iteration, the right and left edges in row 1 are fully contained in a single pixel. Row 2 requires two iterations, third and fourth iterations, to generate micro pixel caches, because the row 2 sections of the left and right edges span two pixels. In addition to pairs of caches, polygon interpretation includes generating address sets. The address set includes a row coordinate (Y) and four column coordinates, X1S, X1E, X2S, and X2E, where S indicates the edge start and E indicates its end. The distance between X1S, X1E, and X2S, X2E defines where the left and right geometry edges are located for each row. The distance between X1S, X1E, and X2S, X2E represents an area of enclosed data or an enclosed section of a top or bottom edge. One address set is generated for each row of pixels:

| Y | X1S | X1E | X2S | X2E |
|---|-----|-----|-----|-----|
| 6 | 1 | 1 | 7 | 7 |
| 5 | 1 | 1 | 6 | 7 |
| 4 | 2 | 1 | 6 | 6 |
| 3 | 2 | 2 | 6 | 6 |
| 2 | 3 | 2 | 5 | 6 |
| 1 | 3 | 3 | 5 | 5 |

The relative sizes of the X1 [S]tart and X1 [E]end for the left edge indicate that the edge slants to the left as it rises. The order in which pixel caches are generated by the left and right processors can be deduced form the table.

FIG. 10C-D illustrate address sets in a pair of special cases. FIG. 10B is a small rectangle, vertically oriented. It is small in the sense that it is one pixel wide or less. The address set for Y row 5 is illustrated. All four X parameters have the same value. FIG. 10C is a small rectangle, horizontally oriented. There is only one address set for this rectangle, in Y row 5. Identification of small geometric figures, such as small rectangles, can facilitate processing.

Figure 11A:
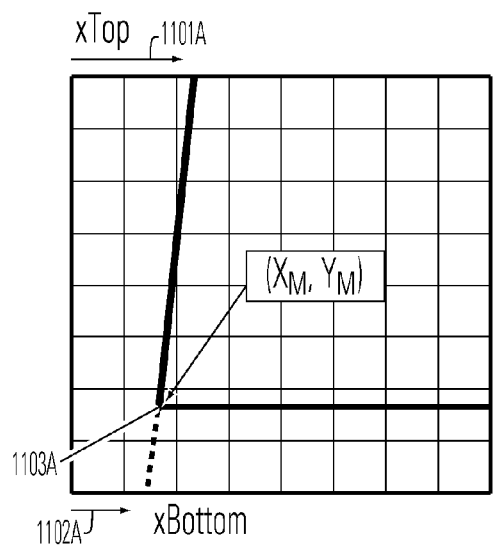
FIGS. 11A-D illustrate four cases of extending an edge from a corner to a side of a pixel and a sub-pixel array corresponding to the pixel.
Figure 11B:
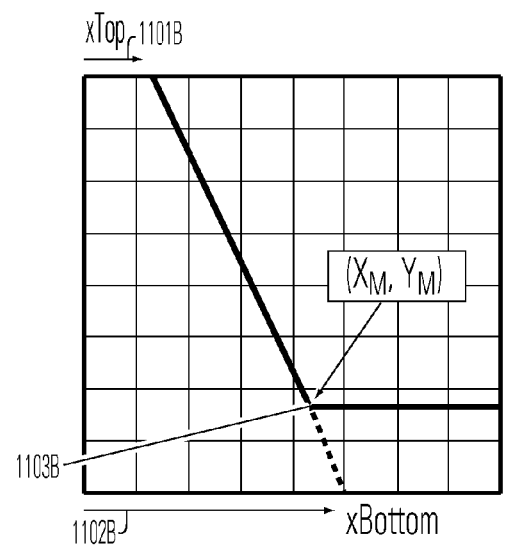
Figure 11C:
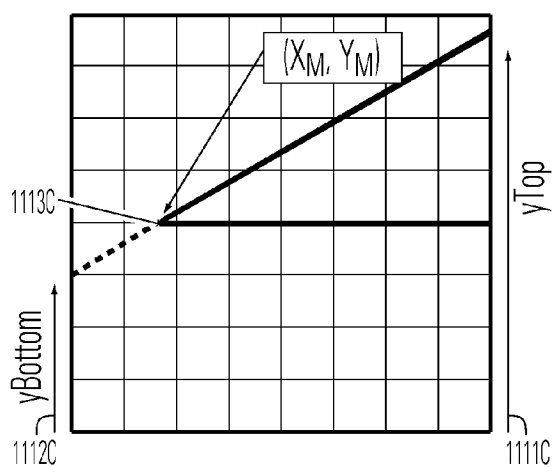
Figure 11D:
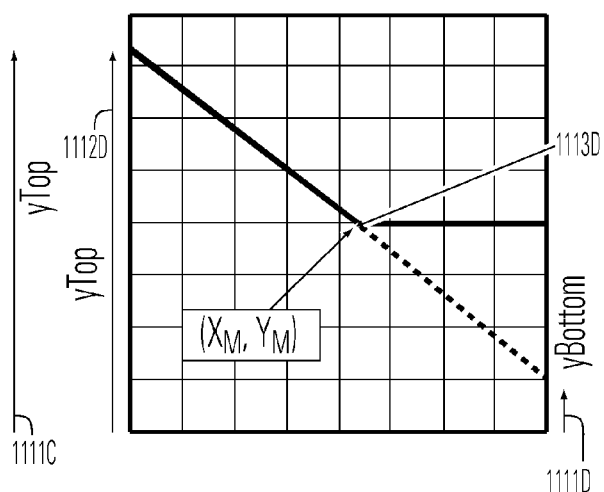

FIGS. 11A-D help illustrate pixel rending within a micro pixel cache and use of extension of polygon edges to begin application of a Bresenham algorithm. Each of the figures represents an 8×8 sub-pixel grid for a single pixel. One operation useful for rendering is to determine the intersection (1102A, 1102B, 1112C or 1112D) of an edge projection with the edges of a pixel. Four cases involving trapezoids are presented in the figures. The angles of the trapezoid side edges in FIGS. 11A and 11B are greater than 45 degrees from horizontal. In FIG. 11A, xTop 1101A falls to the right of the corner (Xm, Ym) 1103A. In FIG. 11B, xTop 1101B falls to the left of the corner (Xm, Ym) 1103B. The remaining two cases in FIGS. 11C and 11D involve angles less than 45 degrees from horizontal and right/left yTop 1111 to yBottom 1112 relationships. The formulas for calculating the intersection of an edge projection with the edges of the pixel depend on the four cases illustrated. For angles exceeding 45 degrees:

---
Cases A and B xBottom = Xm − (dx1/dy)*Ym
XTop = xBottom − (dx1/dy)*Micro pixelCacheWidth Case C yBottom = Ym − (dy/dx1)*Xm
yTop = yBottom + (dy/dx1)*MPCWidth Case D Ym + (dy/dx1)*MPCWidth
yBottom − (dy/dx1)*MPCWidth

---

The pixels ("MiPxCaW") are rendered using the Bresenham algorithm. Pixels that are intersected by an edge are rendered using micro pixels. To find the MiPxCaW the following algorithm may be used:

1) Find the MiPxCaW where the lower left corner is.
2) Find the distance to from the lower left corner of that MiPxCaW to the intersection of the extension of the edge and the lower edge of the MiPxCaW (xBottom). This is given in units of macro pixels as a fixed-point coordinate with 7 binals. This distance is:

$$xBottom = X - \frac{dx1}{dy}Y$$

where (X,Y) are the coordinates of the corner calculated from the lower left corner of the present MiPxCaW.
3) Using xBottom the next intersection is calculated as $$xTop = xBottom + \frac{dx1}{dy}MiPxCaWinWidth.$$

4) If 0<=xTop<MiPxCaWidth, the micro pixel rendering should be performed in the MiPxCaW just above the present one.
5) If xTop >=MiPxCaWidth, the micro pixel rendering should be performed in a MiPxCaW to the right of the one just above the present one.
6) If xTop<0, the micro pixel rendering should be performed in a MiPxCaW to the left of the one just above the present one.
7) Repeat until the upper row is reached.

Instead of using floating point numbers to represent (dx1/dy), everything can be multiplied by dy to give integers. If the slope of the edge is small one may have to take several steps sideways to get to the next MiPxCaW on the next row. This is not the case if the angle between the edge and the x-axis is restricted to be more than 45 degrees. Smaller angles can be rendered by rotating the geometry 90 degrees. The code for the Bresenham algorithm in the case where angles larger than 45 degrees are accepted is:

---
```
eLeft = dy * xBottom = dy * X − dx1 * Y;
eLeftShift = dx1 * MiPxCaWinHeight;
eLeftCond = dy * MiPxCaWinWidth;
xBottom = eLeft/dy;
eLeft+= eLeftShift;
while (eLeft >= eLeftCond) {
    eLeft−= eLeftCond;
    MiPxCaWNumber+=1;
}
while (eLeft < 0) {
    eLeft+= eLeftCond;
    MiPxCaWNumber −=1;
}
xTop = eLeft/dy;
```
---

The variable MiPxCaWNumber is the consecutive number of the MiPxCaWs that should be moved to the left or right, depending on whether the slope is positive or negative. The right edge is rendered in a similar manner.

The input parameters for rendering the left edge are the following:

---
| | |
|---|---|
| XBottom | Lower intersection of the edge and the MiPxCaW grid. |
| XTop | Lower intersection of the edge and the MiPxCaW grid. |
| CacheWinLeft | Number of the MiPxCaW where the rendering starts. |
| StartCacheWin | Number of the MiPxCaW which is the first one to the right of the edge. This is the first to be filled in the interior. This is a return parameter. |

| | |
|---|---|
| StartRow | Lowest micro pixel row to be rendered. This is used on the lower edge- |
| StopRow | Highest micro pixel row to be rendered. This is used on the upper edge. |

In hardware, it is possible that the rendering on micro pixel level should be pre-computed and stored in tables.

The principle for rendering micro pixels inside a MiPx-CaW is the same as for finding the MiPxCaW in the first place. The procedure is the following:
1) Find the sub-micro pixel part of xBottom and use that as a starting value and call it xBottomMi.
2) Fill the micro pixel through which the edge is entering the MiPxCaW.
3) Calculate which micro pixel the edge goes through on the next micro pixel line using the Bresenham algorithm. Basically, MiPxHeight=size of a micro pixel in fixed point units.

```
xBottomMi += (((xTop – xBottom)/MiPxCaHeight) * MiPxHeight;
if (xBottomMi >= MiPxWidth) {
    xBottomMi –= MiPxWidth;
miPxNumber++;
}
```

4) As for the MiPxCaW, multiply this by MiPxCaHeight to get integer relations. The code for the Bresenham algorithm is presented below.

```
xMiOffset = subMiPxBin(xBottom) * MiPxCaHeight;
shift = (xTop – xBottom) * MiPxHeight;
cond = MiPxWidth * MiPxCaHeight;
xMiOffset+= shift;
while (xMiOffset >= cond) {
    xMiOffset–= cond;
    MiPxNumber++;
}
while (xMiOffset < 0) {
    xMiOffset+= cond;
    MiPxNumber––;
}
```

Figure 53:
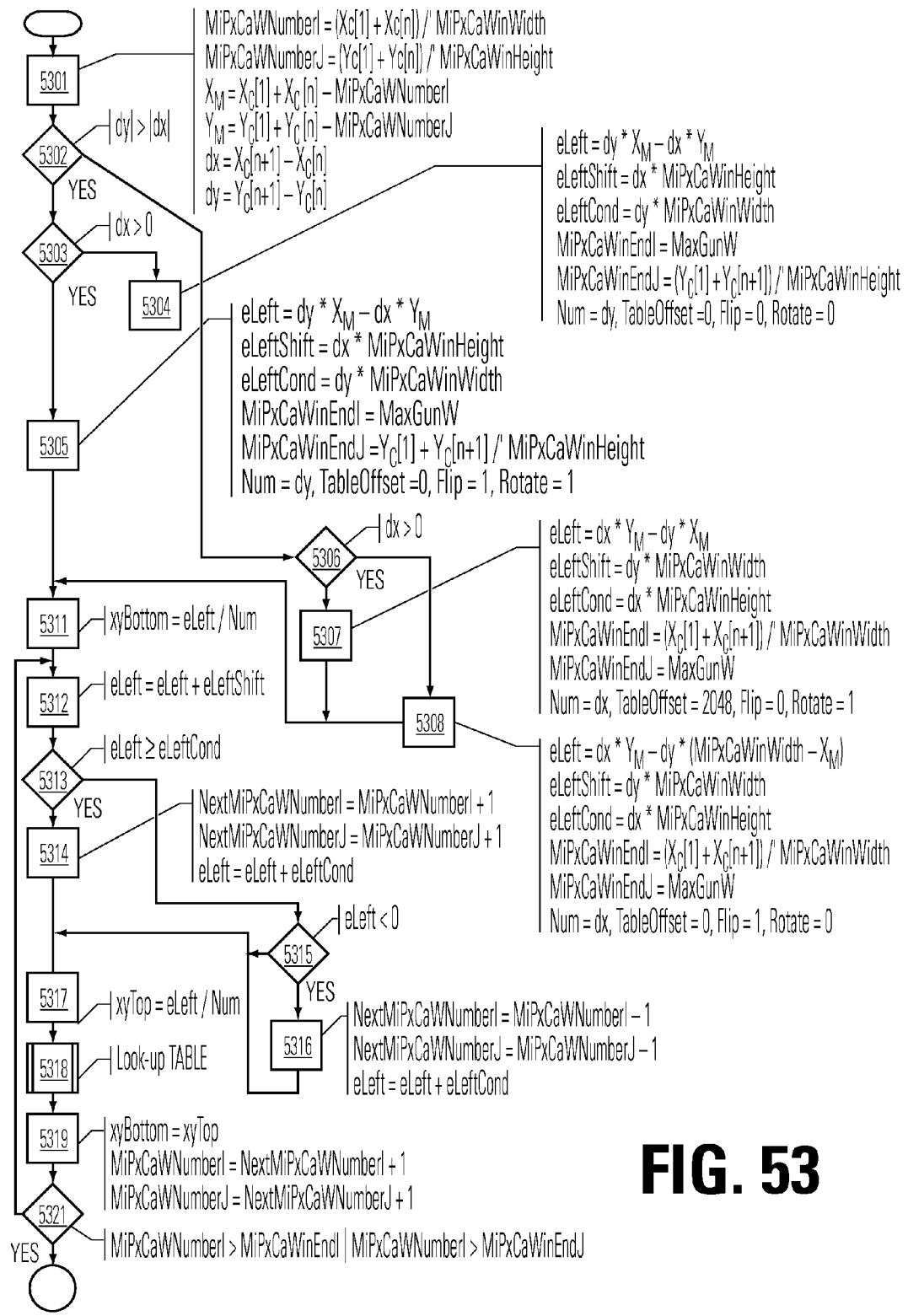
FIG. 53 is a flowchart of applying the Bresenham algorithm.

FIG. 53 is a flowchart describing one embodiment of applying the Bresenham algorithm. Initialization steps are carried out at 5301. Tests at 5302, 5303 and 5306 separate starting points into cases corresponding to FIGS. 11A-D. The code for these cases is carried out in the blocks 5305, 5304, 5307 and 5308. An anchor point for the algorithm is set in 5311. The algorithm iterates along the edge being interpolated in 5312-5321.

Figure 15A:
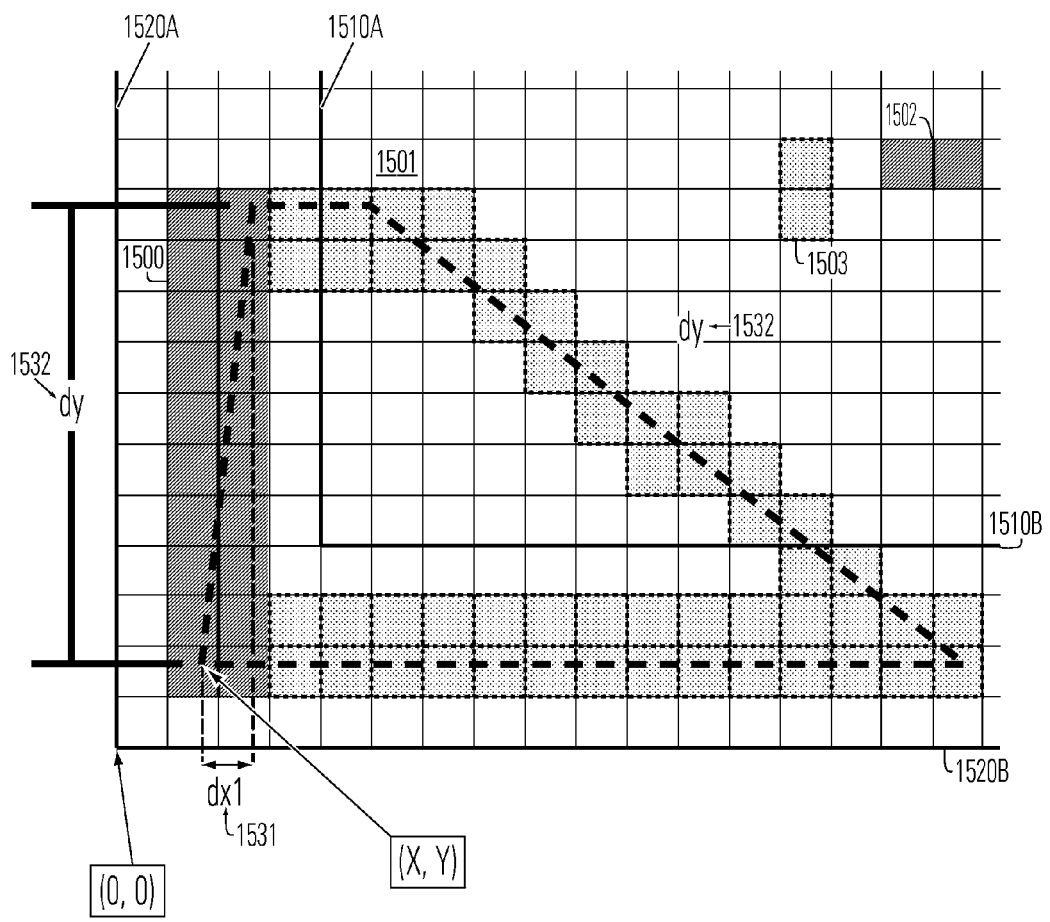
FIG. 15A illustrates features of a trapezoid which overlaps rendering and guard zones.

The parameters of the calculations for FIGS. 11A-D are further depicted in FIG. 15A. In this figure, a trapezoid 1500 is laid over a grid of pixels 1501. Examples are given of a horizontal pixel pair 1502 and a vertical pixel pair 1503. The pixel grid includes a rendering window 1510A and a guard window 1520A. The distance dx1 1531 is defined as the difference between the x-coordinates of the lower and upper corners of the left edge. The distance dy 1532 is defined as the difference in y-coordinates between the top and bottom parallel edges of the trapezoid 1500. Not shown is the extension zone around the rendering window. The corner is at (Xm, Ym). "dx1" is the x-coordinate difference 1531 between the top and bottom corners of the left edge. A similar measure, "dx2", would correspond to the distance between the top and bottom corners of the right edge. "dy" is the y-coordinate difference 1532 between the parallel top and bottom edges of the trapezoid. With a different geometric figure, a two or more dy values might be required. MPCWidth is the width of the micro pixel cache (which equals the width of a pixel.) Appropriate units should be chosen.

It is convenient to render pairs of pixels at once, such as the horizontal pixel pair 1502 or the vertical pixel pair 1503. The pixel pair can always be selected so that the edge being rendered, and any projection of the edge, intersect opposite sides of the pixel pair, instead of cutting off a pixel corner. Along the left edge 1500, horizontal pairs of pixels are rendered, due to the orientation of this left edge. Along the top edge 1501 and the remaining edges, vertical pairs of pixels are rendered in this example. Rendering of paired pixels, including an edge that intersects opposing sides of the pixel, enables use of a table look-up method described below. Alternatively, Bresenham's or another interpolation algorithm can be applied directly, with or without pairing of pixels.

Equalization Pixels

One alternative for practicing aspects of the present invention is to use equalization sub-pixels, with or without precalculated sub-pixel bar maps, which are described in the following section. In one algorithm for rendering micro pixels on the left edge, those micro pixels through which the edge being rendered intersects the bottom of the micro pixel, plus all micro pixels to the right (in the interior of the geometry) of the intersected micro pixel are initially filled. The area covered by the filled micro pixels will then in general differ from the correct area. To compensate, this discrepancy can be calculated and when the total area error is more than one micro pixel, a micro pixel is added or subtracted. The excess area is initially zero. It increases by:

$$A = \left[xBottomMi + \left(xBottomMi + \frac{dx1}{dy}MiPxHeight\right)\right]\frac{1}{2}MiPxWidth$$

for every MiPx row. If the accumulated excess area is larger than one MiPx the edge should be shifted to compensate. This compensation is performed for both positive and negative differences, and the equalization micro pixels are added (subtracted), so that the excess area never deviates more than one MiPx from the ideal area in one MiPxCaW. The excess area can be set to zero for every new MiPxCaW, or carried from one row of micro pixel caches to the next.

The formula above for calculating A is basically the same Bresenham algorithm as earlier. The two interpolation procedures can be combined to one single procedure if implemented in hardware.

Use of Precalculated Sub-Pixel Maps

Figure 12:
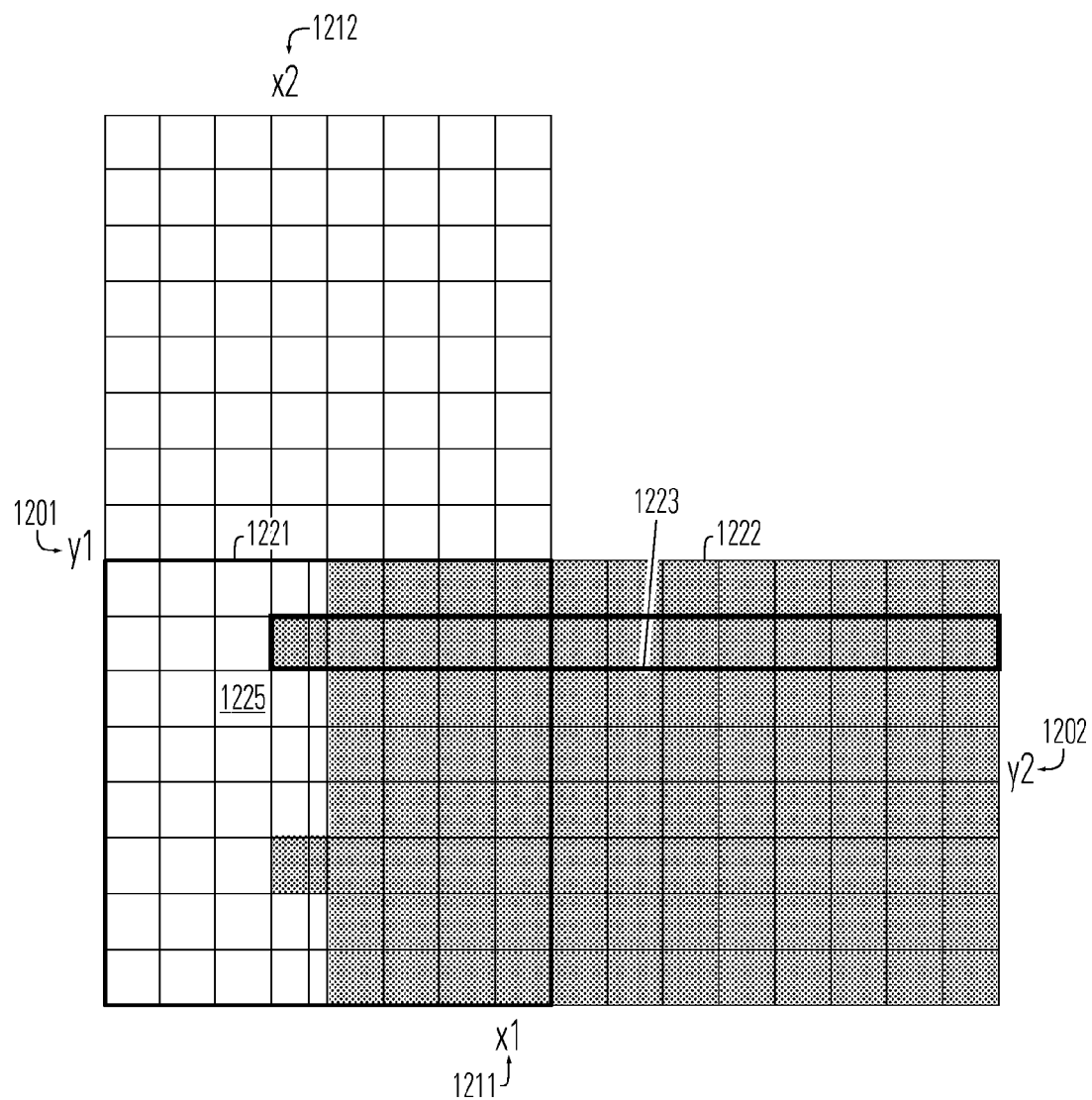
FIG. 12 illustrates horizontal and vertical pairing of pixels and other features of rendering an edge using micro pixel bars.

Another alternative is use of precalculated sub-pixel maps for rendering edges within micro pixel caches, utilizing equalization sub-pixels. FIG. 12 illustrates use of vertical pixel pairs to render angles less than 45 degrees from horizontal and use of horizontal pixel pairs to render angles greater than 45 degrees. (Angles of exactly 45 degrees can be rendered using either orientation of the pixel pair.) The vertical pair is along the X1-X2 axis (1211, 1212). The horizontal pair is along the Y1-Y2 axis (1201, 1202). A single pixel or micro pixel cache is bounded by the bold line 1221. A single sub-pixel or micro pixel is labeled 1225. The shaded area 1222 is filled to represent the inside (or outside) of a geometric figure. The length of one row of shaded pixels 1223 is a sub-pixel or micro pixel bar value. Micro pixel bars can be used as an alternative to continuously performing the calculations necessary for rendering sub-pixel caches. Micro pixel bars represent precalculated shadings stored in a table.

Figure 13A:
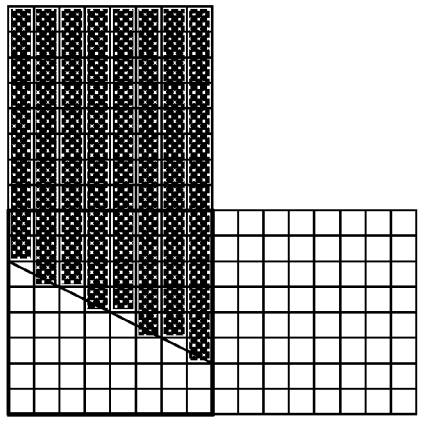
FIGS. 13A-D illustrate four edges of different orientations that can be rendered from a set of micro pixel bars.
Figure 13B:
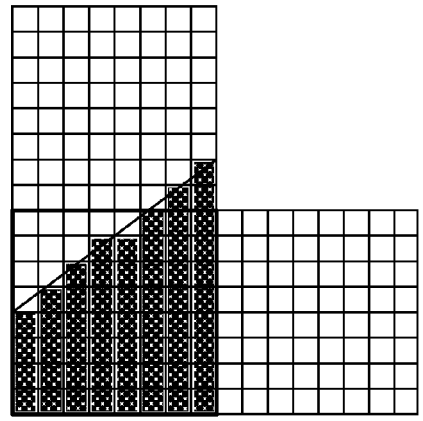
Figure 13C:
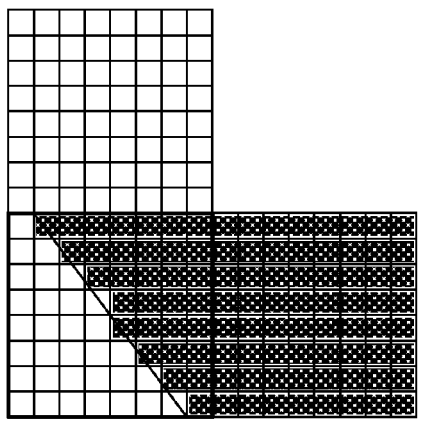
Figure 13D:
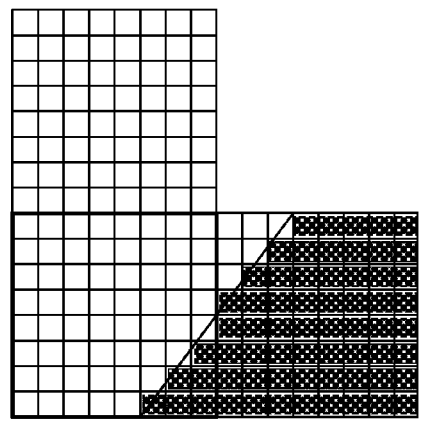

A table of micro pixel bars can be constructed using left hand and top geometry edges. A left hand edge places the interior of the object to the right hand side of the edge. A top edge places the interior of the object below the edge. FIGS. 13B and 13D represent left hand and top geometry edges. In a traditional x, y coordinate system, the range of possible angles can be represented by anchoring the lower left hand corner at or near the origin and sweeping through a range of angles from 90 to 45 degrees. In FIG. 13, micro pixel bars for FIG. 13D can be transformed into the other figures by a combination of reflection, rotation and inversion operations, the inversion applied if necessary to keep the inside and outside of the edge in their proper places. FIG. 13D is a top left hand geometry edge between 90 and 45 degrees. FIG. 13C is a reflection of FIG. 13D across the y axis plus an inversion. FIG. 13B is a shallower edge angle, between 45 and 0 degrees. Reflecting FIG. 13D across the y axis followed by rotation counterclockwise by 90 degrees produces FIG. 13B. An additional reflection across the y axis plus an inversion further transforms FIG. 13B into FIG. 13A. In the four corner arrangement of FIGS. 13A-13D, it takes two operations, a reflection plus a rotation or inversion, to translate a set of micro pixel bar values to an adjacent corner of the square and four operations to translate to an opposite corner of the square. Thus, the range of possible angles can be represented by anchoring the lower left hand corner at the origin and sweeping through a range of angles from 90 to 45 degrees.

One useful aspect of the present invention is use of symmetrical sub-pixel bar maps. FIG. 45 illustrates this symmetry. In the left hand pair of sub-pixel bar maps, map 4501A and 4502 are mirror images of one another. They fit hand-in-glove. Together, they will cover all sub-pixels of a micro pixel array, e.g., generating a brightness of $^{64}/_{64}$. In the right hand pair of sub-pixel bar maps, map 4501B and 4502 have the same area coverage as 4501A and 4502, but produce a different merged result. Because 4501B and 4502 are not symmetrical, they do not fit well together. There are some areas of overlap and other areas of gaps. Together, they cover less than all of the sub-pixels, e.g., $^{61}/_{64}$. For a diagonally placed geometric figure in a pattern, lack of symmetry can adversely impact critical dimension uniformity and the error budget of the system.

The table of micro pixel bars includes only certain angles, because a geometric figure edge is constrained to intersect a sub-pixel at a particular interval, as mentioned above. Use of discrete positions along the edge of the pixel as intercepts is one way to facilitate use of a table with a manageable number of entries. By discrete positions, we mean 513 positions or fewer, given currently available memory and processor configurations. It is sensible to limit the precision of the sub-pixels and discrete positions to 256 sub-pixels and no more than 65 positions per sub-pixel, or to 64 sub-pixels and no more than 33 positions per sub-pixel, or to 32 by 16 sub-pixels and no more than 17 discrete positions along an edge of a sub-pixel, or to 16×8 sub-pixels and no more than 9 discrete positions along an edge of a sub-pixel. These are considered likely alternative configurations given present memory, processor and FPGA technologies. They generally relate to powers of two that extrapolate to configurations that may be implemented in the near future, e.g., the next five years. Discrete positions is not meant to refer to every position that could be addressed using a 16- or 32-bit address. The use of discrete positions limits the potential number of table entries. A pixel edge has 64 or 65 potential points of edge intersection, when it has 8 sub-pixels each having 8 increments. From the origin, representations for 64 angles between 90 and 45 degrees (or 65 angles, including both extremes) can used to represent the full range of potential angles. In an 8×8 sub-pixel grid, 8 micro pixel bars effectively spanning a pair of pixels can be represented as 5 bit values.

Figure 14A:
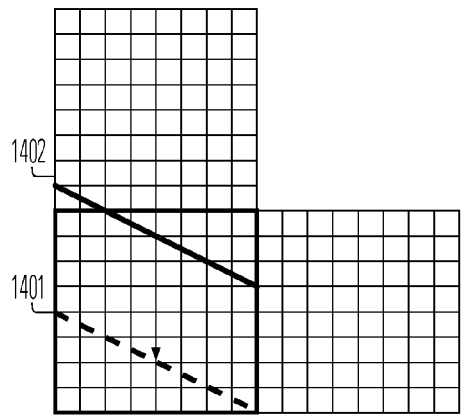
FIGS. 14A-D illustrate using a set of micro pixel bars for construction of an edge displaced from a corner.
Figure 14B:
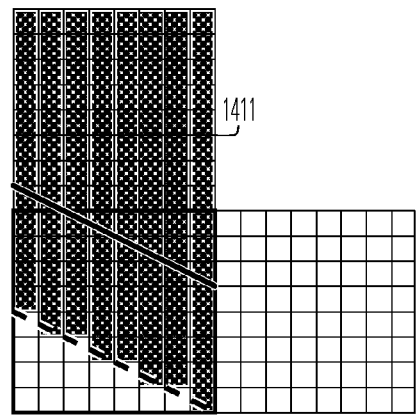
Figure 14C:
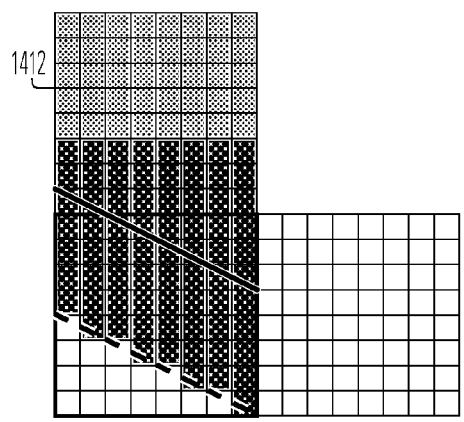
Figure 14D:
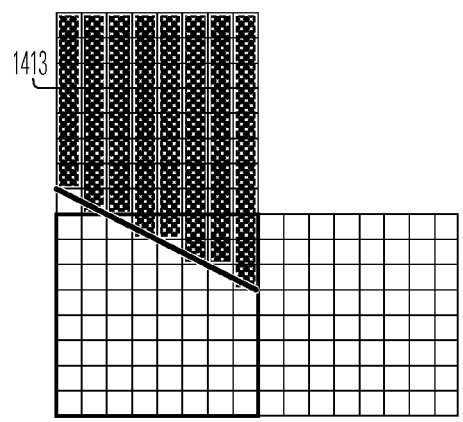

A left hand edge having an angle of 45 to 90 degrees can intersect, in our example, at eight different increments along the x-axis without falling a full pixel width away from the origin. A different pattern of micro pixel bars may be selected to represent an angle that passes through the origin than to represent the same angle when it passes through the x-axis half a pixel from the origin. Different patterns of micro pixel bars are needed for the same angle, in order to achieve sub-pixel accuracy in edge placement. To illustrate, consider a 45-degree edge. If this edge runs through the origin, it is represented by shading $^{32}/_{64}$ sub-pixels. If this 45-degree edge is shifted one full pixel to the right, it is represented by 8 less pixels, at the rate of one less pixel per row. Between 32 and 25 shaded pixels, there can be eight variations on a 45-degree angle, corresponding to placing the edge at eight different locations along the sub-pixel edge. FIGS. 14A-14D depict operations to construct a left hand edge using a set of micro pixel bars. Because the angle is less than 45 degrees, a vertical pair of pixels is used. In FIG. 14A, the edge being constructed 1402 is translated by an integer number of pixels to 1401, so that it rests at or near (less than one pixel from) a corner. In FIG. 14B, a set of micro pixel bars is selected based on the increments at which the translated edge intersects the edges of sub-pixels on the right and left sides of the pixel pair. Next, in FIG. 14C, a number or area of pixels 1412 corresponding to the translation from 1402 to 1401 is subtracted from the micro pixel bars. In FIG. 14D, the micro pixel bars 1413 are moved back into place against the top of the pixel pair, where they represent the desired edge 1402.

Pre-Calculation of Sub-Pixel Bars

Figure 15B:
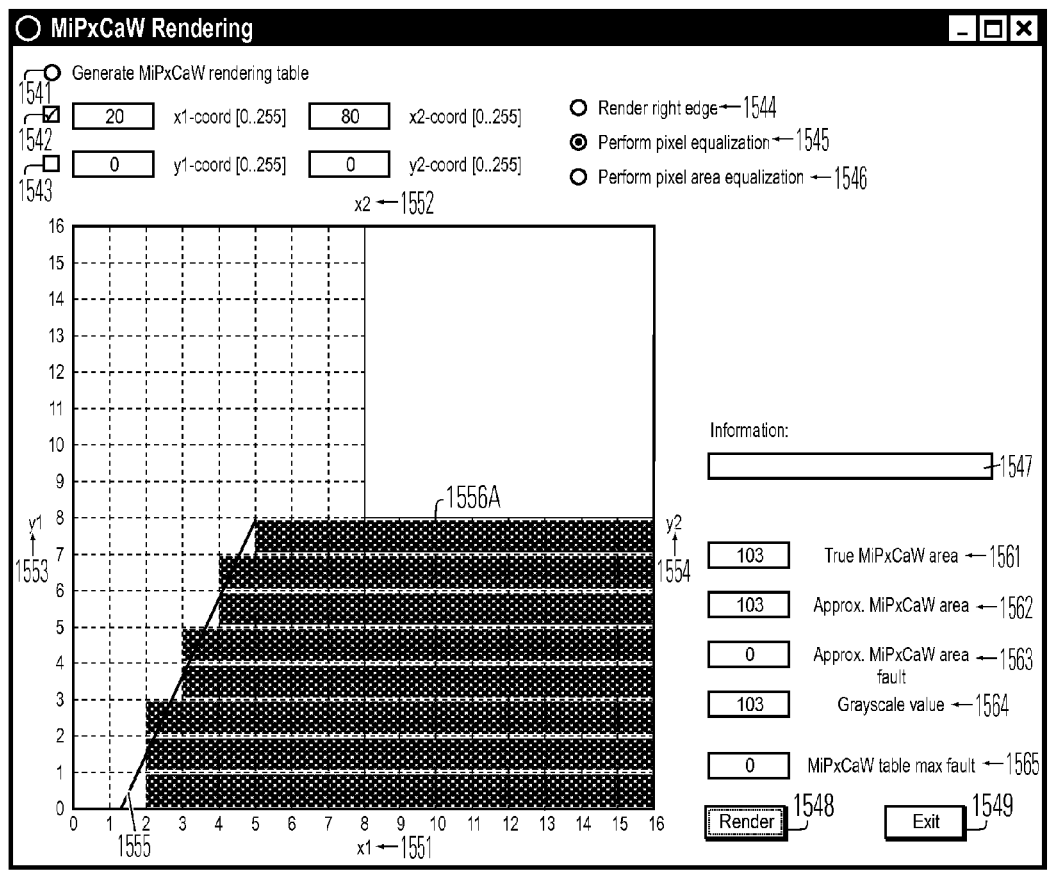
FIGS. 15B-C illustrate an interface for preparation of sub-pixel bar maps used to define an edge that intersects a pixel.
Figure 15C:
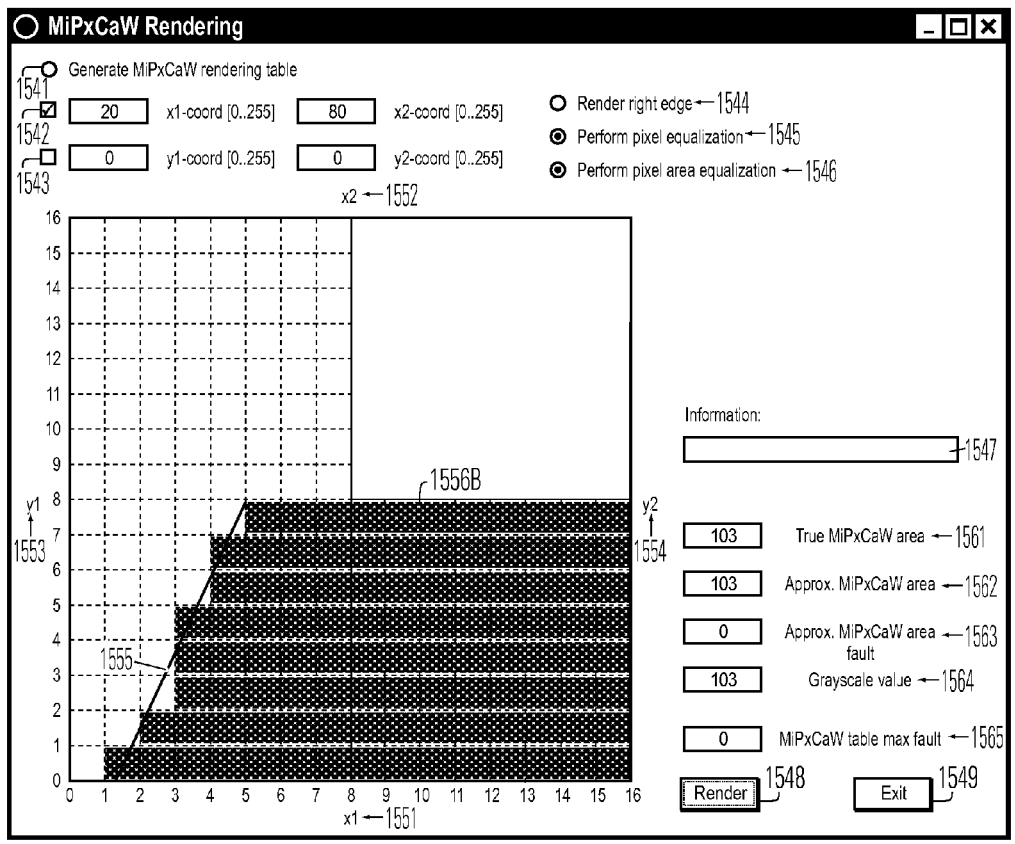

FIGS. 15B-C depict an interface for precalculating sub-pixel bars, which are applied as described above. The features of both figures are the same, except the chosen criteria and the resulting micro pixel bar configuration. The control "Generate MiPxCaW rendering table" 1541 controls output from the precalculation process. When the button is selected, output includes a parameter file that can be merged with other parameter files and used in a system embodying aspects of the present invention. The check boxes 1542 and 1543 select how the intercepts of the edge segment 1555 will be expressed. In FIG. 15B, x-intercept coordinates are supplied. The x1 (1551) coordinate is 20, which corresponds to one and one quarter micro pixels ($^{20}/_{16}$) to the right of the origin. Valid coordinates are in the range of 0.255, which corresponds to 16 positions per micro pixel for 16 micro pixels. The x2 (1552) coordinate is 80, which corresponds to five micro pixels to the right of the origin. If the y coordinate option 1543 is selected, values are given for intercepts on the y1 (1553) and y2 (1554) edges of the micro pixel display. Three rendering options are presented. Unless the "Render right edge" option 1544 is selected, the edge depicted will be a left edge, with the filled part of the FIG. 1556 to the right of the edge 1555.

The distribution of equalization pixels is guided by two or optionally three criteria. For an implementation using pipelined arithmetic to calculate the equalization pixels at the time of rendering, the first two criteria are preferred. First, the area covered by the micro pixels, including equalization pixels should differ at maximum on half of a sub-pixel from the true area calculated trigonometrically from the corner points of the covered part of the MiPiCa. Control button 1545, "perform pixel equalization", invokes this criteria. Second, the area covered by the micro pixels when a corner is formed by the logical 'and' operation of two edges to form a corner should not differ with more than 1 sub-pixel area from what can be calculated trigonometrically for the intersecting edges. Control button 1546, "perform pixel area equalization", invokes this criteria. The information window 1547 supports annotation of a rendering exercise. Several outputs are generated when the render button 1548 is selected. The true area value 1561 is trigonometrically calculated, using the coordinates supplied. It is the area, in this example, to the right of the edge segment 1555. The approximate area value 1562 is a count of the micro pixels covered by the micro pixel bars 1556. The approximate area fault 1563 is the difference between the true area 1561 and the approximate area 1562, which is zero in this example. The grayscale value 1564 in this figure is redundant. The maximum table fault 1565 is used when the system generates an entire set of micro pixel bars in one pass. It provides a check on program performance, by indicating the maximum difference between the true area and the approximate area for any of the micro pixel bars in the set.

The process determining the distribution could be any kind of systematic iteration over angles, offsets and distributions, evaluating the error budget fulfillment for each possible combination. The number of equalization pixels needed is determined in accordance with the first criteria. Then, an iterative procedure tries the different possible corner combinations to find a sub-pixel configuration that fulfills the second criteria with minimal error. The least squared error between the edge and the ends of the micro pixel bars may be used to measure error.

Another method, which is in the present embodiment, is to check that the accumulated error when traversing the MiPiCa from top to bottom and from bottom to top (adding the error bar by bar) does not at any point exceed 1.

In general, selecting micro pixel bar sets involves a choice of favoring a smaller table size or a tighter error budget. One approach is to set the desired table size and find the set of micro pixel bars that contribute the least error to the process. The other approach is to set the error budget and generate the set of micro pixel bars that results in the smallest possible table size. Yet another approach is to generate multiple sets of micro pixel bars and select one based on a combination of table size and error contribution, among other factors.

Comparing FIGS. 15B-C shows different resulting micro pixel bar sets, depending on the criteria 1545, 1546 applied. The differences between 1556A and 1556B appear in rows 0-1 and 2-3.

A further aspect of pre-calculating micro pixel bar sets may involve a hierarchical table containing micro pixel bar sets for different angles and grid intersection offsets. A reduction of table size is obtained by using a table system with two levels, one table with entries for angle and intersection offset pairs (0 . . . 15, determined from the cache intersection coordinate (0 . . . 127) modulo 8). This table contains pointers to the second table, which contains sets of micro pixel bar lengths (8 in each set for the 8×8 sub-pixel resolution). This hierarchy allows for several angle/offset combination to share one micro pixel bar set. Since the bar set table is the larger table, the total table size is reduced. Alternatively, a larger table could be constructed that supports additional combinations of angles and offsets, with a reduced or eliminated need for translation and rotation in application of the bars.

Matlab is a useful tool for finding the possible combinations that can all be represented by a single micro pixel bar set. Potential equalization pixel distributions that satisfy the first and second criteria are checked against distributions for other angle/offset pairs. If two distribution pattern match for different angle/offset entries, as can be identified using Matlab's unique function, one copy of the pattern can be stored and both of the two entries given a pointer to the same set of micro pixel bars.

Figure 16C:
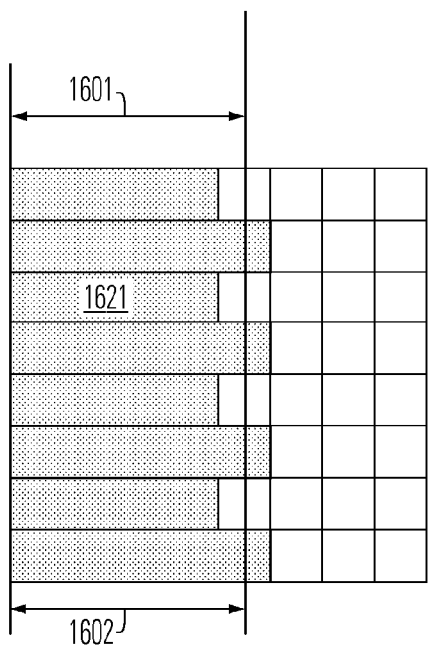
Figure 16C:
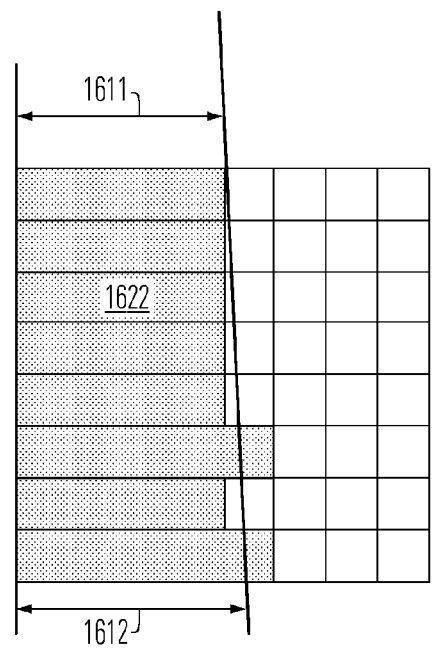
Figure 16C:
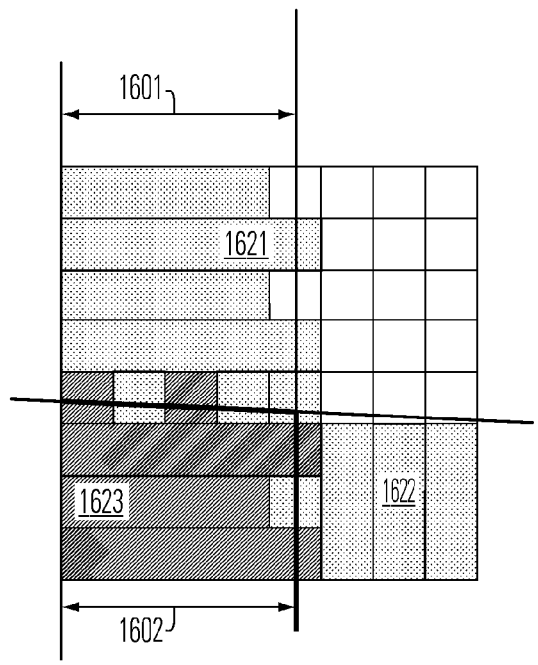

FIGS. 16A-C illustrate forming a corner in the lower left-hand region of a pixel or sub-pixel grid. FIG. 16A illustrates a pattern of micro pixel bars defining an edge. The edge nominally falls 4½ increments out of 8 along the x-axis. The intersections of the edge at the top 1601 and the bottom 1602 of the pixel are equal. In this example, 36 of 64 sub-pixels are shaded. FIG. 16B illustrates a pattern of macro pixel bars defining a slanted edge. The intersection of the edge at the top of the pixel 1611 is in the middle of the pixel. The intersection of the edge at the bottom of the pixel 1612 falls 4½ increments along the x-axis. Shaded sub-pixels cover 36 of 64 grid locations. In FIG. 16C, a pair of edges as depicted in FIGS. 16A-B intersect the former corner. The patterns of sub-pixels corresponding to the vertical edge 1621 and the horizontal edge 1622 are indicated by light gray. The intersection of the two pixel patterns 1623, formed by a logical and-operation is shaded dark gray. The dark gray shaded area in this example varies slightly from the ideal value.

The preceding figures illustrate alternative embodiments that practice aspects of the present invention. One of ordinary skill in the art will recognize that many variations in geometric relationships can practice the present invention. For instance, grid locations for devices using radiation sweeps to project an image can be rectangular. Grid locations with sub grid addressing in the sweep direction can be treated as rectangular pixels or as sub-pixels. Individual micromirrors of a micromirror array can be rectangular, hexagonal or non-convex. A sub-pixel grid may cover a plurality of grid locations, micromirrors or pixels, as suits the geometry of the device used to project radiation to form an image. Summarizing the grayscale value of a pixel from a sub-pixel grid should correspond to the mapping of sub-pixels to pixels. One of ordinary skill in the art will further recognize that the use of two levels of resolution can be adapted to gray scaling of the sub-pixel grid at the higher resolution. When the high-resolution sub-pixel grid contains grayscale information for individual sub-pixels, the intersection of edges to form a corner would require addition of values of sub-pixels, with attention to sums overflowing the maximum value of a sub-pixel, instead of a logical operation. Summarizing the grayscale value of a sub-pixel grid would require summation of, instead of counting shaded sub-pixels.

Edge Displacement

Figure 17:
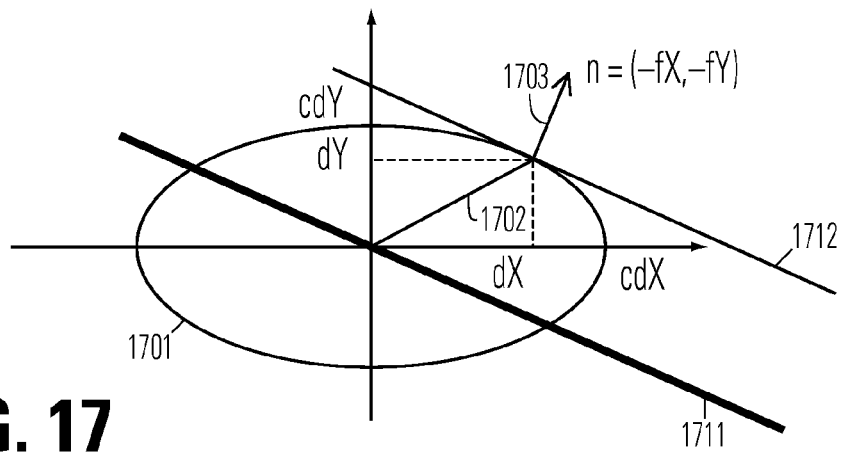
FIG. 17 illustrates an elliptical structuring element useful for edge displacement.

FIG. 17 begins the presentation of edge displacement in accordance with aspects of the present invention. Edge displacement means growing or shrinking (dilating or eroding) a geometric figure by displacing its edges outward from the center or inward toward the center of the feature. This is different from translating a geometric figure, because opposing edges of the geometric figure move opposite directions. When edges are displaced, a corner between the edges would ideally reflect the new intersection of the two edges. In practical applications, displacement of horizontal, vertical and 45 degree edges is most important. Edge displacement in the rendering domain, as opposed to the geometry domain, allows an equipment operator to fine-tune feature sizes without changing the geometry file that is to be printed. A sequence of test patterns printed on a single work piece using a variety of edge displacement parameters can be used to calibrate the equipment. Repeated instances of a test pattern can be included in a data file. This geometry can be fractured and expanded. Different edge displacement parameters can be applied to different instances of the test pattern. An inspection tool can be used to select the edge displacement parameter set that produces the desired feature dimensions from the test pattern.

FIG. 17 illustrates the geometry of edge displacement. The parameters for edge displacement include cdX and cdY. The cdX parameter indicates how far a vertical edge should be displaced from the center of a geometric feature. A positive cdX dilates the geometric figure. A negative cdX erodes it. The cdY parameter indicates how far a horizontal edge should be displaced from the center of the geometric figure. FIG. 17 illustrates an old edge 1711 at an angle of approximately 30 degrees to horizontal displaced to a new edge location 1712. An ellipse 1701 having axes equal to cdX and cdY is used as a structuring tool. The new edge location 1712 is parallel to the old edge 1711 and separated from the old edge by a distance 1702 defined by the elliptical structuring tool. The new edge touches the structuring tool at a point tangent to the old edge. The location of the tangent point is dX, dY. The direction of displacement 1703 is normal to both the old and new edges.

$$\left(\frac{dX}{cdX}\right)^2 + \left(\frac{dY}{cdY}\right)^2 = 1 = z(dX, dY),$$

$$n \propto \nabla z \propto \left(\frac{dX}{cdX^2}, \frac{dY}{cdY^2}\right) \propto (fX, fY).$$

$$dX^2 = fX^2 \frac{cdX^4}{cdX^2 fX^2 + cdY^2 fY^2},$$

$$dY^2 = fY^2 \frac{cdY^4}{cdX^2 fX^2 + cdY^2 fY^2}.$$

Calculation of dX and dY is computationally intensive. One way to minimize the computing requirements for edge displacement is to load precalculated values of dX, dY, fX and fY into the rendering engine at the same time the parameters cdX and cdY are loaded.

Edge Angle Detection

Three algorithms, and variations, present cases of implementing edge displacement in a rendering engine using two levels of resolution. The algorithms are adapted for orthogonal displacement of horizontal and vertical edges, oblique displacement, in a direction along a horizontal or vertical edge, and orthogonal displacement of 45-degree edges.

A convolution filter is one tool used to detect the angle or orientation of an edge, for selection of an algorithm to apply. Consider the following convolution filters applicable to a 3×3 neighborhood of pixels.

$$fX = \begin{matrix} -1 & 0 & 1 \\ -2 & 0 & 2 \\ -1 & 0 & 0 \end{matrix}$$

$$fY = \begin{matrix} 1 & 2 & 1 \\ 0 & 0 & 0 \\ -1 & -2 & -1 \end{matrix}$$

To apply these convolution filters, the pattern of filter coefficients is laid over a pattern of gray pixels values. The product of the filter coefficients and pixel gray values is calculated for each cell and the cells are added together. A separate sum is calculated for each filter. Better convolution filters can be constructed using larger neighborhoods and using non-integer values, such as Sobel's filter, or a filter that uses two times the square root of two, instead of the integer two. A wide range of approximations can be used for filter coefficients, depending on a rough trade-off between computation requirements and accuracy.

Results of Edge Displacement

Use of the filter is given above to calculate an angle as the arc tangent of fY/fX was tested with data corresponding to mask patterns. Results are as follows:

| Angle | Estimate  | Standard deviation | Mean error |
|-------|-----------|--------------------|------------|
| 90    | 90.000000 | 0.000000           | 0.000000   |
| 85    | 80.324390 | 11.137572          | −4.675610  |
| 80    | 73.371079 | 12.643785          | −6.628921  |
| 75    | 67.821833 | 12.267936          | −7.178167  |
| 70    | 63.054278 | 10.983100          | −6.945722  |
| 65    | 58.930741 | 9.160636           | −6.069259  |
| 60    | 55.165984 | 7.048248           | −4.834016  |
| 55    | 51.650496 | 4.790010           | −3.349504  |
| 50    | 48.287420 | 2.442252           | −1.712580  |
| 45    | 45.000000 | 0.000000           | 0.000000   |

Filling Up Algorithm

Figure 18A:
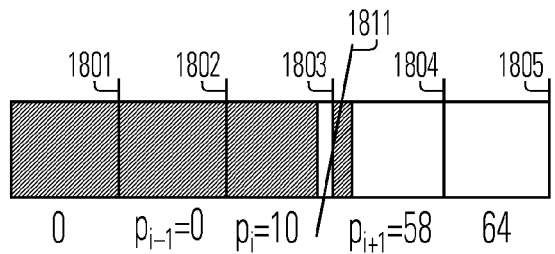
FIGS. 18 and 19 illustrate the operation of so-called filling up and sliding displacement algorithms.
Figure 18B:
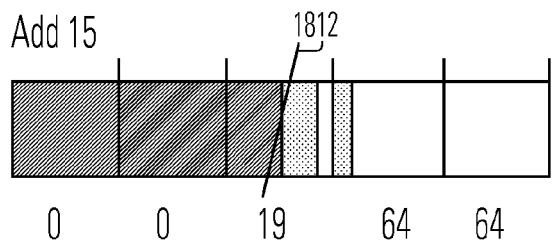

The algorithm for displacement of horizontal or vertical edges is depicted in FIGS. 18A-B. Each of the figures includes five pixels, 1801-05. FIG. 18A is before displacement; FIG. 18B is after displacement. The edge being displaced is nearly vertical 1811, 1812. Before displacement, the edge intersects a corner of pixel 1804. Therefore, the gray value of pixel 1804 is 58/64. The edge intersects a slightly larger corner of pixel 1803, so the gray value pixel 1803 is 10/64. The edge displacement parameter in this example is 15/64 sub-pixels to the left. This so-called "filling up" edge displacement algorithm is used for edges that are close to parallel to one of the axes of the raster coordinate system. It is used to move an edge by zero to one pixels. For dilation of a geometric figure, the algorithm calls for filling up the brightest gray pixel to a white value of 64 and spilling over any surplus amount of displacement to the first black or gray pixel. To erode a geometric figure, the algorithm calls for emptying the darkest gray pixel and taking any surplus amount of displacement from the first white or bright gray pixel. The following function is one way of implementing this algorithm:

$$p'[i] = p[i] + sgn(cdX) \times \max(0, dX - (1 + sgn(cdX)) +$$
$$sgn(cdX)(p[i + sgn(cdX)sgn(fX)] + p[i + 2sgn(cdX)sgn(fX)]))$$

where, p'[i] is the resulting brightness of pixel p[i];

sgn is (1,0,−1), depending on whether the argument is positive or negative;

cdX is an input parameter described above;

dX is calculated, and may be pre-calculated, using the formulas above; and fX is calculated, and may be pre-calculated, using the formulas above.

In the example of FIGS. 18A-B, the displacement by 15/64 of a pixel is desired. Pixel 1804 begins with a value of 58/64. Pixel 1804 is filled with 6 of 15 sub-pixel shadings. The remaining 9 of 15 is added to pixel 1803, increasing its value from 10 to 19. The edge 1811 is displaced to a position 1812 that is 15/64 micro pixels to the left. This algorithm is useful in orthogonal displacement of vertical and horizontal edges, but may not perform as well for displacement along an edge that is nearly horizontal or vertical.

Sliding Displacement Algorithm

First Embodiment

Figure 19A:
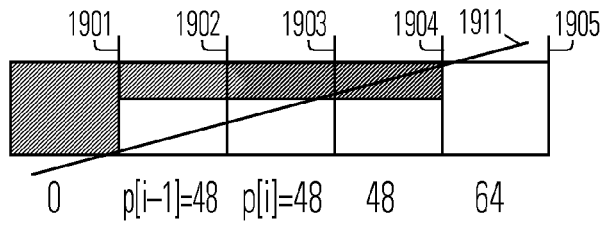
Figure 19B:
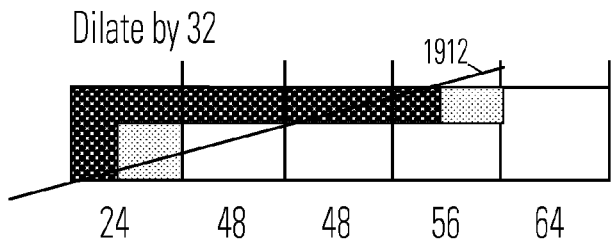

The sliding displacement algorithm is illustrated by FIGS. 19A-B. For displacement along an axis that is nearly parallel to the edge being displaced, the following function can be used:

$$p'[i] = \frac{dX}{\text{maxVal}} p[i + sgn(cdX)sgn(fX)] + \frac{(\text{maxVal} - dX)}{\text{maxVal}} p[i].$$

Where, maxVal=maximum brightness value of a filled pixel (64 in this example). This algorithm depends only on the gray value of one adjacent pixel, either to the left or right depending on the signs of the parameters cdX and fX. The formula essentially calculates the weighted mean between two pixels, where the weighting factors add up to one. Different weighting factors can be applied to compensate for errors observed when the method is applied. The displacement illustrated in this figure is a dilation of $32/64$. The resulting weights are half the brightness of the current pixel plus half the brightness of its right-hand neighbor. The edge 1911 is displaced to the left 1912. Pixel 1904 is assigned the average value of pixels 1904 and 1905. Its value changes from 48 to 56. Pixels 1903 and remains unchanged, because the weighted, pre-dilation average of pixels 1903 and 1904 and of pixels 1902 and 1903 is 48. Pixel 1901 changes from 0 to 24, as it takes on half the brightness value of pixel 1902. The edge 1911 is displaced by this process ½ pixel to the left.

Sliding Displacement Algorithm

Second Embodiment

An alternative formula for sliding displacement is:

$$p'[i] = \max\left\{\min\left\{\begin{array}{c} 0 \\ 64 \\ \left(1 - \frac{dX}{64}\right)p[i] + \frac{dX}{64} * p[i + sgn(cdX)sgn(fx)] \end{array}\right\}\right\}$$

where p[i] is the center pixel. If more than 64 sub-pixels represent a single pixel, the alternative min value is adjusted accordingly.

Displacement by Sliding and Filling Up

Figure 48:
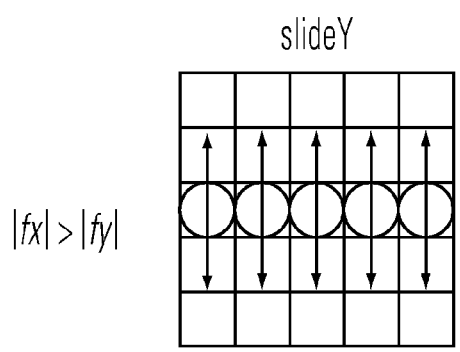
FIGS. 48-51 illustrate aspects of edge displacement.
Figure 49:
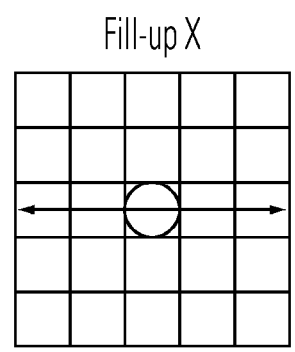
Figure 50:
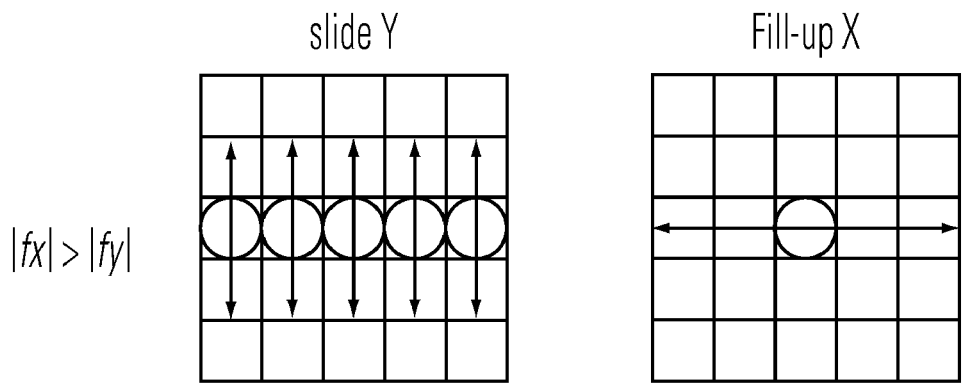
Figure 51:
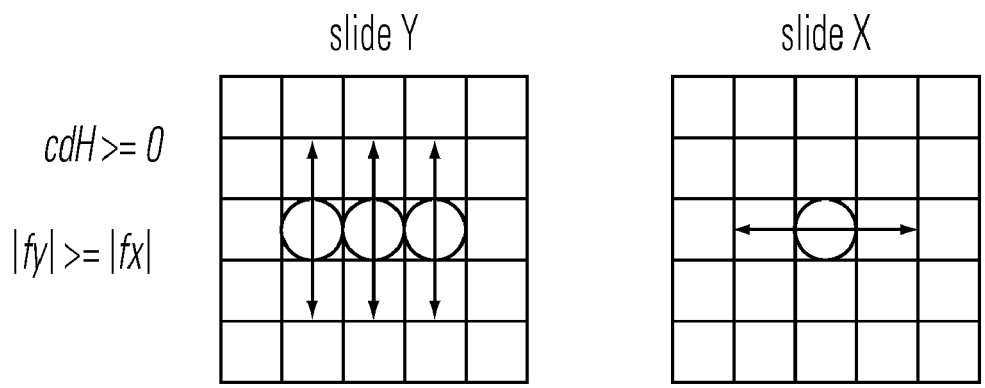

Variations in application of sliding and filling up edge displacements are illustrated in FIGS. 48-49. The approach used may depend on the angle of the edge detected by the gradient filters. In each variation, first the slide operation is performed on every central pixel of the neighborhood along either the x- or y-axis. Then a fill-up operation is made on the center pixel of the neighborhood in the opposite direction. A weight factor of 1 is used, but can be modified to proportionally increase or reduce the response of the algorithm to a displacement parameter.

A variation on the fill up and sliding algorithms described above is to use the fill up algorithm for all erosions, introducing a weight factor for the center pixel so that it is only eroded proportionally to its filling factor in the first direction eroded and proportionally to the square-root of the filling factor in the second direction eroded. The sliding algorithm can be used for all dilations of geometric figures. When there are several gray pixels in both the x and y directions, the fill up algorithm tends to under fill pixels, making the sliding algorithm attractive.

45 Degree Edge Algorithm

A third algorithm works well for displacement of 45-degree edges. This algorithm can be applied to edges close to 45 degrees. Two tests for whether an edge is close enough to 45 degrees to apply the 45-degree algorithm are:

abs(abs(fX)−abs(fY))*32<(abs(fX)+abs(fY)), and abs(abs(fX)−abs(fY))*8<(abs(fX)+abs(fY))

where abs is the absolute value function. These tests are applied to the gradient filters used to detect the edge orientation. The choice of the factor, 8 or 32, determines how close the angle must be to 45 degrees before the algorithm is applied. Other factors or ranges of factors can readily be used, including 16, 20 or 24 and 8-32 or 16-24. Use of the factor 8 corresponds approximately to 45 degrees+/−10 degrees.

If the edge is 45 degrees, the distance D from the corner of the pixel that it intersects can be calculated as:

$$D = \begin{cases} \sqrt{\frac{F}{\text{maxVal}}}, & 0 \leq F \leq \text{maxVal}/2 \\ \sqrt{2} - \sqrt{1 - \frac{F}{\text{maxVal}}}, & \text{maxVal}/2 \leq F \leq \text{maxVal} \end{cases}$$

Where F is the number shaded sub-pixels (e.g., 32 of max-Val=64, when the 45 degree edge bisects the pixel.) In general, the distance which the 45 degree edge is displaced can be calculated as:

$$cdH = \frac{fX^2 cdX^2 sgn(cdX) + fY^2 cdY^2 sgn(cdY)}{\sqrt{(fX^2 + fY^2)(fX^2 cdX^2 + fY^2 cdY^2)}}$$

This displacement is, of course, in the same direction as the unit vector n (1703) in FIG. 17. If cdH>0 and the pixel is empty, or cdH<0 and the pixel is full, we must check the diagonal neighbors to see if they are gray and calculate the distance from corner according the equation above. Then the present distance to corner is obtained by adding or subtracting sqrt(2), which is the diagonal distance of a single pixel. The new distance from the corner to the edge is thus:

$$D = D_{neighbor} \pm \sqrt{2}$$

To calculate the new fill factor for the 45 degree edge, we calculate the distance from the pixel corner as D+cdH. Then the new filing factor is:

$$\frac{F}{\text{maxVal}} = \begin{cases} (D + cdH)^2, & 0 \leq D + cdH \leq 1/\sqrt{2} \\ 1 - (\sqrt{2} - D - cdH)^2, & 1/\sqrt{2} \leq D + cdH \leq 1 \end{cases}$$

Of course, there is a max (maxVal) and min (0) for F. In order to avoid round-off errors we take an average from both the central pixel and the two neighboring pixels.

A second embodiment for displacement of 45 degree edges resembles the first. This 45° algorithm transforms a gray scale virtual edge, classified as 45° edge, in a 128×128 pixel square. The edge is transformed from the raster domain to a geometrical domain. Edge displacement is performed in the geometrical domain and then retransformed into a grayscale fill value. The function GetDist is defined to transforms a grayscale value to a geometric value. The function GetFill transforms a geometric value to a grayscale value. GetDist converts a gray scale fill value to a geometric distance value:

| | |
|---|---|
| fill ≤ 0 | dist = 0 |
| fill < $\frac{64}{2}$ | dist = $\sqrt{\frac{fill}{64} * 128}$ |
| fill > $\frac{64}{2}$ | dist = $\left(\sqrt{2} - \sqrt{\frac{64-fill}{64}}\right) * 128$ |
| fill ≥ 64 | dist = $128\sqrt{2}$ |

GetFill converts a distance value to a grayscale fill value:

| | |
|---|---|
| dist ≤ 0 | fill = 0 |
| dist < $\frac{128}{\sqrt{2}}$ | fill = $\left(\frac{dist}{128}\right)^2 * 64$ |
| dist > $\frac{128}{\sqrt{2}}$ | fill = $\left(1 - \left(\sqrt{2} - \frac{dist}{128}\right)^2\right) * 64$ |
| dist ≥ $128\sqrt{2}$ | fill = 64 |

The 45° algorithm uses a 3×3 pixel surrounding to calculate the center pixel displacement. Pixel position in the 3×3 matrix is expressed as p[x][y] where p[0][0] is the center pixel. Input parameters for the algorithm are sgnfX, sgnfY and cdH.

```
if (cdH>0) {
    if (p[0][0]<=64/2) {
        p[0][0]=a
    }
    elsif(p[0][0]>64/2){
        p[0][0]=b
    }
    elsif(p[sgnfX][sgnfY]>0){
        if(p[sgnfX][sgnfY]>=64/2) {
            p[0][0]=b
        }
        elsif(p[sgnfX][sgnfY]<64/2){
            p[0][0]=c
        }
    }
}
elsif(cdH<0){
    if(p[0][0]<64){
        p[0][0]=e
    }
    elsif(p[-sgnfX][-sgnfY]<64){
        p[0][0]=d
    }
}
```

In this code segment, (sgn)fX, sgn fY∈{−1,1}). The values a through e are:

$$a) = GF\left(\frac{GD(p[0][0]) + GD(p[sgn\ fX][0]) - \frac{128}{\sqrt{2}} + GD(p[0][sgn\ fY]) - \frac{128}{\sqrt{2}}}{3} + cdH\right)$$

$$b) = GF\left(\frac{GD(p[0][0]) + GD(p[-sgn\ fX][0]) + \frac{128}{\sqrt{2}} + GD(p[0][-sgn\ fY]) + \frac{128}{\sqrt{2}}}{3} + cdH\right)$$

$$c) = GetFill(GetDist(p[sgn\ fX][sgn\ fY]) - 128\sqrt{2} + cdH)$$

$$d) = GetFill(GetDist(p[-sgn\ fX][-sgn\ fX]) + 128\sqrt{2}\ cdH)$$

$$e) = GetFill(GetDist(p[0][0] + cdH)$$

where GF is short for GetFill and GD is short for GetDist.

Corner Detection and Handling

An additional, optional aspect of edge displacement can be special handling of corners. The so-called Forstner-Plessey-Harris algorithm is one basis for detecting corners. See, VIGRA Computer Vision Library, template < . . . > void cornerResponseFunction at http://kogs-www.informatik.uni-hamburg.de/~koethe/vigra/doc/cornerResponseFunction.html; C. G. Harris and M. J. Stevens: "A Combined Corner and Edge Detector", Proc. of 4th Alvey Vision Conference, ed. by C. J. Taylor, pp. 147-151 (Manchester University, 31 Aug.-2 Sep. 1988). The algorithm proceeds as follows: At a given scale s, it calculates the structure tensor (which is the smoothed matrix of gradient products) at each pixel like this:

$$\begin{pmatrix} G^s(g_x^s g_x^s) & G^s(g_x^s g_y^s) \\ G^s(g_x^s g_y^s) & G^s(g_y^s g_y^s) \end{pmatrix} = \begin{pmatrix} A & B \\ C & D \end{pmatrix}$$

Where G denotes Gaussian average at scale s, $g_x$ and $g_y$ are first Gaussian derivatives, and the multiplication is pixel wise. Then the corner response may be defined as:

$$CR = AB - C^2 - 0.0625(A+B)^2.$$

The corner response CR can be used, after thresholding, to identify corner pixels.

In practice, we use fX and fY to estimate g and a Gaussian filter of the form $$\text{Gaussian} = \begin{pmatrix} 0 & 1 & 0 \\ 1 & 4 & 1 \\ 0 & 1 & 0 \end{pmatrix}$$

Figure 46:
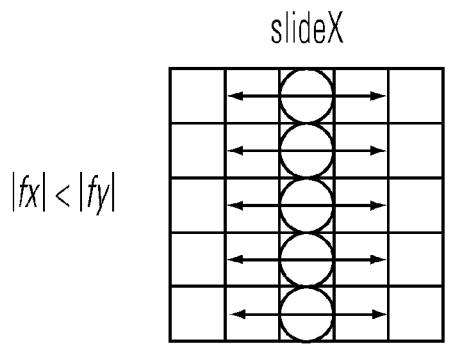
FIGS. 46-47 illustrate two-stage convolution of a 5×5 neighborhood, which is useful in detecting a corner.
Figure 47:
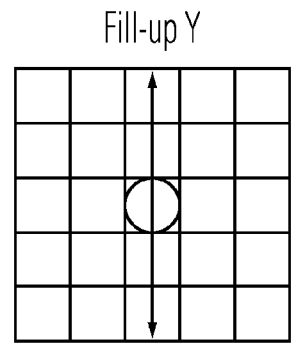

Note that this operation requires a 5×5 neighborhood. The value of CR is high close to corners. Thresholds are used to select the corner pixels (ALG2_PAR_HARRIS_LOW<CR<ALG2_PAR_HARRIS_HIGH). Alternatively, corner detection may use a 5×5 pixel window to determine if the center pixel is an object corner. The two 3×3 gradient filters for general edge detection are applied to every possible position in the window, as suggested in FIG. 46. The result is a 3×3 matrix with fx and fy values. In every position the results are squared and multiplied with each others, resulting in three values per position, as shown in FIG. 47. The Gaussian filter above is applied to the matrix in FIG. 47 for each value. The corner response (CR) is calculated and compared with the threshold for corner detection.

$$CR=G(fx^2)*G(fy^2)-G(fx*fy)^2-0.0625*(G(fx^2)+G(fy^2))^2 \quad TBD<CR<TBD$$

Another approach to edge and corner detection is the Smallest Univalue Segment Assimilation Nucleus (SUSAN), which has been widely described, including in the patent, S. M. Smith, *Method For Digitally Processing Images To Determine The Position Of Edges And/Or Corners Therein For Guidance Of Unmanned Vehicle*, UK Patent 2272285 (15 Jan. 1997), and in S. M. Smith, *A New Class Of Corner Finder*, in Proc. 3rd British Machine Vision Conference, pages 139-148 (1992). The utility of edge displacement is independent of the particular edge and corner detection algorithms selected, except that better corner and edge detection methods provide a better basis for dilating or eroding geometric figures.

Another alternative for corner detection is to record the creation of corners during the rendering process. Corners are created by using a logical AND-operation to intersect two edges. Application of a logical AND-operation, either in rendering a polygon or combining polygons indicates a potential corner. The two-bit pixel encoding described above reserved the bit value "11". This value could be used to flag gray pixels constructed by corner operations, as opposed to simple edges of geometric figures. This flag would automatically be removed when successive geometric figures completely covered a pixel, driving its brightness value to maxVal and causing the pixel to be flagged as W/B. This flag could be removed when two abutting trapezoids created a continuous edge where two corners had previously been. The flag could be taken as indicating a corner for special case handling or as indicating a corner for further testing.

Flow Diagram of Edge Displacement

Figure 52:
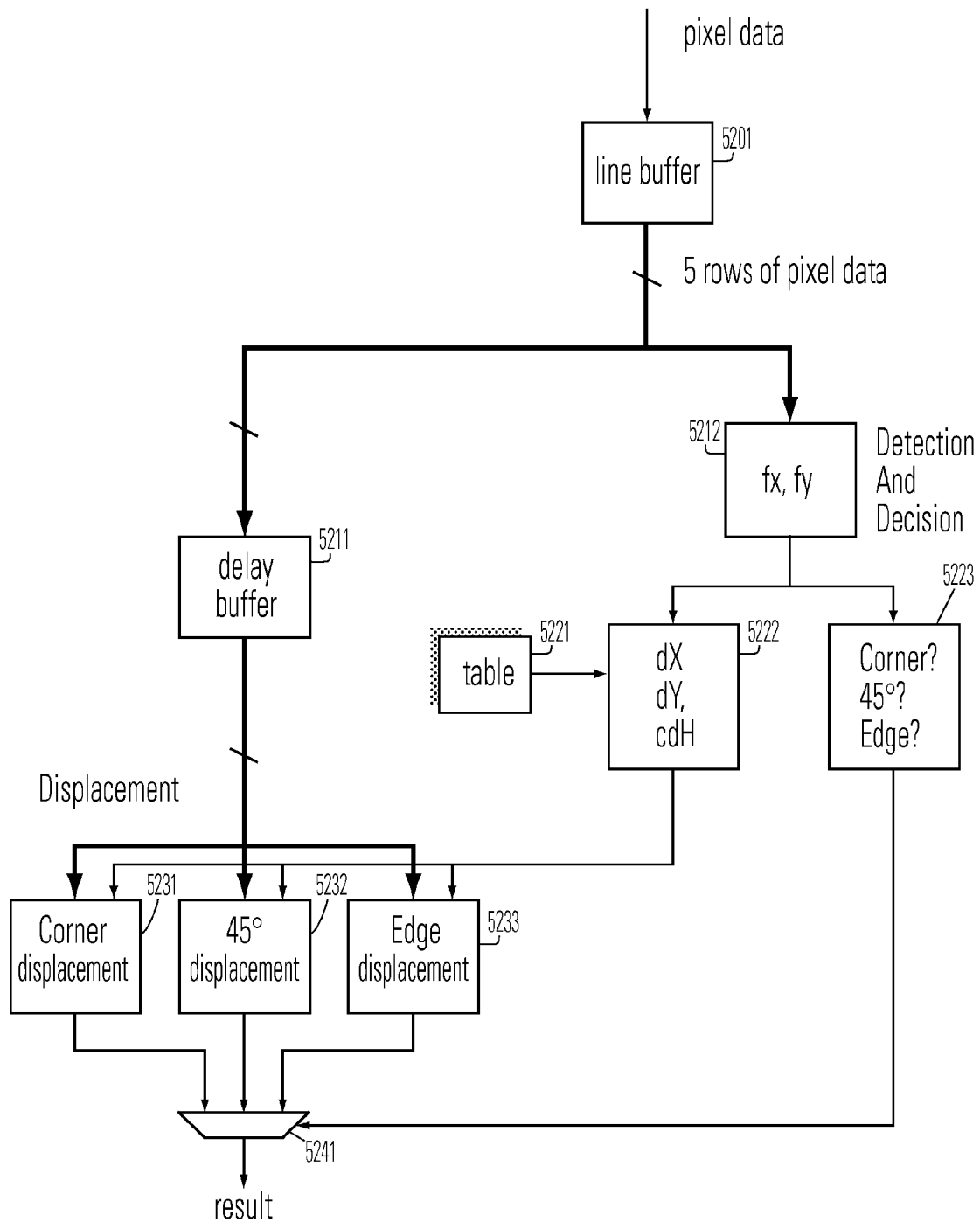
FIG. 52 is an overview flowchart of edge displacement.

FIG. 52 is a flow diagram for a hardware implementation of edge displacement. In this embodiment, displacement calculations are calculated as soon as the dX, dY and cdH values have been calculated, allowing for the corner detection algorithm to be evaluated in parallel with the displacement calculations. In a detection and decision tree, tables for the dX, dY and cdH values can be preloaded from software and re-loaded when the cdX and cdY values change. In the figure, incoming pixel data is buffered 5201. The data is delivered as five rows of pixel data, corresponding to the size of neighborhood selected. The data goes both to a delay buffer 5211 and an edge convolution calculator 5212. The results of the convolution are used to calculate dX, dY and cdH 5222, drawing some data from a table 5221. The convolution results also are used to determine whether a corner, a 45-degree edge or other edge have been detected 5223. The delay buffer 5211 causes the 5 rows of pixel data and the calculated values 5222 to be combined for calculation of corner displacement 5231, 45-degree edge displacement 5232 and other edge displacement 5233 in parallel processes. A mux 5241 or other logical selection device uses the detection results 5223 to select one or none of the calculated displacements to apply.

Results of Edge Displacement

Tests were performed applying edge displacement algorithms with and without corner detection. The test patterns were varied. The LR or lower right edges of a square pattern resembled a square with the lower right corner sliced off at a 45 degree angle, leaving a five-sided figure. The SQ or square pattern included a series of squares with origins shifted half a pixel along x- and y-axes. The SQRot or rotated square pattern uses the same squares as the SQ pattern, shifted only in x and rotated in y, between 0 and 90 degrees. The PlusRot pattern is a series of plus signs treated as SQRot, with x shifts and rotations. This pattern introduces inside corners to a set of patterns that otherwise have only outside corners. The parameters cdX and cdY were varied for each test pattern and the range of errors was characterized, in terms of a difference in number of shaded sub-pixels from ideal.

Without corner detection, the three edge displacement algorithms were tested against the patterns described above, with various results. For the LR-files, the statistics shown below were derived using only for those rows through the test patterns that contain no corners. Thus, these results show the algorithm behavior of pure edges. (The rows included are 27+i+j*32, where i,j=0, 1, 2 . . . ).

| CD_X,Y | Minimum | Maximum | Number of Diff | Average | Average of absolute | Root-mean-square |
|---|---|---|---|---|---|---|
| +16+16 | −4 | 3 | 2480 | −0.80 | 1.42 | 1.59 |
| +32+32 | −6 | 3 | 2528 | −0.76 | 1.54 | 1.76 |
| +64+64 | −6 | 4 | 2384 | −0.85 | 1.64 | 1.90 |
| +128+128 | −7 | 6 | 2264 | −0.77 | 1.97 | 2.37 |
| −16−16 | −3 | 3 | 2376 | −0.12 | 1.25 | 1.34 |
| −32−32 | −4 | 4 | 2136 | −0.14 | 1.40 | 1.56 |
| −64−64 | −4 | 4 | 1768 | −0.27 | 1.52 | 1.73 |
| −128−128 | −7 | 6 | 1808 | −0.14 | 2.00 | 2.44 |
| +32+96 | −5 | 3 | 2440 | −1.01 | 1.62 | 1.85 |
| +32+96 | −7 | 6 | 2392 | −0.78 | 1.88 | 2.34 |
| −32−96 | −4 | 3 | 1816 | 0.04 | 1.53 | 1.69 |
| −96−32 | −7 | 6 | 2000 | −0.25 | 1.88 | 2.29 |

For the SQ pattern, the following results were reached. Since the edges in SQ are 0 or 90 degrees, the edge angles do not contribute to the number of differing pixels from the ideal image. Therefore, the averages in this data set represent the errors at corners.

| CD_X,Y | Minimum | Maximum | Number of Diff | Average | Average of absolute | Root-mean-square |
|---|---|---|---|---|---|---|
| +16+16 | −29 | 0 | 3418 | −3.58 | 3.58 | 5.56 |
| +32+32 | −35 | 0 | 3708 | −5.99 | 5.99 | 9.27 |
| +64+64 | −42 | 0 | 4396 | −10.15 | 10.15 | 15.67 |
| +128+128 | −59 | 0 | 5872 | −15.02 | 15.02 | 21.67 |
| +32+96 | −46 | 2 | 4306 | −9.29 | 9.30 | 13.91 |
| +96+32 | −46 | 2 | 4330 | −9.03 | 9.03 | 13.55 |
| −16−16 | −5 | 14 | 2172 | −0.42 | 1.69 | 2.15 |
| −32−32 | −8 | 24 | 2084 | −0.76 | 2.37 | 3.36 |
| −64−64 | −9 | 32 | 1736 | −1.24 | 2.78 | 4.69 |
| −128−128 | −6 | 32 | 796 | 2.12 | 4.58 | 7.60 |
| −32−96 | −11 | 32 | 1604 | −0.61 | 2.96 | 5.39 |
| −96−32 | −11 | 32 | 1604 | −0.62 | 2.98 | 5.40 |

The test of the SQRot pattern needed to be repeated, because the original data set contained errors for non-isotropic ED. The data below comes from corrected images. Since the edges are not 0 or 90 degrees, errors in detecting edge orientation contribute to the number of differing pixels. Therefore, the averages are not representative of corner errors.

| CD_X,Y | Minimum | Maximum | Number of Diff | Average | Average of absolute | Root-mean-square |
|---|---|---|---|---|---|---|
| +16+16 | −26 | 14 | 23971 | −1.50 | 1.89 | 2.52 |
| +32+32 | −34 | 4 | 25265 | −1.85 | 2.29 | 3.61 |
| +64+64 | −52 | 4 | 25316 | −2.76 | 3.22 | 5.98 |
| +128+128 | −59 | 6 | 26286 | −4.22 | 4.76 | 9.31 |
| +32+96 | −52 | 21 | 24888 | −2.90 | 3.40 | 6.87 |

-continued

| CD_X,Y | Minimum | Maximum | Number of Diff | Average | Average of absolute | Root-mean-square |
|---|---|---|---|---|---|---|
| +96+32 | −49 | 10 | 25347 | −2.77 | 3.26 | 6.59 |
| −16−16 | −23 | 15 | 19867 | −0.31 | 1.30 | 1.49 |
| −32−32 | −48 | 25 | 18432 | −0.25 | 1.53 | 2.08 |
| −64−64 | −40 | 33 | 16749 | −0.19 | 1.75 | 2.55 |
| −128−128 | −34 | 36 | 16501 | 0.23 | 2.21 | 3.14 |
| −32−96 | −25 | 39 | 18186 | −0.09 | 1.87 | 2.93 |
| −96−32 | −51 | 35 | 18025 | −0.09 | 1.86 | 2.93 |

The test of the PlusRot pattern needed to be repeated, as did the SQRot pattern, because the original data set contained errors for non-isotropic ED. The data below comes from corrected images. Since the edges are not 0 or 90 degrees, errors in detecting edge orientation contribute to the number of differing pixels. Therefore, the averages are not representative of corner errors.

| CD_X,Y | Minimum | Maximum | Number of Diff | Average | Average of absolute | Root-mean-square |
|---|---|---|---|---|---|---|
| +16+16 | −40 | 20 | 24909 | −1.83 | 2.29 | 3.18 |
| +32+32 | −44 | 20 | 25956 | −2.56 | 3.06 | 4.75 |
| +64+64 | −56 | 11 | 25974 | −4.13 | 4.61 | 8.00 |
| +128+128 | −60 | 9 | 27473 | −7.07 | 7.53 | 13.02 |
| +32+96 | −51 | 25 | 26481 | −4.56 | 5.12 | 9.60 |
| +96+32 | −52 | 10 | 26549 | −4.24 | 4.81 | 8.94 |
| −16−16 | −38 | 33 | 21821 | 0.28 | 1.69 | 2.29 |
| −32−32 | −31 | 25 | 20642 | 0.75 | 2.33 | 3.63 |
| −64−64 | −45 | 43 | 19022 | 1.88 | 3.49 | 6.46 |
| −128−128 | −34 | 57 | 19093 | 4.29 | 5.76 | 10.48 |
| −32−96 | −32 | 49 | 19849 | 2.20 | 3.88 | 7.46 |
| −96−32 | −54 | 50 | 19703 | 2.24 | 3.95 | 7.49 |

With the corner detection described above (not the alternate SUSAN approach) tests showed some improvement. For the LR-files the statistics shown below are based on only for those rows that contain no corners. Thus, the statistics reflect the behavior of pure edges. (The rows included are 27+i+j*32, where i,j=0, 1, 2 . . . ).

| CD_X,Y | Minimum | Maximum | Number of Diff | Average | Average of absolute | Root-mean-square |
|---|---|---|---|---|---|---|
| +16+16 | −4 | 3 | 2112 | −0.68 | 1.31 | 1.44 |
| +32+32 | −6 | 3 | 2112 | −0.63 | 1.35 | 1.53 |
| +64+64 | −5 | 4 | 2136 | −0.63 | 1.49 | 1.71 |
| +128+128 | −6 | 5 | 1960 | −0.57 | 1.51 | 1.76 |
| −16−16 | −3 | 2 | 1920 | 0.02 | 1.16 | 1.22 |
| −32−32 | −4 | 4 | 1752 | −0.01 | 1.25 | 1.38 |
| −64−64 | −4 | 4 | 1624 | −0.14 | 1.50 | 1.70 |
| −128−128 | −6 | 4 | 1712 | 0.18 | 1.70 | 1.98 |
| +32+96 | −4 | 2 | 2056 | −0.97 | 1.38 | 1.51 |
| +32+96 | −7 | 6 | 2112 | −0.66 | 1.55 | 1.86 |
| −32−96 | −3 | 3 | 1544 | 0.32 | 1.36 | 1.49 |
| −96−32 | −6 | 5 | 1864 | −0.06 | 1.59 | 1.87 |

For the SQ pattern, the edges in SQ are 0 or 90 degrees, so edge angle does do not contribute to the number of differing pixels. Therefore, the averages represent the errors at corners, with corner detection applied.

| CD_X,Y | Minimum | Maximum | Number of Diff | Average | Average of absolute | Root-mean-square |
|---|---|---|---|---|---|---|
| +16+16 | −21 | 0 | 3474 | −3.87 | 3.87 | 5.28 |
| +32+32 | −26 | 0 | 3916 | −6.16 | 6.16 | 8.68 |
| +64+64 | −39 | 0 | 4828 | −9.59 | 9.59 | 14.06 |
| +128+128 | −57 | 0 | 5748 | −14.37 | 14.37 | 20.55 |
| +32+96 | −46 | 0 | 4684 | −8.50 | 8.50 | 12.54 |
| +96+32 | −46 | 0 | 4748 | −8.26 | 8.26 | 12.16 |
| −16−16 | −2 | 5 | 1202 | 1.47 | 1.85 | 2.10 |
| −32−32 | −3 | 9 | 1228 | 2.64 | 3.18 | 3.80 |
| −64−64 | −2 | 9 | 1288 | 2.97 | 3.64 | 4.24 |
| −128−128 | −1 | 0 | 252 | −1.00 | 1.00 | 1.00 |
| −32−96 | −4 | 12 | 1218 | 2.30 | 3.19 | 4.07 |
| −96−32 | −4 | 12 | 1222 | 2.49 | 3.39 | 4.26 |

The results for the SQRot pattern, with corner detection, were:

| CD_X,Y | Minimum | Maximum | Number of Diff | Average | Average of absolute | Root-mean-square |
|---|---|---|---|---|---|---|
| +16+16 | −24 | 14 | 22797 | −1.62 | 1.96 | 2.71 |
| +32+32 | −34 | 6 | 24128 | −2.03 | 2.40 | 3.90 |
| +64+64 | −52 | 4 | 24768 | −2.94 | 3.34 | 6.08 |
| +128+128 | −57 | 6 | 24807 | −4.04 | 4.42 | 8.96 |
| +32+96 | −52 | 7 | 24237 | −3.02 | 3.36 | 6.87 |
| +96+32 | −49 | 6 | 24676 | −2.99 | 3.30 | 6.65 |
| −16−16 | −23 | 9 | 16820 | −0.15 | 1.28 | 1.47 |
| −32−32 | −41 | 11 | 15835 | −0.08 | 1.50 | 2.02 |
| −64−64 | −30 | 11 | 15774 | −0.20 | 1.85 | 2.50 |
| −128−128 | −40 | 14 | 16095 | −0.73 | 2.46 | 4.40 |
| −32−96 | −25 | 12 | 17184 | −0.02 | 1.72 | 2.26 |
| −96−32 | −44 | 16 | 17125 | −0.02 | 1.79 | 2.58 |

The results for the PlusRot pattern, with corner detection, were:

| CD_X,Y | Minimum | Maximum | Number of Diff | Average | Average of absolute | Root-mean-square |
|---|---|---|---|---|---|---|
| +16+16 | −42 | 20 | 25472 | −1.73 | 2.63 | 3.57 |
| +32+32 | −44 | 19 | 26769 | −2.42 | 3.68 | 5.53 |
| +64+64 | −56 | 26 | 27733 | −3.73 | 5.26 | 8.47 |
| +128+128 | −60 | 30 | 26449 | −6.23 | 7.22 | 12.60 |
| +32+96 | −51 | 19 | 27881 | −4.12 | 5.25 | 9.37 |
| +96+32 | −52 | 18 | 28193 | −3.92 | 5.05 | 8.86 |
| −16−16 | −37 | 31 | 19209 | 0.73 | 1.83 | 2.55 |
| −32−32 | −25 | 25 | 18648 | 1.40 | 2.62 | 4.10 |
| −64−64 | −41 | 45 | 19277 | 2.01 | 3.83 | 6.52 |
| −128−128 | −38 | 55 | 18717 | 2.36 | 6.13 | 10.74 |
| −32−96 | −32 | 49 | 20100 | 2.13 | 3.77 | 7.03 |
| −96−32 | −45 | 50 | 20133 | 2.14 | 3.81 | 6.87 |

Figure 20:
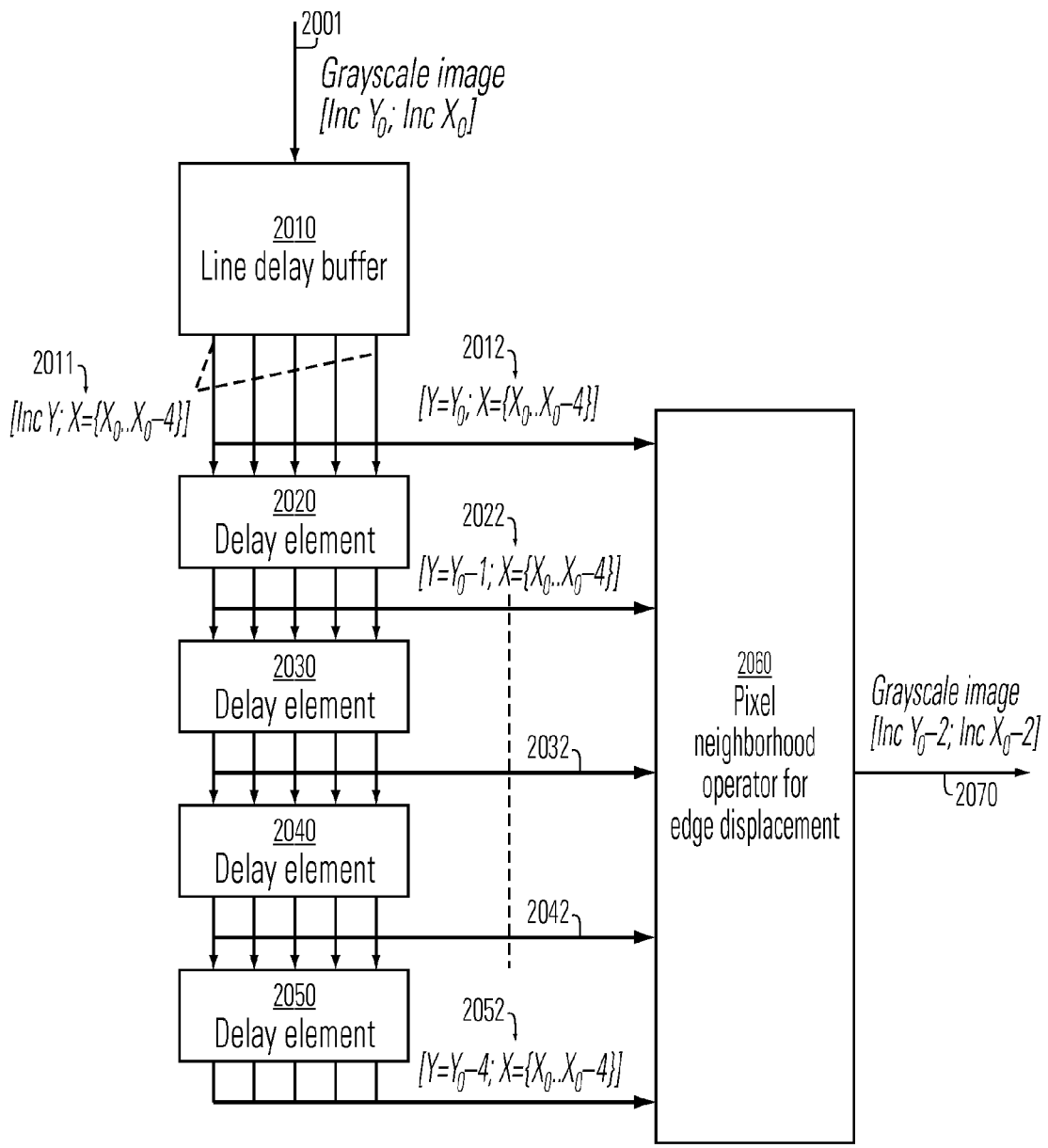
FIG. 20 is a hardware block diagram for logic elements that can be used to implement edge displacement in a neighborhood size up to 5×5 gray valued pixels.

One hardware implementation of edge displacement is illustrated in FIG. 20 and discussed below.

Hardware Implementation

FIG. 20 describes a pixel line delay buffer, comprising for example FIFOs and pixel delay operators on a 5×5 neighborhood. Alternate embodiments will benefit from using symmetry in the convolution kernel to reduce the number of delay elements, in keeping with conventional image processing algorithms. Pixel data is input on line 2001. Delay elements 2010, 2020, 2030, 2040 and 2050 control the propagation of data along lines 2011, 2012, 2022, 2032, 2042 and 2052 to the pixel neighborhood operator for edge displacement 2060.

The modified or displaced pixel neighborhood is calculated and output 2070. The adjustment processor performs gray scaled edge displacement on a pixel neighborhood received in an output data stream from the rendering processor. In one embodiment, the neighborhood size for edge displacement is 5×5 grayscale pixels, but the neighborhood size is an implementation detail, not a limitation on application of methods practicing aspects of the present invention. The implementation of edge displacement favors parallelism to accommodate the parallel pixel input and output data streams (2 or 4 pixels per cycle). The notation [Inc $Y_0$–2; Inc $X_0$–2] used for the output data image means that there is a two pixel line delay and a two pixel delay.

Illumination Compensation

Figure 21:
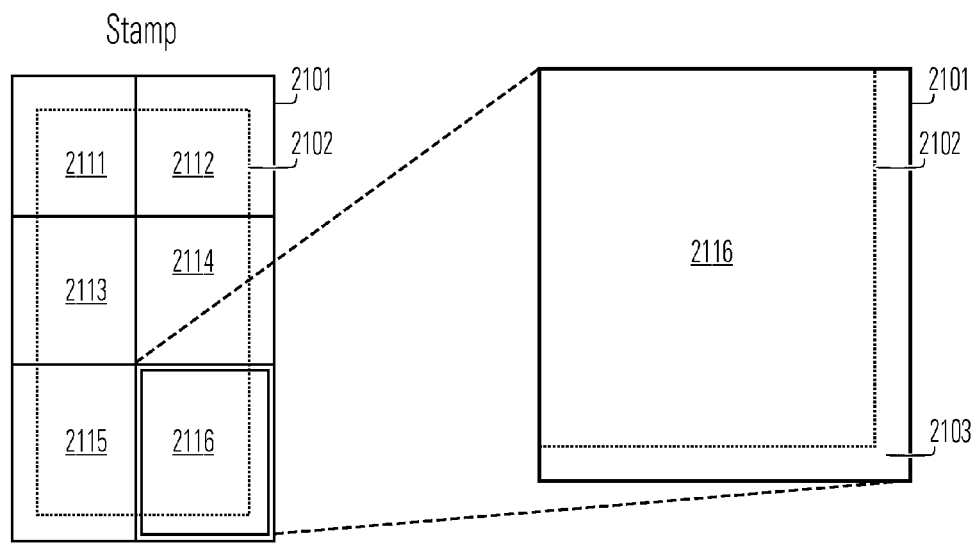
FIG. 21 depicts six modulator or rendering windows overlapping a stamp.

FIG. 21 depicts so-called stamp overlap. Rendering or modulator windows may cover portions of one or more stamps. For instance, stamp 2101 is covered by six modulator windows 2111-16. In a single pass, stamps overlap near their edges 2102. The overlap zone 2103 is the region of overlap. Overlap analysis also can be applied to scanned radiation image projectors, where areas of the reticle are printed and then overlapped with subsequently printed areas of the reticle. The overlap pattern for a scanning system may include an overlap zone on all sides of a scanned strip or only on two sides, if the reticle is scanned from one edge to the opposite edge.

Overlap Zones for Overlap and Energy Variation Compensations

Figure 22:
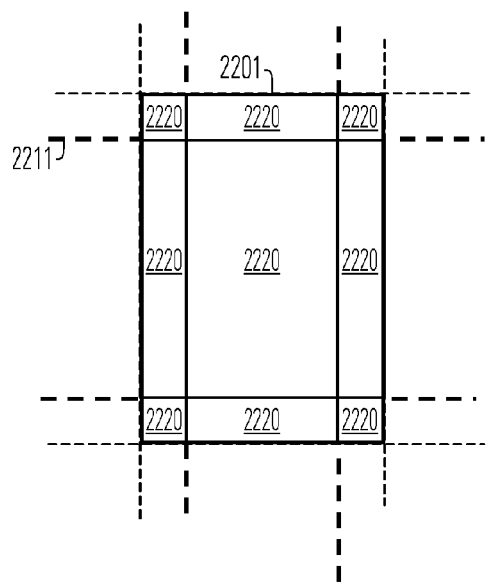
FIG. 22 depicts a stamp and nine overlap subzones.
Figure 23A:
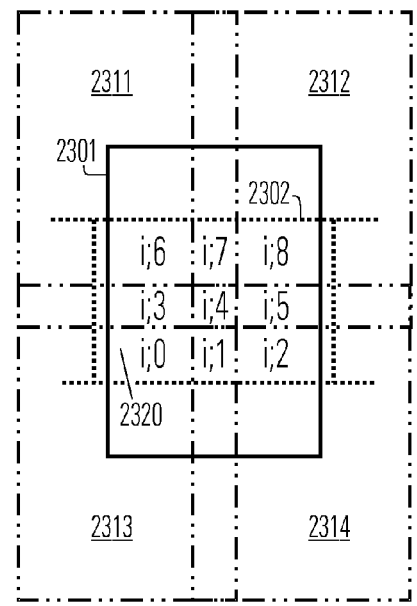
FIG. 23A extends the subzone concept to printing in multiple passes.
Figure 23B:
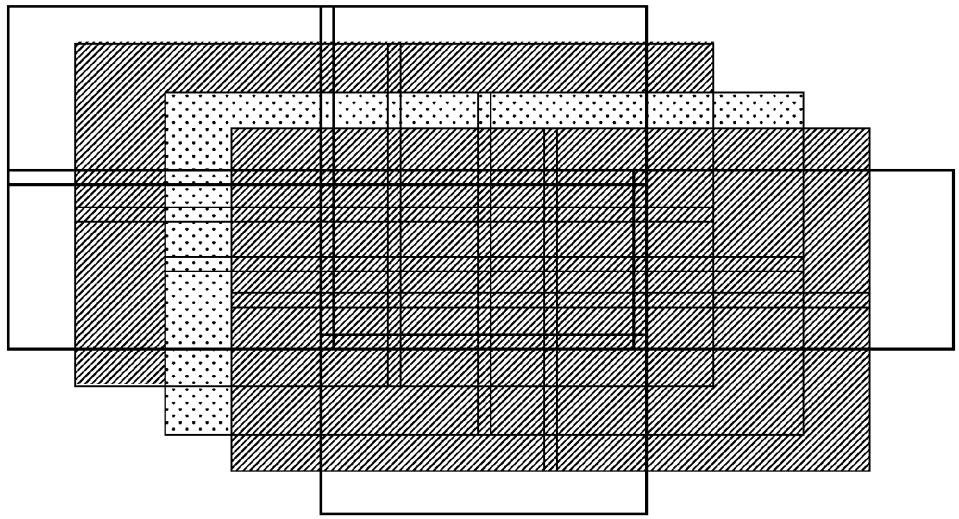
FIG. 23B illustrates 81 overlap subzones resulting from four exposure passes.

FIG. 22 depicts the overlap subzones of a micromirror stamp in a single pass environment. The stamp 2201 has nine overlap subzones 2220, resulting from overlap with eight adjacent stamps 2211, the stamp 2201 being in the middle of a 3×3 grid of stamps. The center subzone does not overlap with the adjacent stamps. Projecting outward from the center subzone to the edges of the rendering zone, along the arms of a "+" pattern, there are four subzones of single overlap with adjacent stamp exposures. In each of the four corners of the rendering zone, there are subzones of multiple overlap with adjacent exposures. For a rectangular rendering zone surrounded by exposures of other rendering subzones, each of the corner multiple overlap subzones may be exposed four times. This nine subzone configuration can be adapted to multiple exposures. Four staggered exposures may result in 81 subzones of a rendering zone, as shown in FIG. 23B. The same subzone classifications can readily be applied to other shapes of rendering and guard zones, for instance hexagonal or alternating triangle rendering and guard zones. Illumination compensation is a method for compensating for overlap between areas exposed in multiple passes. This method applies with variations to both micromirror and scanned radiation beam systems. Multiple passes multiply the number of illumination zones within the corners of a single stamp. In FIG. 23A, two passes of stamps are illustrated, the current pass 2301 and overlapping stamps 2311-14 from another pass. Area codes 2320-26 are among the many overlap subzones created by multiple pass exposure. One multi-pass pattern consists of four (shifted) layers. Each layer is made up of overlapping SLM images, as in the FIG. 23B. The innermost square shows the geometry of the normal "stamp". Each such stamp has 81 areas, each of which being the result of 4 to 7 different exposure pulses. The purpose of the area code algorithm is to reduce the final dose variation to (almost) one quarter of the variation in pulse energy, as well as providing dose compensation for stitching in the overlapping regions. In the stitching regions we have the choice to either use interpolating functions (in the form of ramps) or constant values over the entire stitching region.

Figure 24A:
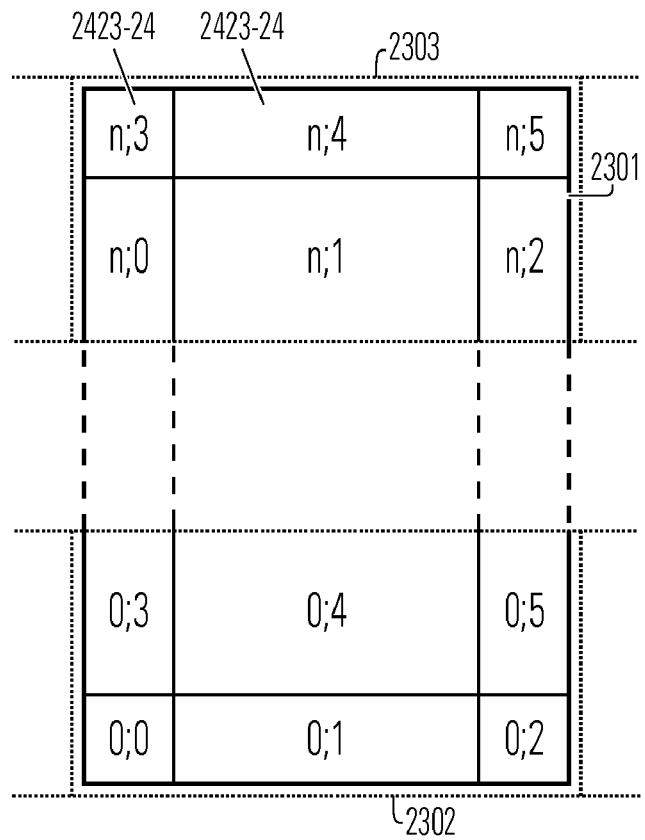
FIGS. 24A-B illustrate overlap subzones within rendering or modulator windows of a stamp, and a radiation dose profile corresponding to some of the overlap subzones.
Figure 24B:
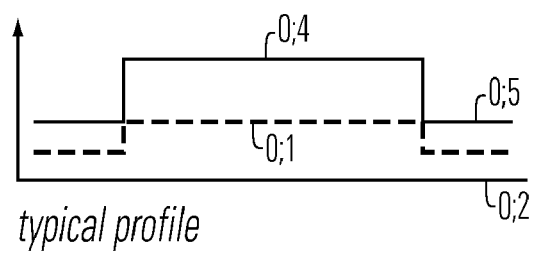

One use of overlap zones is to keep track of theoretical exposures that would result from nominal exposure pulses. FIGS. 24A-B illustrate an illumination dosing profile for various illumination regions of the stamp 2301. In this example, the stamp is covered by n modulator windows 2302, each of which is as wide as the stamp. Each modulator window is assigned six illumination subzones. The center subzones that do not overlap with other exposures in a single pass have a relatively high dose profile, as indicated for subzone 0;4 in FIG. 24B. The single overlap subzones, such as 0;1 and 0;5, have a medium dose profile. The multiple overlap subzones such as 0;2, have a low dosage profile.

Another use of overlap zones is to keep track of variations in flash intensity. The exposure pulses give an non-deterministic variation or spread in energy. The spread, relative to the nominal energy, is denoted energy spread. This is particularly apt for excimer pulse lasers and other sources that may have a significant pulse to pulse variation in energy output. It also can be applied to scanned radiation, if the energy delivered by the radiation beam varies over time, for instance, as the radiation source warms up. Illumination zones can combine information about ideal exposures from overlapping radiation with information about actual exposure energies produced during exposure of a particular work piece. Energy spread compensation is a process of compensating the energy spread by adjusting the SLM modulation values in subsequent exposure passes. The compensation is done on the illumination value in the modulation adjustment process. The compensation value, related to the nominal modulation is the so-called energy spread compensation factor (ESCF). An ESCF table is a table representing the ESCF codes for one specific modulator window, with one ESCF code for each area code. An ECT array is a set of ESCF tables containing one table for every modulator window of an entire substrip or strip. Energy spread compensation calculation is the process of generating the ESCF table arrays. This process may be performed in a Mercury computer cluster or other host for the fracturing process, as described below, or in an offline process simulating the Mercury computer cluster implementation.

Figure 31:
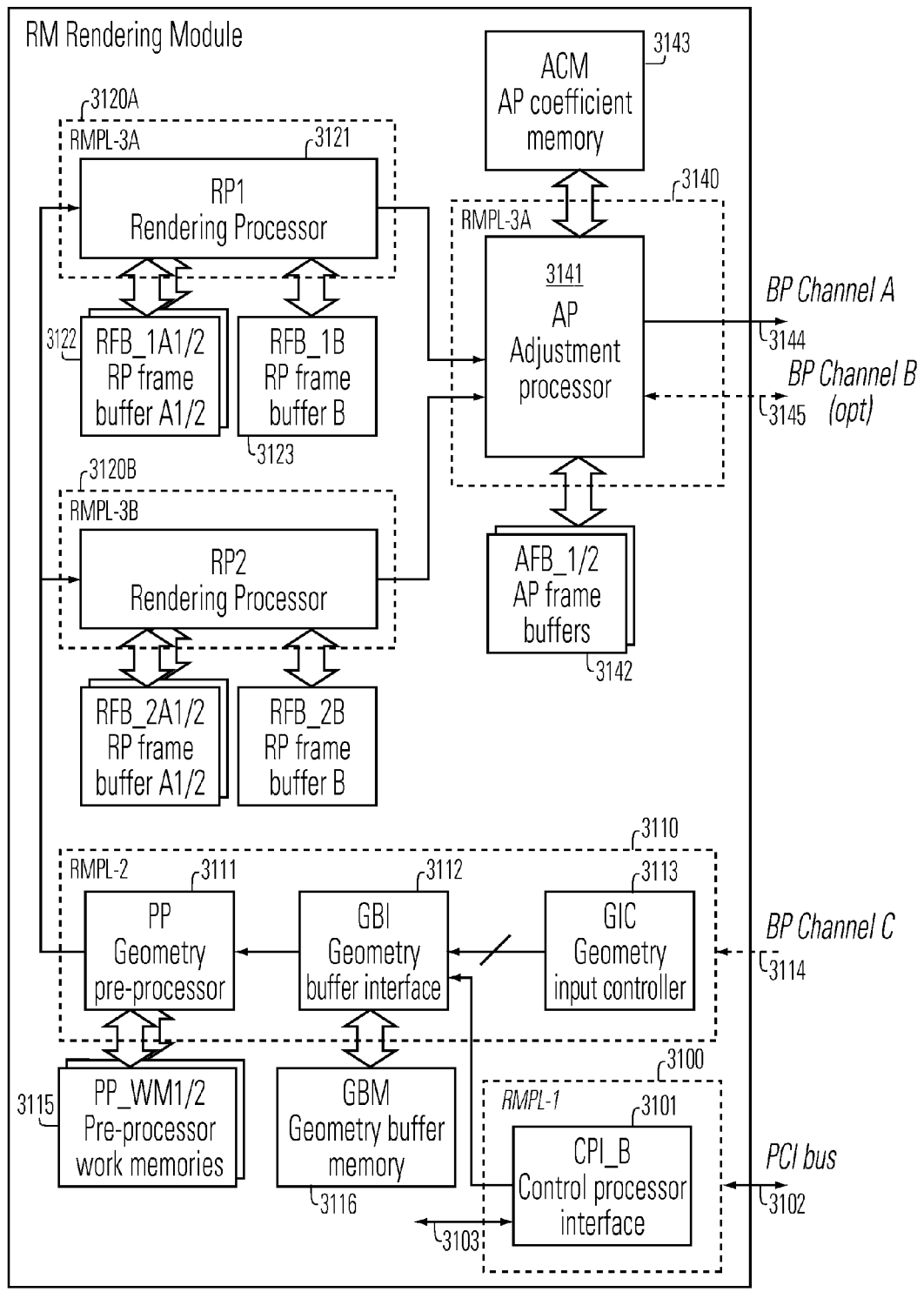
FIG. 31 is a hardware block diagram of a rendering module.

The energy spread compensation takes place in the illumination conversion process of the adjustment processor block of the overall rasterizing engine (RASE) (3141 in FIG. 31.) For each modulator window in the stamp, there is a set of area codes, each area code representing a segment of the window. For every flash pulse in a strip, the stamp illumination values are compensated with an energy spread compensation factor, individual for each area code and for each pulse. In addition, all of the areas in a stamp may be compensated by an additional factor by loading a different set of factors for the areas in the stamp. This may be desirable when compensating for resist and other systematic factors, such as corner baking, activation and aging effects. The factor may be given a binary 2 complement fix point coding in the following way:

$$f=(F+512)/512$$

where F is the binary ESCF value (−128 . . . +127) and f is the relative compensation factor (0.7500 . . . 1.2481). An F value of 0 represents 100%, which means 'no compensation'.

Again, a set of ESCF representing the area codes for a specific flash pulse is called an ESCF table (ECT). An ESCF table may contain a one-byte entry for each position, oriented in 32-bit double words. The length of an ESCF may be fixed at 128, regardless of the number of utilized area codes.

|  | bit 31 ... 24 | bit 23 ... 16 | bit 15 ... 8 | bit 7 ... 0 |
|---|---|---|---|---|
| dword 0 | ESCF for AC 1 | ESCF for AC 2 | ESCF for AC 3 | ESCF for AC 4 |
| dword 1 | ESCF for AC 5 | ESCF for AC 6 | ESCF for AC 7 | ESCF for AC 8 |
|  | ... | ... | ... | ... |
| dword 31 | ESCF for AC 125 | ESCF for AC 126 | ESCF for AC 127 | ESCF for AC 128 |

Figure 23C:
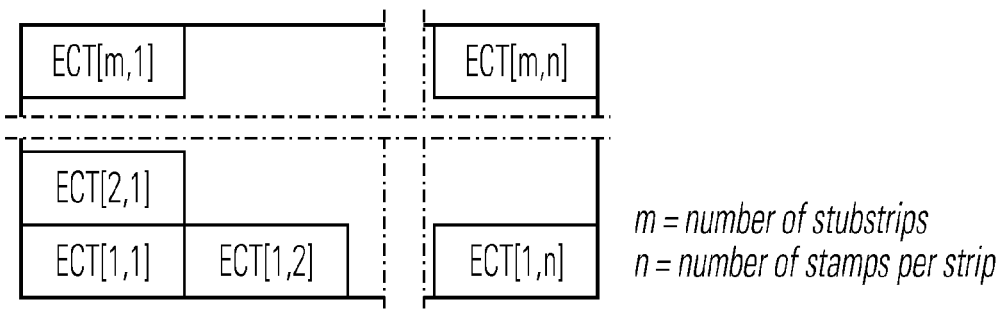
FIGS. 23C-D are block diagram depicting relationships between stamps, strips, and sub strips.
Figure 23D:

For each strip to be written, an array of ECTs is required (one for each laser pulse and each modulator window) called an ECT strip array. The array is portioned in substrips, as shown in FIG. 23C. The process of generating the ECT strip arrays is segmented into substrips, so for each GLI channel (corresponding to one substrip) a ECT substrip array is generated as a separate structure in the Fracturing Engine computer cluster, as shown in FIG. 23D. When the ECT strip array is represented in a data file, such as when it is generated off line, substrips are sequenced in the file 1,1 to 1,n, then 2,1 to 2, n, etc.

Returning to FIG. 23A, for each area code in a specific modulator window, there is a set of energy measurement source references. In the figure, stamp 2301 is the exposure area of the present stamp. Stamps 2311-14 are four overlapping stamps of the previous pass. Modulator window 2302 is outlined in dotted lines. Within the modulator window (i) are various area codes (i; 0 through i; 8 in this example, 2320-2328). Because this is a two pass example, there are nine area codes within the modulator window.

In one embodiment, each energy measurement source reference is represented as a record in a parameter file with two pointers and a weight factor. The pointers point out the source measurement value or values, and the weight factor represents the impact from the individual measurements in overlap zones, were multiple flashes impact the exposure.

The ESCF is calculated from the following expression:

$$ESCF = \frac{1}{\sum_{j=1}^{j=m}(E(x+dx_j; y+dy_j) \cdot w_j)}$$

where x is the stamp number, y is the strip number, $w_j$ is the energy weight factor, $dx_j$ and $dy_j$ is the relative stamp coordinates and m is the number of source references for the area code. The variables $dx_j$ and $dy_j$ have values in the range of (−1 ... +1), derived from the portioning of area codes that follows from the multi-pass exposure stamp position offset. The $w_j$ variable has a fixed point representation with an integer interval of [0 ... 32768], where 0 means a 0% contribution and 32768 means a 100% contribution. The E values are also fixed point representation values, with range [0 ... 32768] where 32768 means a nominal energy (100%) and values>32768 means.

In the example below, a complete set of source references for a stamp is given. The scan order is first increasing X, then increasing Y. In the overlap zones, the first exposed stamp has a weight of 0.55 and the second a weight of 0.45. The same weighting applies for both vertical and horizontal overlaps. When four stamps overlap, the weights are (0.275; 0.265; 0.240; 0.220) in the sequential order of exposure. The energy measurements has yielded the following results, which are illustrative of one embodiment:

| E(0; 0) | E(1; 0) | E(0; 1) | E(1; 1) |
|---|---|---|---|
| 0.970 | 1.000 | 1.000 | 1.030 |

| Area code | Rel. X pointer | Rel. Y pointer | Weight real value | Weight integer value | ESCF real value | ESCF integer value |
|---|---|---|---|---|---|---|
| (I; 0) | 0 | 0 | 1.000 | 32768 | 1.031 | +16 |
| (I; 1) | 0 | 0 | 0.550 | 19661 | 1.017 | +9 |
|  | +1 | 0 | 0.450 | 18022 |  |  |
| (I; 2) | +1 | 0 | 1.000 | 32768 | 1.000 | 0 |
| (I; 3) | 0 | 0 | 0.550 | 19661 | 1.017 | +9 |
|  | 0 | +1 | 0.450 | 18022 |  |  |
| (I; 4) | 0 | 0 | 0.275 | 13107 | 1.002 | +1 |
|  | 1 | 0 | 0.265 | 9830 |  |  |
|  | 0 | 1 | 0.240 | 8847 |  |  |
|  | 1 | 1 | 0.220 | 8192 |  |  |
| (I; 5) | +1 | 0 | 0.600 | 19661 | 0.987 | −7 |
|  | +1 | +1 | 0.400 | 18022 |  |  |
| (I; 6) | 0 | 1 | 1.000 | 32768 | 1.000 | 0 |
| (I; 7) | 0 | 1 | 0.550 | 19661 | 0.987 | −7 |
|  | +1 | 1 | 0.450 | 18022 |  |  |
| (I; 8) | 1 | 1 | 1.000 | 32768 | 0.971 | −15 |

Overlap zones further can take into account the non-linear relationship between illumination or exposure and edge position, which can be seen from FIG. 1, in both ideal and actual exposures.

A theoretical limit for the correction for exposing energy variation obtained by a multi-pass exposure compensation approach is as follows. Assume that the exposing radiation is generated four times with a maximum energy within its error specification. If n denotes how many times the exposure has taken place on the same spot, then we can write the following recursion for the energy after n times, $E_n = (n - E_{n-1})(1+\delta) + E_{n-1}$, $E_0 = 0$;

The explanation of the above expression is as follows. Knowing the summed energy after n−1 flashes, $E_{n-1}$ we set the area code (AC) compensation factor to $(n-E_{n-1})$, in order to obtain the total doze, n, (normalized doze) after n laser flashes. Since we only control the laser to the accuracy $(1+\delta)$, the resulting doze will be given by the previously given (recursive) expression.

We summarize this recursion formula in the following table:

| Laser Pulse Energy Accuracy | 4 * ($E_n$ − 4) |
|---|---|
| 10% | 11.1% |
| 5% | 5.26% |
| 2% | 2.04% |
| 1% | 1.01% |

The factor 4 in the last column was included to highlight the fact that the improvement using 4-pass writing is almost 4 times, but not quite. The expression used here only applies to regions do not overlap other regions in the same layer.

A useful area code compensation factor can be calculated as follows. The notation in the following is a follows:
- a=Area Code. Range (0,0) to (8,8)
- l=layer. Range 1 . . . 4
- s=stamp code. Range (0,0) . . . (N,M), where N×M*4≈$10^7$
- ρ=exposure compensation factor (depends on area code), range 0.25–1 (depending of the pulse energy stability of the laser)
- E(l,s)=the recorded laser pulse energy for stamp s and layer l.

In the same fashion as in the previous section, we derive the exposure compensation factor as follows. For each area (or area code), the sum of the total laser pulse energy previously deposited into that area code (including the compensation factor) and K times the compensation factor should equal $lE_0$6. $E_0$ is the nominal laser pulse energy). The factor K is the number of times we will write the area code, a, within a layer and depends on a. Thus, $$K\rho_{a,l,s} + \Sigma \rho_{a',l',s'} E_{l',s'} = lE_0$$

(Note the $E_0$ may be set to unity in some cases). This is, again, a recursive equation that we will have to solve for each stamp. The recursion runs over the stamps (and area codes) that has been written in the current layer and, later, the stamps in the layers below.

Implementation

Figure 25:
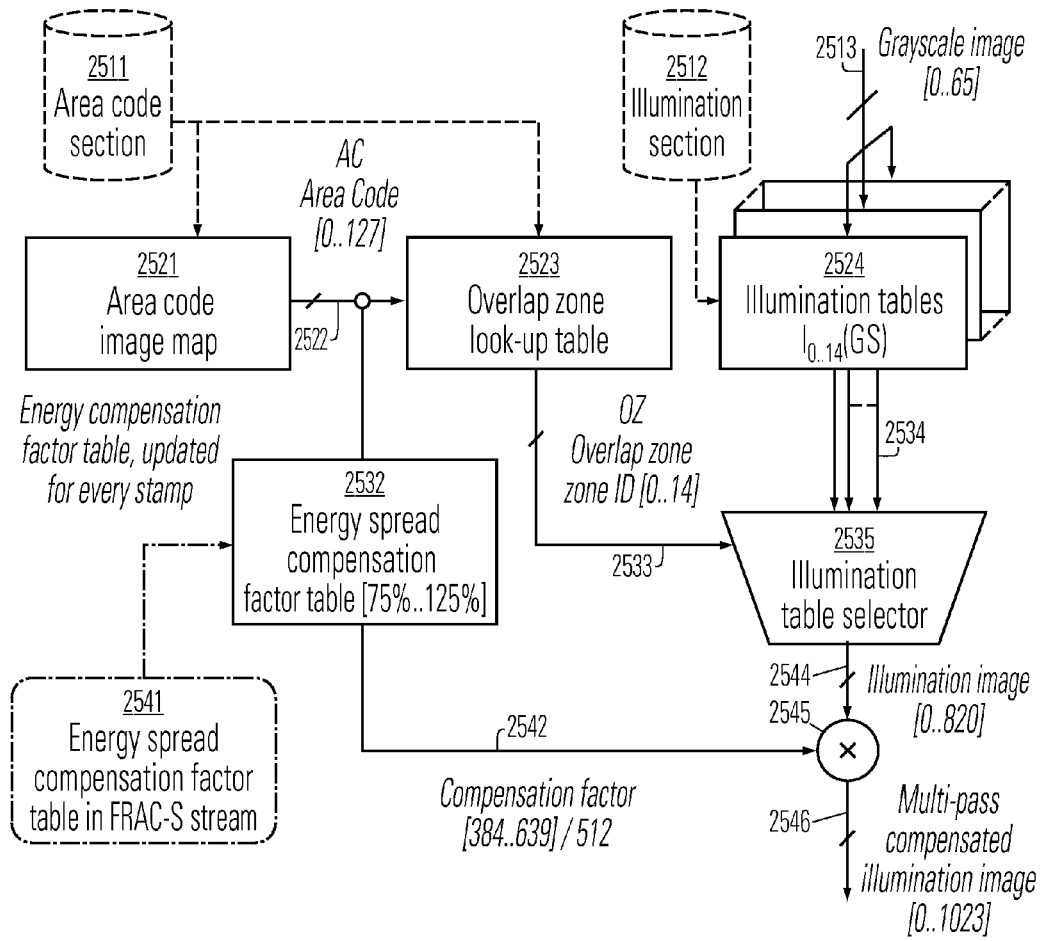
FIG. 25 is a block diagram including application of overlap zone and energy variation processes to calculation of a multi-pass compensated illumination value for a grayscale pixel.

FIG. 25 is a block diagram of one process flow for illumination conversion. This is a full version of illumination conversion; partial implementations also have utility, for instance when only one pass is used, a scanned radiation source is used or the pulse-to-pulse or pass-to-pass variation in exposure energy can be ignored. The task of the illumination conversion mechanism is to produce an image of pixel data with desired illumination calculated from the input grayscale values (representing the virtual grid). The relationship between virtual grid and illumination is non-linear, as can be seen from FIG. 25. The process includes compensation for overlap by altering the grayscale-to-illumination conversion tables. This is used to compensate for non-linear energy accumulation characteristics in the photo resist. The process also accounts for the compensation of illumination necessary to compensate for the spread or variation in flash energy in previous passes of a multi-pass exposure.

The area code section database 2511 includes both one or more area code image maps and an overlap zone look-up table. An area code map contains entries for the pixels in a modulator or rendering window. The entries define area codes. In one embodiment, the area codes range from 0 . . . 127. In a single pass embodiment, as few as 9 area codes might be used. The number of area codes is properly adapted to the number of illumination subzones resulting from all exposure passes, overlap patterns and special cases. Handling of area code maps may take into account special cases, such as modulator windows at ends of a rendering window, as opposed to modulator windows in the middle of a rendering window, modulator windows that span rendering windows and modulator windows for stamps applied at the edge of a work piece. Different area code image maps may be employed to handle different cases or different indexes may be used to address rows or columns of a comprehensive area code map. Resist issues including surface bake characteristics, resist activation and resist aging may result in specially adapted area code image maps. However an area code image map is stored, an area code can be looked up for a particular pixel or larger region of a modulator or rendering window.

An area code 2522 may serve as an index to an overlap zone look-up table 2523. For area codes having a range of 0 . . . 127, an overlap zone look-up table would have 128 entries. Entries in an overlap zone look-up table may be overlap zone Ids (OZ Ids) having a range such as 0 . . . 14 (2533). A wider or narrower range of OZ Ids may be used, depending on the desired number of illumination tables 2524. The OZ Ids are used to drive an illumination table selector 2535. Alternatively, the area code image map could be loaded directly with OZ Ids 2533, so that image map entries for pixels in a modulator or rendering window would directly access OZ Ids, without the intermediate step of using area codes 2522 to access a look-up table 2523.

The illumination section database 2512 includes a table for allowable gray scale values and for valid OZ Ids, in this case, 0.64 by 0.14 entries. Data is loaded into illumination tables 2524 for each allowable gray scale value. The data provides a range (e.g., 0 . . . 14) of values for realizing the desired gray scale value, depending on the illumination overlap zone Id. An incoming gray scale value 2513 invokes a particular illumination table 2524, which makes available a range of illumination values 2534. The illumination table selector 2535 uses the OZ Id value 2533 to select an applicable illumination value. The values in the illumination table may take into account non-linearities in dose accumulation from multiple exposures and may take into account non-linearity in illumination levels required to produce radiation dosings that can be represented as equal fractions of a fully bright pixel. Issues of resist surface bake characteristics, resist activation and resist aging can be addressed by having specially adapted illumination tables 2524 stored in the database 2512. A wide range of illumination values 2544 may be used, such as 0 . . . 820, to express the radiation dose required to accomplish a relatively smaller (e.g., 0 . . . 65) range of gray values across a range of exposure overlap conditions.

Another aspect of illumination conversion that may have utility by itself or in combination with overlap conversion is energy variation compensation. A database of energy variation compensation factors 2541 may be accumulated as portions of a work piece are exposed to radiation in multiple passes. Micromirror systems using pulsed excimer laser radiation sources, for instance, may experience pulse-to-pulse variations in energy output. These variations can be monitored and recorded. It may be useful to accumulate energy variation factors in a broad range, such as 75 to 125 percent of ideal, the range being broad enough to capture accumulated variations through multiple passes. For each pulse of a radiation source illuminating a micromirror system, energy variations can be accumulated on a area code by area code basis, within a larger map of stamp locations corresponding to pulses. Then, area codes 2522 from the area code image map 2521 can be used to index an energy variation compensation factor table 2532. A compensation factor, such as 75 to 125 percent (384.639/512) 2542 can be used to compensate for observed variations from ideal energy exposures. This compensation factor 2542 can be multiplied 2545 by the illumination value 2544 to produce a multi-pass compensated illumination value 2546 having a range such as 0 . . . 1023. This energy variation compensation may be particularly useful if radiation doses are scaled from one pass to the next, for instance scaled 80/20 in a two pass printing process or 40/30/20/10 in a four pass process. Multipass scaling has the potential for applying improving the precision of a particular dynamic range by applying the same scale from low to high energy to a smaller maximum dose (e.g., 1024 gradations of an energy dose of 10, instead of an energy dose of 40.)

The illumination function corrects not only for resist non-linearity, but has a fundamentally optical ground in a pattern generator based on partially coherent imaging of an SLM. Theoretical studies has shown that the partial coherence makes the displacement of an edge a non-linear function of the gray-level, and the non-linearity depends on the spatial distribution of light illuminating the SLM, in the simplest case on the so called sigma value of the illumination system. The transfer function from gray value to edge displacement dx is typically a function that lies between g and sqrt(g) where g is the gray level in the range 0.00 to 1.00. The gray level is that obtained for a large area containing many pixels set to the same deflection. When multiple passes (4 or more) are printed the exact shape of the illumination function is less critical and a single function based on the transfer function dx=g**0.75 can be used with good accuracy.

Mirror Compensation Process

The mirror compensation function converts the illumination values calculated in the illumination conversion function to mirror voltage values. The compensation function uses data from the mirror calibration file stored in a compensation coefficient map to calculate a voltage value for the SLM mirrors. The compensation coefficient map contains one entry with four coefficients (C1 ... C4) for every mirror in the modulator window. The compensation coefficients C1 ... C4 each go through a scale/offset mechanism including a binary shift operation with Cn2 and the addition of an offset value Cn1. These scale/offset constants are common to all mirrors in the modulator window and are loaded from mirror table section of the AP parameter file. The output voltage U as a function of the illumination value x is generated from the following equations for mirror driving voltages:

$C_s1 = C11 + C1*2^{C12}$ $C_s2 = \text{round}((C21 + C2*2^{C22})*x/128)$ $C_s3 = \text{round}((C31 + C3*2^{C32})*F3(x))/128)$ $C_s4 = \text{round}((C31 + C3*2^{C42})*F4(x))/128)$ $U(x) = \text{round}(C_s1 + C_s2 + C_s3 + C_s4/128)$ In one embodiment, the parameter ranges for these equations are:

| Parameter | Range |
|---|---|
| C1 ... C4 | 0 ... 255 |
| C11, C21, C31, C41 | −4096 ... 4095 |
| C12, C22, C32, C42 | 0 ... 7 |

The compensation function uses two primitive functions defined by lookup tables. These lookup tables are loaded from the mirror function section 2625 of the AP parameter file 2621. One hardware implementation of these equations is shown in FIG. 27.

Figure 27:
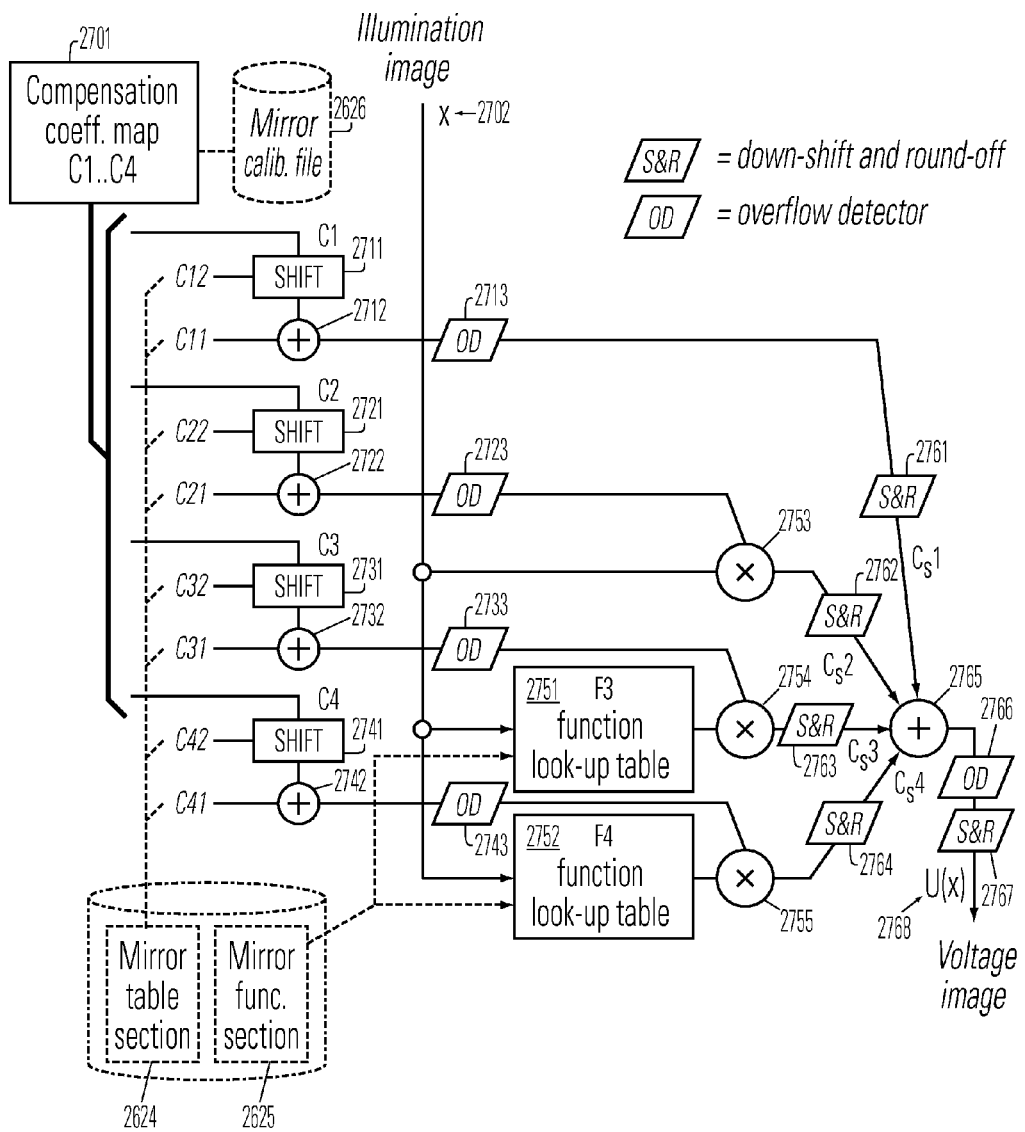
FIG. 27 is a hardware block diagram illustrating application of a mirror transfer function.

The hardware in FIG. 27 is one efficient implementation of the equations above. The coefficients C1 ... C4 are stored in the compensation coefficient map 2701, which may be stored in the mirror calibration file 2626. More than one set of coefficients may be stored for each pixel, to take into account aging of mirrors, time between mirror rest periods, number of mirror cycles between mirror rest periods, or other characteristics of the individual micromirrors that change over time. The desired illumination value (x) 2702 is an input. The calculation block 2711-2713 implements the first equation, $C_s1 = C11 + C1*2^{C12}$. The coefficient C1 is loaded in a shift register 2711. The exponent C12 is used to activate the shift function of register 2711, accomplishing the multiplication and exponentiation relatively quickly. The adder 2712 sums the result of the shift register 2711 and the coefficient C11. The overflow detector 2713 responds to a value out of range. The response may be an error or to set the result to a predetermined value, such as the maximum allowable value for the data path. The calculation blocks 2721-2723, 2731-2733 and 2741-2743 operate similarly to partially calculate $C_s2$, $C_s3$ and $C_s4$. Calculating these values requires multiplication of the block results times the desired illumination value (x), times F3(x) and times F4(x), respectively. The multipliers 2753-2755 accomplish these multiplications. The down-shift and round-off logic 2761-2764 scales the results to the desired range, having preserved the precision of calculations in initial stages of calculation. The logic 2761-2764 also implements division by 128, which can be implemented as a shift register operation. The adder 2765 combines the results $C_s1$, $C_s2$, $C_s3$ and $C_s4$. Overflow detector 2766 checks the result, similar to 2713, and down-shift and round-off logic 2768 scales, rounds and divides by 128, as appropriate to produce U(x) in the desired dynamic range. Depending on the functions used for mirror compensation and the type of processor used, different hardware logic will produce results equivalent to the hardware logic in FIG. 27, always transforming a desired illumination value into a desired modulation or voltage driver, using pre-stored coefficients and functions and digital logic, to produce a digital value that drives a modulator or micromirror.

The goal of the calibration procedure is: given M (where M may be $10^6$) mirrors, find a reflectance range common to all mirrors and a finite (small) set of functions (two or three is preferred, for convenient storage) which can be used in the compensation routines for all the mirrors. That is, given the reflectance as a function of voltage for each mirror, find the maximum and the minimum (common) reflectance attainable by all mirrors. Between those values, the inverse, i.e., voltage as a function of reflectance, is well defined for all mirrors. Find approximate expressions for those inverses using 32 bits of storage for each mirror, in addition to a small set of static functions that can be stored in tables. For the micromirrors in the array to have common white and dark level (at least as seen by the CCD), the dynamic reflectance range for the whole array will be limited by levels attainable by all mirrors, which may be half or less of the dynamic range of most of the mirrors. Depending on the required on dynamic range, some mirrors that are not defective may be excluded from use or treated specially because they have a limited dynamic range. When the mirrors are treated specially, they are still used, with a larger compensation error in black or white. Once "black" and "white" levels are selected, individual mirror are calibrated, within that reflectance range. The calibration procedure is the subject of the concurrent patent application, referenced above.

Figure 28:
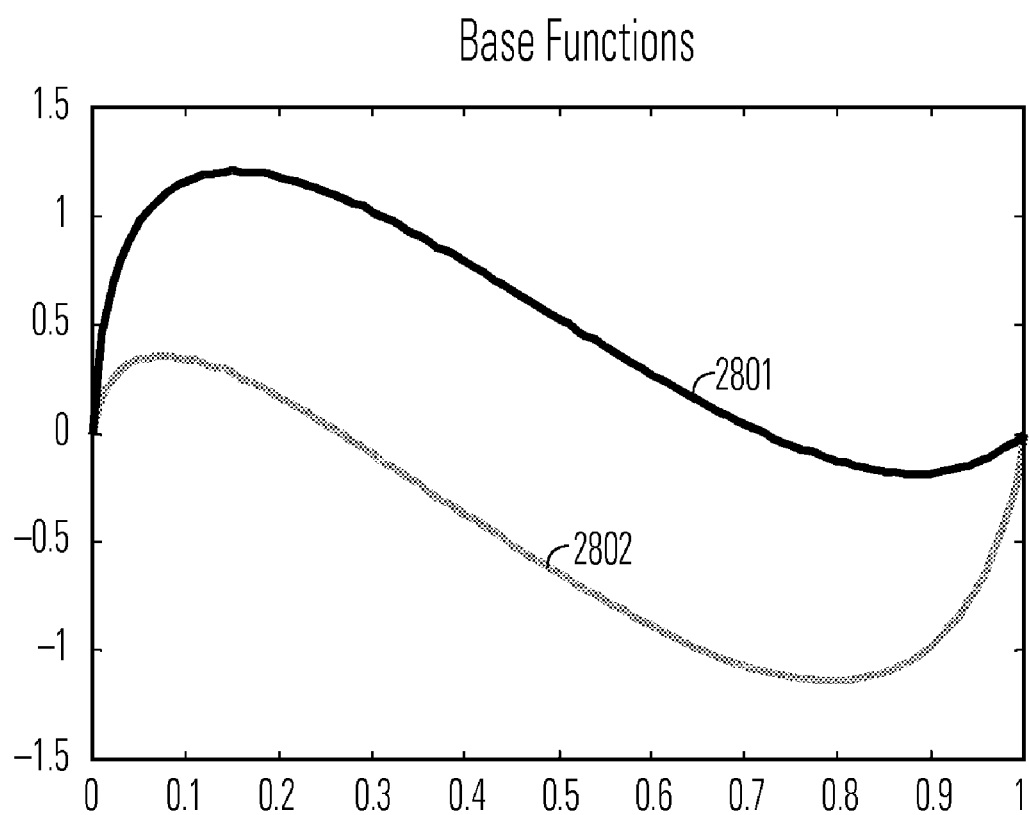
FIG. 28 depicts a pair of base functions calculated using eigen vector methods.

One approach to defining the functions is to use functions that are readily represented by a Fourier expansion, such as the base functions $\sin(\pi x)$ and $\sin(2\pi x)$. A characteristic error form resembling $\sin(3\pi x)$ can be expected when using these base functions. A second method of deriving the functions is a mixture of linear interpolation and interpolation using characteristic functions. The characteristic functions are (essentially) eigen-functions of the covariance matrix for the interpolation error using linear interpolation. A direct calculation of the covariance matrix for M mirrors would require diagonalization of an M×M matrix. Alternatively, one can project the M functions onto N sine-Fourier components and calculate the covariance of an N×N covariance matrix instead. The procedure is as follows: 1) The difference between the straight line that interpolates the reflectance functions at the end points and the response function is expanded a sufficiently large number of Fourier components (e.g., 60 sin functions); 2) Having M mirrors (and consequently M functions) and expanding into N components gives us a matrix A having dimension N×M; and 3) The base functions are now chosen by selecting the two eigenvectors of (the square matrix) $AA^t$ (t for transpose) with largest eigen values. The base functions obtained in this way are still sine-like and fit the data without systematic errors of the form $\sin(3\pi x)$. FIG. 28, functions 2801-2802, illustrates a pair of base functions generated using 60 sine terms in a Fourier expansion. These base functions are sine-like without the systematic errors expected when using the other base functions described above.

Fourier methods and least square fits are among the available calibration procedures for the equations above. By the Fourier method, one finds the coefficients by integrating, $$c = \int_0^1 \sin(\pi x) e(x) dx = \sum_{n=1}^N w_n e(b_n) \sin(2\pi b_n) \sqrt{1-b_n}$$

where $e(x)$ is the difference between the straight line that interpolates the data at the end points, $w_n$ and $b_n$ are weights and abscissas from the quadrature. One also integrates similarly for $\sin(2\pi x)$. This integral is easily solved by a Gauss-Chebyshev quadrature. A quadrature with as few as four points in the interval can produce satisfactory results.

One difference between the least square fit and the Fourier method is that the former is (by design) exact at the end points, while the least square fit minimizes the variance of the error (at least when the weight function equals 1). Calibration coefficients $c_1$ to $c_4$ are found by solving, Ac=Y where A is a 4×4 matrix and Y is a 4×1 vector. The elements of the matrix are, $$A_{ij} = \sum_m w(x_m) f_i(x_m) f_j(x_m)$$

and $$Y_i = \sum_m w(x_m) y_m f_i(x_m)$$

where Y is the voltage at some (normalized) reflectance sample $x_m$.

Two of the functions ($f_1$ and $f_2$) are the constant function and the linear function $f(x)=x$. The remaining two that were used are those derived from the $\sin(x)$ or (essentially) eigenfunctions. If the weight function, $w(x)$, is chosen to unity we will obtain calibration coefficients (c) that minimize the variance. If we also choose two of the base functions to be $\sin(\pi x)$ and $\sin(2\pi x)$, we will obtain solutions very similar to the Fourier expansion. The difference between these two originates only from the requirement that the constant and the linear functions are used to interpolate calibration data (at the end points) exactly in the Fourier case while they are chosen freely by the least square algorithm. Consequently, the least square fit produces the smallest average error but is not guarantied to be exact at the endpoints.

The algorithm for the compensation the very simple, namely $$U(x) = c_1 + c_2 x + c_3 f_3(x) + c_4 f_4(x)$$

There are four (4) unique coefficients for each mirror and two supporting functions ($f_3(x)$ and $f_4(x)$) common to all mirrors. These two functions can be put into tables as a result of the calibration procedure. The parameter, x, was in this case normalized to range (0.1), though other normalizations can be used in the final implementation.

It is useful to minimize the storage and bandwidth required for mirror compensation coefficients, e.g., to 32 bits per mirror. This will introduce "round-off" errors in the compensation. For example, consider coefficients rounded to 9, 9, 7 and 7 bits respectively. The round-off is done with each set of numbers first transformed into the range 0 . . . 1 by $$X' = \frac{x - \min(x)}{\max(x) - \min(x)}, (X' \text{ the belongs to the (closed) range } [0 \dots 1])$$

and then truncated to N bit precision by $$x_b = \text{Round}(X'2^N)/2^N(\max(x) - \min(x)) + \min(x)$$

The function "ROUND" simply rounds towards the nearest integer. "1/2^N" shifts the result back to the [0.1] range and the last multiplication restores the original calibration parameters that are now in N-bit precision. The remaining calculations are done in floating point (64 bit, IEEE) precision. For the methods presented here, storing 9,9,7,7 (7 bits for the constants that multiply the tabled functions) bits for compensation components is not always the optimal choice. If the base function is changed, then another storage may become optimal. Simulations indicate though that choosing the storage in this ways will produce sufficiently accurate results.

In 32 bits storage, it may be necessary also to store a 7 bit area code. Tests show that the storage of coefficients with 7, 7, 5, 6 bit precision, respectively, makes room for the area code, still fitting in 32 bits storage per micromirror.

Alternative scalings of coefficients affect the computation required, e.g., in FIG. 27. The recovery of the coefficients from stored values by multiplying with the range (maxvalue–minvalue) may turn out to be computationally too expensive. If the range is replaced by the nearest multiple of 2 that exceeds the range, coefficients can be recovered by a simple shift operation, with some sacrifice of accuracy. The two alternative ways of recovering coefficient the are: 1) As before, multiplying the scaled value to recover the range from maximal value to minimal value; and 2) As above, but exclude the smallest and the largest values for individual micromirrors. (Variations on this approach include excluding just the smallest or just the largest value, or excluding a plurality of smallest or largest values for individual micromirrors.) Excluding outlying values has the effect that two of the values may not fall within the range 0 . . . 1-$2^{-n}$. If that is the case, the excluded values are stored as 0 and $2^{-n}$ respectively. The second procedure may introduce substantial errors to the compensation error of the excluded micromirrors (e.g., in two out of 1000 micromirrors), while potentially, having the possibility to store the remaining coefficients more efficiently.

The table below represents simulated errors of various methods. The first alternative scaling method is called "all" and the second "loose2".

| Method | No round-off | Optimal | All | Loose2 |
|---|---|---|---|---|
| Standard dev. | 0.13% | 0.23% | 0.32% | 0.25% |

As the table shows, "loose2" is almost as accurate as a "optimal" on average but some mirrors have compensation errors as large as 5% while "all" keeps the compensation error for all mirrors below 1.5% at the expense of the average error.

Different scaling methods can be selected for the coefficients $c_1 \ldots c_4$, depending on their distributions. For instance, in simulations, most of the time $c_1$ is normally distributed, so excluding 0.2% of the most extreme calibration coefficients may not change the range much. In the same simulation, $c_4$ has a few extreme values and excluding those does seems to improve to storage efficiency for the remaining values.

Multiple SLM Configurations

Figure 54A:
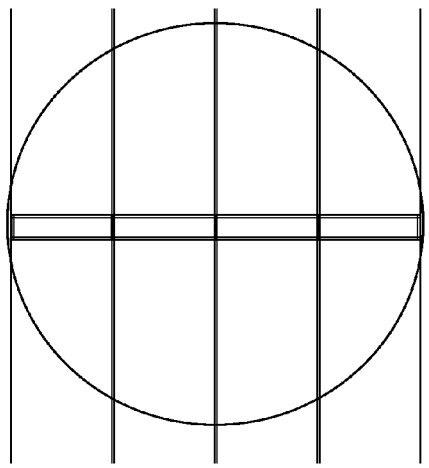
FIGS. 54A-C are examples of multiple SLM configurations.
Figure 54B:
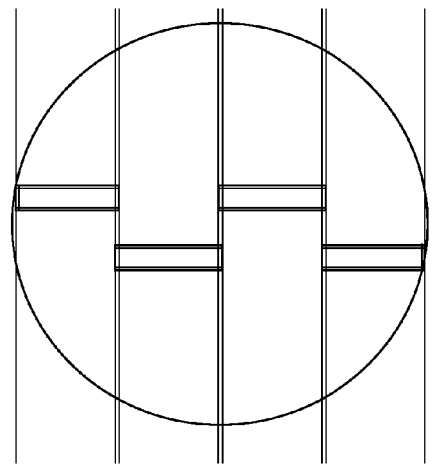
Figure 54C:
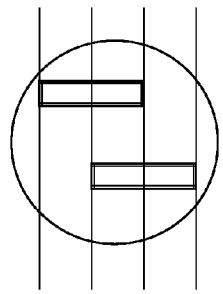

SLMs can be manufactured with a large number of pixels and a high refresh rate to print many pixels per second. Still, it may be advantageous to use more than one SLM in the same system. FIGS. 54A-C shows three different configurations for multiple SLMs. In FIG. 54, the circles depict an optical field on the work piece of the projection optics. The rectangles correspond to projections from multiple SLMs. They can be either mounted on a single support, e.g. a PC board or multichip module, or they can be on different supports and have their optical projections combined into the field of the projection lens by mirrors, prisms, holographic elements etc. The parallel thin vertical lines in the figure depict stripes printed by the individual SLMs. In FIG. 54A, the projections are optically stitched together, e.g., by semitransparent mirrors or other beam splitters or combiners, so that they create a contiguous area with a small overlap between the images. The use of overlap zones, as described above, feathers together the seams between the SLM images. In FIG. 54B, the images are separated in two directions. This configuration is suitable for an embodiment with all SLMs mounted to a single support, since the space between the SLMs provides room for the driving electronics and interconnections. In the configuration of FIG. 54B, the SLMs are at different positions along the stripe and the data has either to be buffered or produced with account taken of the offset. In FIG. 54C, the SLMs are print partly overlapping stripes, thereby creating two offset passes in one physical pass. The configurations in FIGS. 54A-C are printed with a stripe offset, i.e., sideways movement between writing swaths, of four SLM widths and the area is printed once. In FIG. 54C, the offset is only one SLM width but the area is printed twice.

Figure 55:
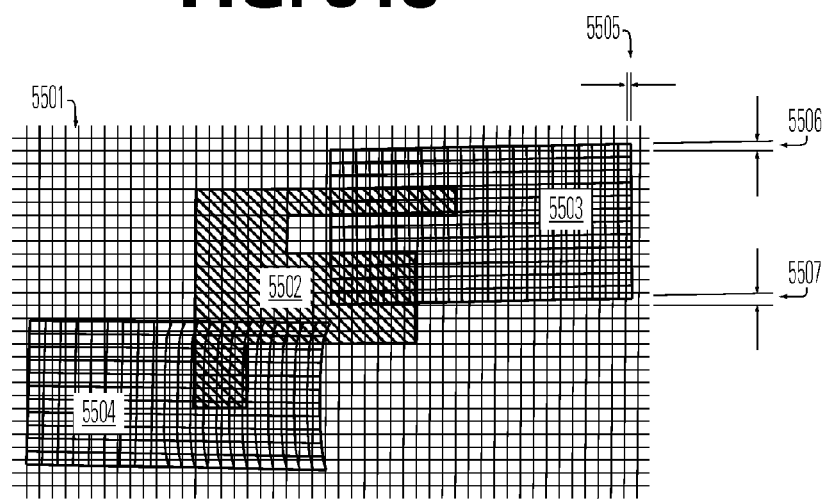
FIG. 55 illustrates use of correction factors to compensate for minor imperfections and distortions in projection from the SLM to the work piece.

A complication of using several SLMs is accurate alignment to reduce small pattern errors and invisible boundaries. FIG. 55 shows the images of two SLMs 5503 and 5504 in relation to the ideal geometrical grid 5501 as defined by the stage. The picture shows exaggerated alignment errors between the pixels of the SLM and the ideal grid. The input data for the feature to be printed 5502 is given in relation to the ideal grid. The parts of the pattern element 5502 that is to be printed by the top SLM 5503 are misaligned relative to the local coordinate system of the SLM. The pattern is rasterized with account taken of this misalignment. For one or more SLM, a set of misalignment parameters, in this case one rotation 5507 and two translations 5505 and 5506, are stored as correction factors 2635 to be applied in a correction transform 2665 before printing.

The SLM image 5504 does not lend itself to be described in the simple manner of a rotation and two translations, because it is distorted. In an alternative embodiment, a higher accuracy in the representation of the misalignment is achieved by a map of the distortion and misalignment of each SLM. This is of great value with the configurations in FIG. 54A-C, since the larger optical field of makes it more difficult to make a distortion-free projection system.

The misalignment and/or distortion of each SLM image is characterized by projection of an partial images onto a fiducial on the stage and measurement of the position relative to the fiducial. This is done by an automatic calibration procedure which measures the SLM misalignments and/or distortions and creates the SLM misalignment data sets.

The transformation of the data according to the SLM misalignment data sets can be done in three different ways. First, the corrections can be applied to the data during fracturing. When the data is cut to rendering windows the coordinate values of the vortices are corrected for the misalignment, or when applicable for the distortion. The second place where the transformation can be done is in the rasterizing step where the coordinates of the elements can be modified during or immediately before the bitmap is created. A third possibility is to convolve the bitmap, preferably before the illumination function is applied, with a translation kernel. See FIG. 26, 2635. The following is a translation kernel for a small displacement dx in the x direction.

$$\begin{matrix} 0 & 0 & 0 \\ 0 & 1-dx & dx \\ 0 & 0 & 0 \end{matrix}$$

For small displacements, a fraction of a pixel, the loss in image quality is negligible. Furthermore, the convolution kernel has of only two non-zero coefficients and can easily be implemented in hardware. For other translation directions, the kernel is also simple and a general hardware implementation that translates the image up to one pixel in any direction is simple and fast. The same method of correction can also include other effects, such as correction for stage position errors and image distortion. The correction to the bitmap which may include lens distortion, multi-SLM alignment errors, stage position errors is done in the block 2665 of FIG. 26 and the correction factors or parameters are stored in the block 2635. In the case of multiple SLMs there may be several sets of parameters in the block 2635 and for distortion control the block 2635 contains a correction map. These corrections can be applied to a single SLM; they are not limited to multiple SLM configurations.

Another aspect of using several SLMs is the opportunity to add another level of parallelism to the data path. The SLMs in 55A can be fractured and rasterized as a contiguous area, but each SLM can also be fractured and/or rasterized independent of the other SLMs. Where each SLM has its own complete data path, and a minimum of communications between the data paths can ensure that they are synchronized. With an extensively parallel computing scheme, with even the input data channels separate the system becomes truly scalable to very high capacity. Complete writing channels with fracturing, rasterization and SLM can be combined to create any throughput that may be needed. The SLMs may be integrated in the optical projection system and remain electronically autonomous. Their combined capacity is proportional to the number of SLMs.

Useful Hardware Configurations Overview

Figure 29:
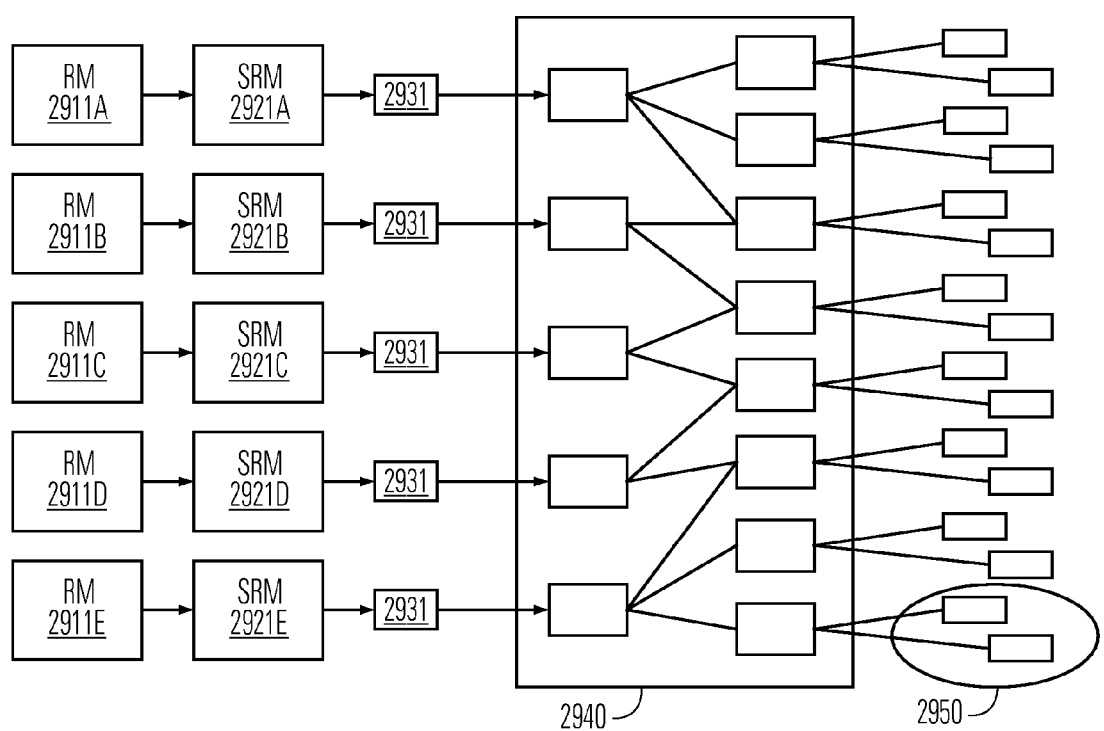
FIG. 29 is a block diagram illustrating potential buffer configurations.
Figure 30:
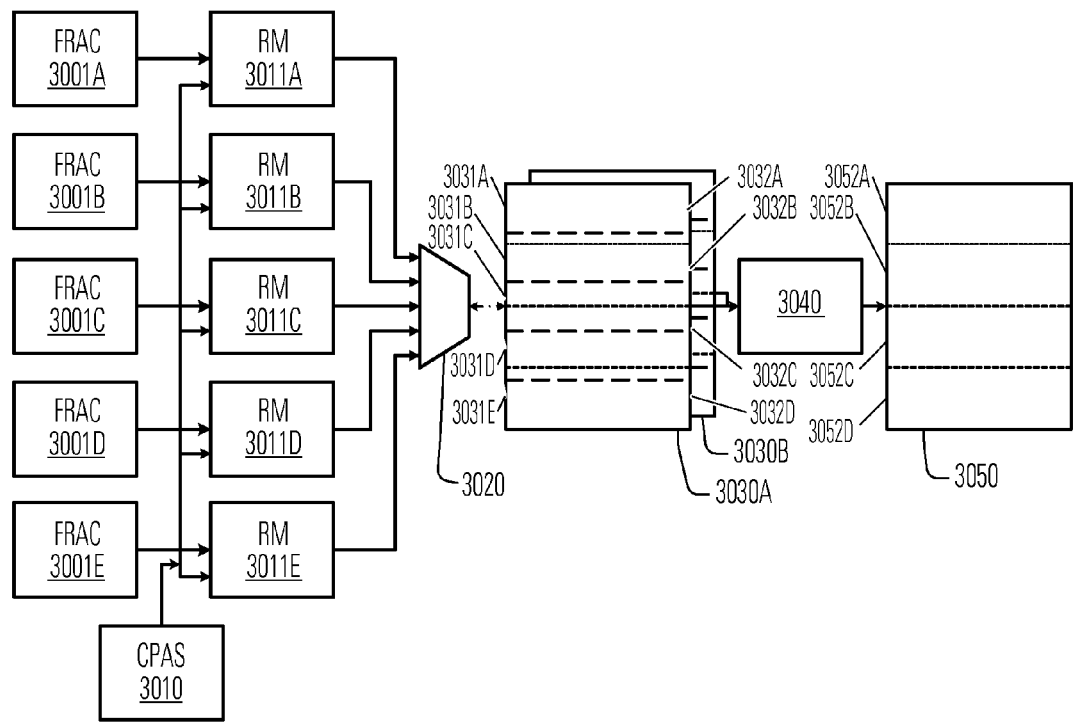
FIG. 30 illustrates the flow of data from fracture through loading into an SLM.

FIGS. 29-42 are block diagrams at various levels of detail that depict hardware which may be used to practice aspects of the present invention. FIG. 30 is a high level block diagram of fracturing hardware 3001A-E, control logic 3010, rendering modules 3011A-E, scheduling and control logic 3020, buffers 3030A-B, digital-to-analog converters (DACs) and control logic 3040, and a micromirror array. Fracturing may be supported by a Mercury cluster of processors or any other suitable geometry fracturing engine(s). The cluster may have one fractioning processor per rendering module, as illustrated. Alternatively, fracturing may be an off-line process resulting in a data file. A so-called FRAC-S format may be used to convey data from the fracturing processes to the rendering processes. Useful characteristics of the fractured data include: all fractured geometries may be smaller than a rectangle able to fit entirely anywhere in the guard zone; all fractured geometries may be smaller than a rectangle able to fit anywhere in the rendering window; all fractured geometries; all fractured geometries may be smaller than a rectangle with side having a maximum dimension measured in pixels, such as 255 or 253 pixels, or 511 or 509 pixels; and all fractured geometries must be at least ½ pixel high and ½ pixel wide. These characteristics can be modified, depending on the combination of aspects of this invention that are used in a particular embodiment.

The SDU performs a process which from a logical standpoint is a raster domain re-fracturing, translating the window division in the fracturing/rasterization domain to a window division matching the partitioning of the SLM. From a physical standpoint it also performs a concentration process, but from a modulation point of view, the actual concentration does not take place until in the SLM. Theoretically, the pixel transfer and digital-to-analog conversion could take place in completely separated devices, not connected until at the SLM, but due to the different scaling properties with the pixel processing and the modulator, and due to signal integrity and other reasons, the data is physically concentrated in the SDU.

In a first embodiment, buffering is limited. FIG. 29 depicts a configuration that variously polls for line input, utilizes one or more buffers between the rendering modules and the SDU, or could be adapted to utilize one or more buffers between the SDU and the DACs. The rendering modules 2911A-E are connected to the SRMs 2921A-E. The SRMs are SDU receiver modules, which provide the SDU with an interface to receive data from the RMs. The SLM link interface (SLI) connects the SRMs to the SDU 2940. This interface may suffer from relatively weak signal integrity. In the line-by-line variation on the configuration in FIG. 29, without the buffers 2931, requiring a complex protocol is required for ack/nack and send-resend of lines. The SRM-SDU CABS interface handles clock domain skew line synchronization with "wait until all lines are available, then proceed" protocol. Synchronizes the frame processing on the RM, with significant loss for latency and flash rate uncertainty. The output of the SDU is to pairs of DACs connected to the SLM.

In a second embodiment, a ring buffer is connected to each SRM 2931. The aggregate ring buffer bandwidth, and size, will be linearly proportional to the number of SRMs. The number of SRMs is roughly proportional to pixel throughput. The ring buffer eliminates the need for line synchronization between SRM-SDU and frame synchronization between SRM-SDU. If the buffer is large enough, it will also support rasterization of a complete strip before exposure start. An SDRAM based ring buffer already exists on the RT-fract side of the SRM, and the design can be reused together with its testing tools and interfaces. Bandwidth and size is not critical, the main purpose is to change synchronization method from line-by-line to strip-by-strip. SLM link interface is synchronized on a strip-to-strip basis. SRM-SDU CABS interface does not have to handle 'available-proceed' events other than on a strip-to-strip basis. This increases the robustness of the SLM link interface and the SRM-SDU interface considerably, and removes design and integration tasks for the full featured send-resend SRM. The reliability requirement of the infrastructure is relaxed, is only guided by the retrace intensity. Handling all exceptions on a strip level causes SRM-SDU interface becomes a completely synchronous system. Alternatively, buffers 2931 could be placed between the SDU and the DACs.

A third embodiment is depicted in FIG. 30. One or more SDU buffers 3030A-B and related control logic make the number of rendering 3011A-E units used independent of the number of segments 3052A-D in the micromirror array 3050. It is useful for the number of processors generating the rasterized image to be independent of the number of mirror segments. For applications with particularly complex geometries, the number of fracturing and rendering units can be increased. As the units act in parallel, the more units involved, the more processing power available. For applications with particularly simple geometries, the number of fracturing and rendering units can be decreased. Scheduling and control logic 3020 permits asynchronous delivery of data from the rendering modules to the buffer.

The buffer itself is differently segmented for input and for read out. The input modulator windows 3031A-E correspond to rendering units. The modulator windows are depicted in this diagram as being of equal size, but they can be unequal in size and may divide the memory array both row- and column-wise. Memory locations in the buffers 3030A-B correspond to micromirrors in a micromirror array or a rasterized image map for a scanning system. The memory may be dual ported, so that results from rending processors can be loaded without disrupting readout to load the DACs. In a micromirror flash system, the mirror array is loaded with data before each flash. In the embodiment illustrated, 128 DACs 3040 and control logic are used to load data into the micromirror array. Multiplexing circuiting in the micromirror array or external to the micromirror array can distribute analog signals from the DACs to the many micromirrors. An 8 mhz can perform conversions for approximately 8,192 micromirrors at a 1 khz frequency. This, 128 DAC each can handle 32 lines of 256 micromirrors. Analog voltages are generated by 8-bit DACs to create electrostatic charges, which deflect individual micromirrors. Greater precision, such as 10 or 14 bits in the analog voltage may be useful in some embodiments. A micromirror array such as the one described by the commonly owned applications by Micronic Laser System, Inventor Torbjorn Sandstrom, "Improved Modulator Design for Pattern Generator", WO 99/45441 (priority to 2 Mar. 1998) or the simultaneously filed provisional application reference above, can suitably be used as a projection device. Alternatively, scanning devices based on micromirrors or modulated radiation may be used. For a scanning device based on micromirrors, a large enough set of DACs might be used to transfer data to all of the micromirrors in one pass. For modulated radiation, it is customary to have one modulator for each radiation beam.

One, two or more buffer units 3030A-B can be used. Asynchronous receipt of data from and variations in time for processing by rendering modules is better supported by a plurality of buffer units. With some lithographic equipment, the flashing of the micromirror array cannot be delayed during the sweep of a strip, due to inertia of a moving stage on which the work piece rests. Some delay can be accommodated between strips. Therefore, operation of the DACs can only be delayed to the extent that the order of segment loading could be based on completion of writing data from rendering modules 3011 to modulator windows 3031. If any rendering module 3011 were to take longer than one flash cycle to load its modulator window in the buffer, it would cause a data fault and potentially waste the work piece. Use of two or more buffers 3030 would allow additional latitude for exceptional rendering cycles in particular modulator windows.

FIG. 31 is a block diagram of a rendering module 3011. In one implementation, five field programmable gate arrays (FPGAs) are used to implement the logic, 3100, 3110, 3120A-B and 3140. A current generation FPGA suitable for logic implementation is a Xilinx Virtex XCV1600E-6 BG560 C FPGA. The announced, but pending delivery Xilinx-II XC2V product line is anticipated to offer additional functionality, including on-board SRAM, which may allow consolidation of functional blocks into fewer modules. Alternatively, a RISC processor, an ASIC processor or a custom or semi-custom processor could be used. The choice of FPGAs is convenient and reduced product lead time and up front costs. A variety of other processors could just as well be used to practice aspects of the present invention.

The purpose of RMPL-1 3300 is to provide interfaces to PCI, CABS and other bus structures. The interfaces 3103 are available to configure the FPGAs in the field. All or part of the FPGA can be reconfigured or reloaded. For instance, weight coefficients for sub-pixel weighting can be field reconfigured and reloaded. These interfaces allow measurement of the operating temperature of the board. They further support programming of the clock frequency at which the board operates.

Geometry Pre-Processor Overview

The purpose of the RMPL-2 3110 is to provide an interface between the geometry input fiber channel and the rendering processor. The main task is to receive and buffer complex geometry data, flatten the data into primitive geometries and, on request, output data to rendering processor. RMPL__2 thus comprises: an interface for the on-board 256 Mbyte SDRAM; an interface for the on-board 2*8 Mbit ZBT RAM; a chain access bus structure (CABS) unit that manages the CABS protocol against external devices; a reception unit, the so-called geometry input controller (GIC) 3113, that receives geometry data from a geometry line interface (GLI) and stores the data in the SDRAM; a pre-processor (PP) 3111, that flattens geometry data and performs coordinate conversions; and a geometry buffer interface (GBI) 3112 between CABS, GIC, PP and SDRAM, which also implements an SDRAM-controller. The CABS block of RMPL-2 3110 acts as an interface between the internal blocks, zero bus turnaround (ZBT) SRAMs 3115 and other FPGAs or, more generally, other processors or functional components. CABS is a general bus structure used for intra-device communication. It is based on a chain like structure of devices, and eliminates the board level complexity of a general multi node bus structure. Sampling rates on the CABS may be 25-50 MHz. It is clocked with a board level system clock. The CABS block may be coupled to mode control pins for default configuration of the device from a bootstrap area of memory. Alternatively, other bus structures and protocols could be used to implement aspects of the present invention.

The GIC block is an interface between the GLI link and GBI. It comprises a FIFO buffer that is used for grouping received 32-bit double words (DSs) into bursts of 16 words. One burst at a time is sent to GBI for storage in SDRAM. The words on GLI may arrive in bursts of any size. The GBI block serves as an interface between GIC and PP. It includes logic to receive burst of data from GIC, store it in SDRAM, and on request read data from SDRAM and send it to PP. The GBI also may handle read and write requests from CABS. At the CABS-GBI interface, data is written in burst lengths of n*16 double words at a time, where n is 1 to 64. No indication of the actual transfer length is needed, apart from the enable signal for data transfer. Data may be read in bursts of 16 double words at a time.

The geometry pre-processor (PP) block serves as an interface between the GBI and the FPGAs 3120A-B. The pre-processor flattens the incoming fractured data stream and outputs simple geometries with coordinate offsets relative to the current rendering window. Fractured data is received form the GLI channel and stored into geometry buffer memory (GBM) 3116. A raw data mode may be available through the pre-processor to read out whatever is stored in GBM, for test purposes. Further detail regarding the pre-processor core is given in FIG. 40.

Memory controllers include ZBT-SRAM controllers and an SDRAM top module. The ZBT-SRAM controllers interface with SDRAM, such as standard PC 100 or PC 133 compliant 256 MB memory. ZBT SRAM devices are synchronous SRAMs that provide maximum system throughput by utilizing every bus cycle. As the name implies, there are no turnaround cycles required when switching between read and write cycles. Consequentially there are no wasted cycles and the system actually delivers the stated bandwidth. A snooze mode may be available for rendering module ZBT SRAMS, which, when activated, puts the memories in low power standby mode, retaining data and ignoring inputs. This may be useful during reconfiguration of FPGAs. To decrease latency, the ZBT-SRAM controller may be clocked by a doubled-frequency clock. The SDRAM top module comprises logic to generates signals required to perform memory write, read, refresh and internal built in self tests. At various ZBT-SRAM controllers used in the FPGA, single and double 32 and 64 bit data paths may be used. For instance, the interface between the pre-processor 3111 and the work memories 3115 may be a pair of independent 32 bit data paths. The interface between the rendering processor 3121 and the frame buffers may be a pair of 64 bit data paths.

Rendering Processor Overview

In FIG. 31, a pair of rendering processors are indicated, 3120A-B. Each of these rendering processors may be implemented in an FPGA, or alternatively, with a RISC or ASIC processor, or a custom or semi-custom processor. Two processors may be used so that one receives data from the pre-processor 3111 while the other writes data to the adjustment processor 3141. The data path from the pre-processor 3111 to the rendering processors 3120A-B may be controlled by a mux or similar device, or the rendering processors may disregard sets of signals intended for the complementary processor. Additional rendering processors could be used. Rendering processor 3120A is illustrated as having data paths to a pair of frame buffers 3122. These two memories are illustrated as having separate data paths, that is, independent channels for memory access. One is used for pixel map memory and the other for gray value super-sampling intermediate storage. The rendering processor 3121 also is illustrated as having another independent data path or channel to an additional frame buffer 3123, which may hold a micro pixel frame buffer. One or more frame buffers 3123 may be used for micro pixels. In an implementation with 64 micro pixels per pixel, the data path from the processor to the frame buffers 3123 may be 64 bits wide. A pair of frame buffers 3123 may be used so that memory clear functions can be carried out in one frame buffer while reads, writes or read/modify/writes are carried out with the other memory. Not illustrated in this figure is a gray value summary buffer. While these memories are illustrated as external to an FPGA, they may be incorporated internally to an appropriate FPGA, custom or semi-custom processor.

Figure 32:
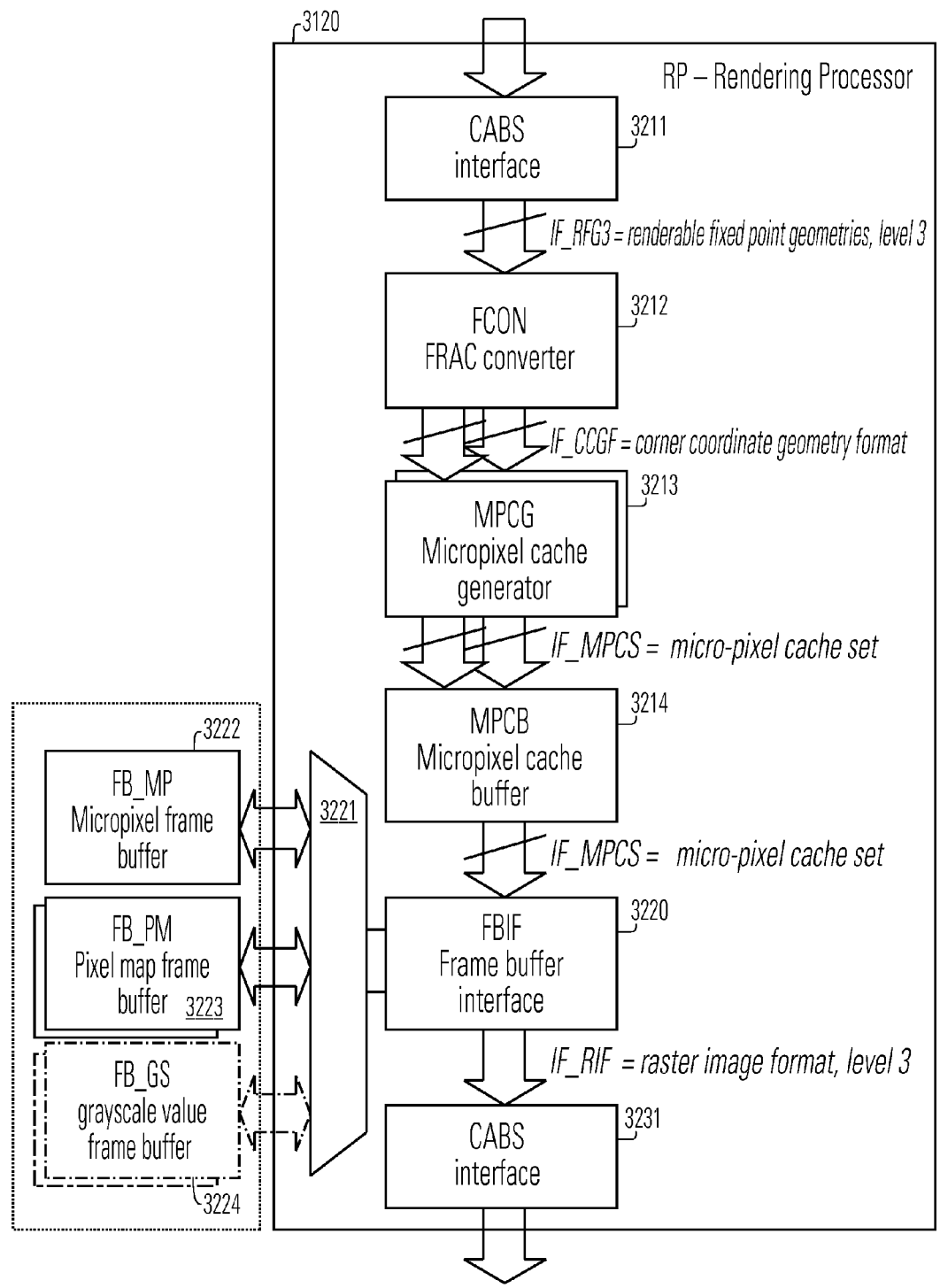
FIG. 32 is a hardware block diagram of a rendering processor, which is part of a rendering module.
Figure 33:
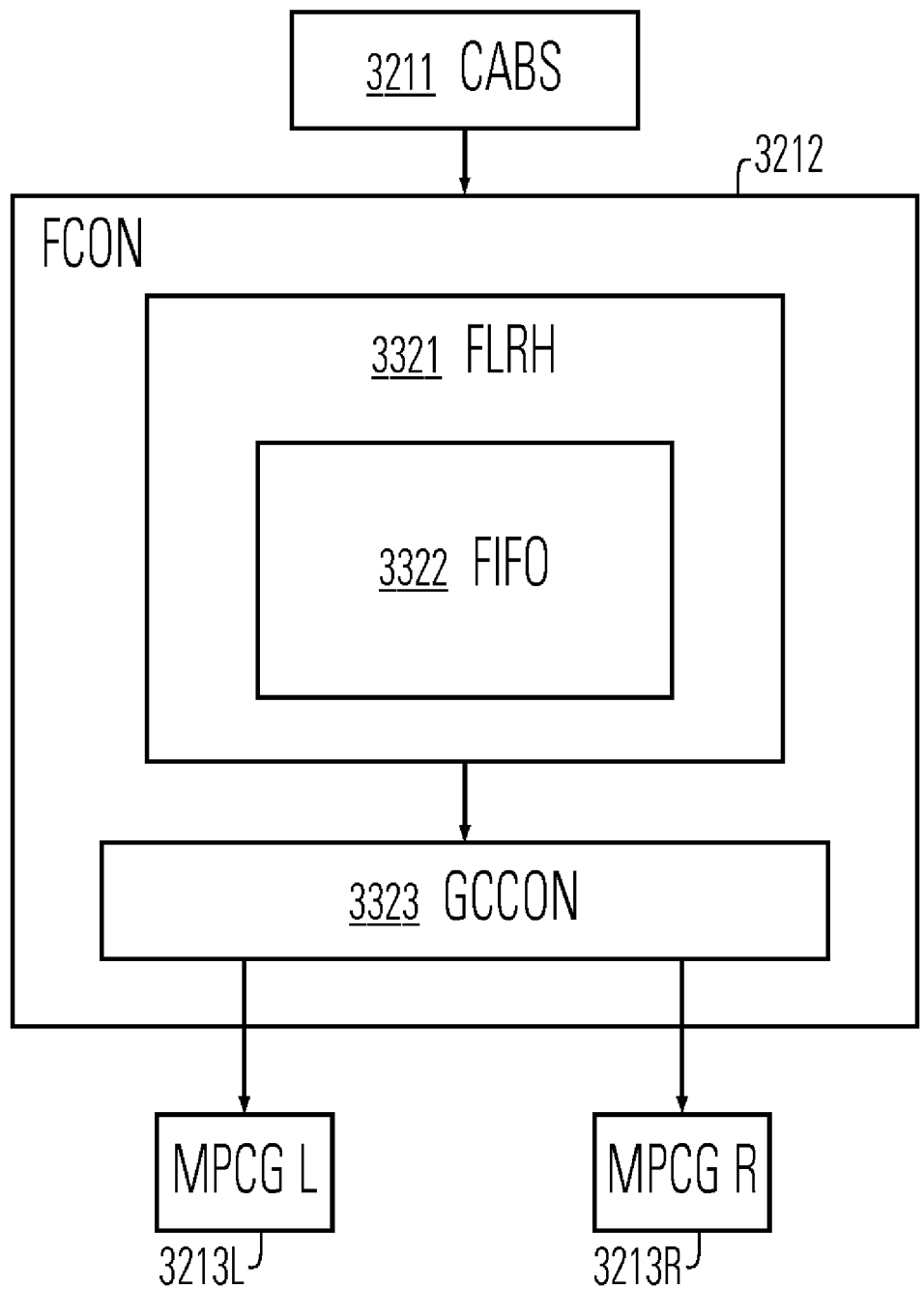
FIG. 33 is a hardware block diagram of a fracture converter, which is part of a rendering processor.

FIG. 32 provides additional detail regarding functional blocks of the rendering processor that may be used to implement aspects of the present invention. The rendering processor 3120 includes several functional blocks. The CABS interface 3211 is common to components of a system that are connected by a bus structure. The fractured geometry converter 3212 is coupled to the CABS interface by a data path that conveys renderable fixed point geometries. The converter delivers single edge corner coordinates in a speed of 50 million per second using a clock frequency of 50 MHz. Faster or slower clock speeds could be used to achieve faster or slower throughput. The output of the converter 3212 is in corner coordinate geometry format. The data may be delivered to a pair of micro pixel cache generators (MPCGs) 3213L-R using a pair of data paths. Using a pair of MPCGs combined with polygon geometries allows division of processing along right and left edges of the polygons. Fewer or more MPCGs can be used, depending on design characteristics, such as throughput and geometry used. When the polygon geometries are trapezoids, the top and parallel bottom of the polygon can be assigned to different processors, for instance, before they begin processing the opposing, non-parallel edges of the trapezoid. Additional detail regarding the converter is depicted in FIG. 33.

Figure 34:
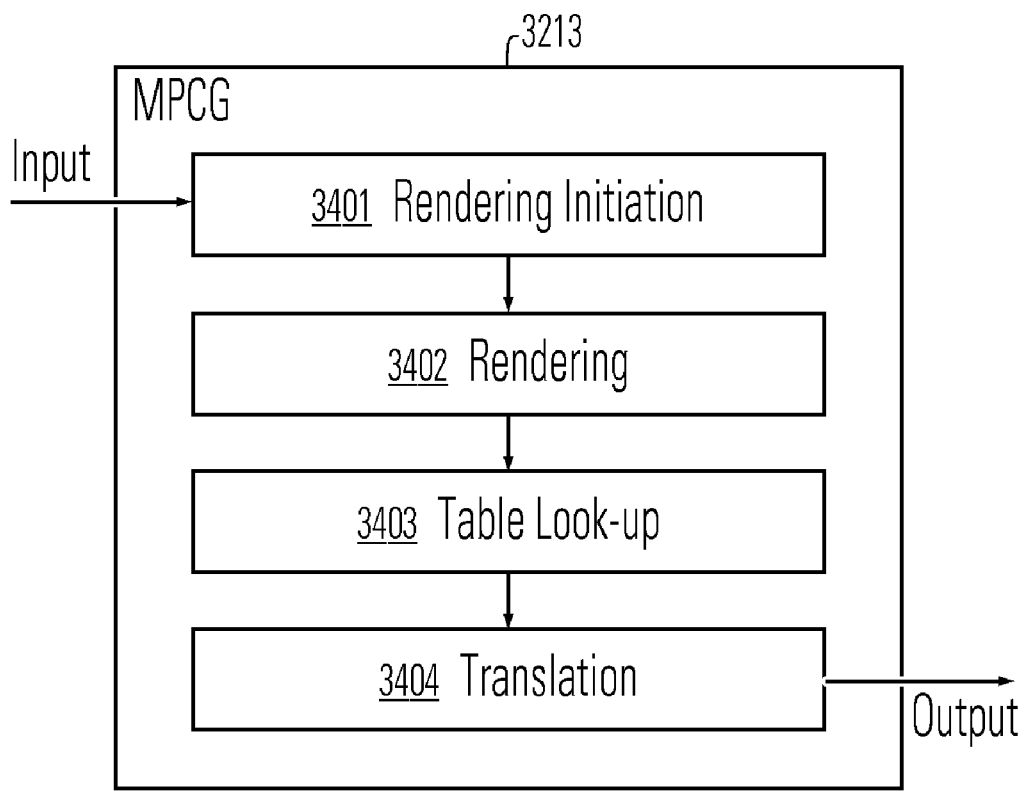
FIG. 34 is a block diagram of a micro pixel cache generator.

The MPCGs 3213 of FIG. 32 deliver micro pixel cache sets in a speed of 50 million MiPxCaWs per second using a clock frequency of 50 MHz. Faster or slower clock speeds could be used to achieve faster or slower throughput. The pair of MPCGs output cache sets to a micro pixel cache buffer (MPCB) 3214. Additional detail regarding the MPCG is depicted in FIG. 34.

Figure 35:
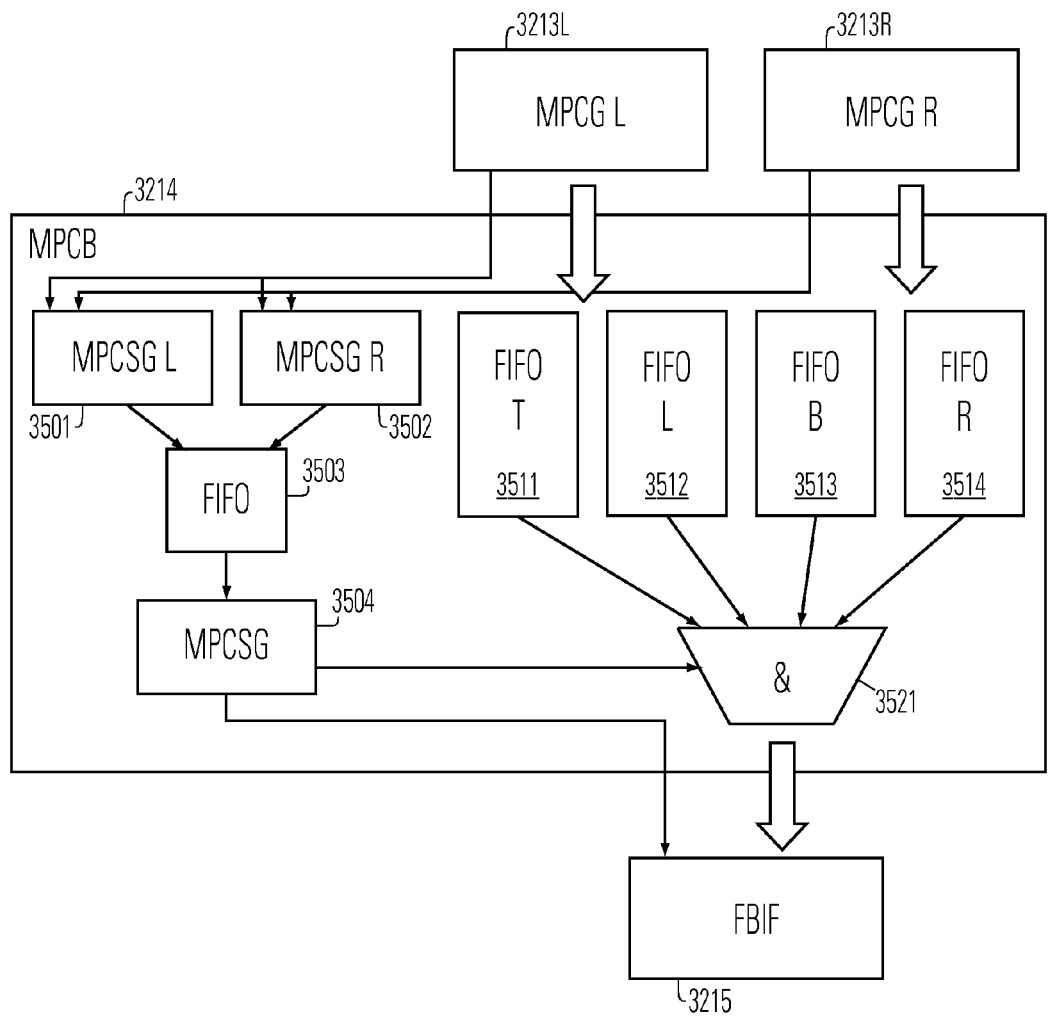
FIG. 35 is a block diagram of a micro pixel cache buffer.

The micro pixel cache buffer 3214 converts rendered micro pixel cache sets containing single edge information, e.g., left, right, to and bottom of a trapezoid, into a set of micro pixel caches containing information from one to four single edge caches for a geometric figure. Contained segments of top and bottom edges may be passed through, before or after calculating corners, when geometric figures include contained top or bottom edge segments. Address sets also are generated, as described above. The address sets implicitly convey the order of micro pixel caches that will be generated. Separate data paths may be used for conveying the cache sets and address sets. The caches collectively define the edges of the rendered polygon. Additional detail regarding the micro pixel cache buffer 3214 is depicted in FIG. 35.

The frame buffer interface (FBIF) 3215 may operate in three phases: rendering, read out and clear. In the rendering phase, the FBIF takes geometries form the MPCB and stores them in one or more frame buffer memories. In a first embodiment, the only memory may be a micro pixel frame buffer (MPFB) 3222. A plurality of MPFBs may be utilized to permit clearing of one MPFB while operating on the other MPFB. These memories may be dual ported and may have independent channels for memory access. In a second embodiment, there may be both the micro pixel frame buffer and the pixel map frame buffer (PMFB) 3223. There may be a plurality pixel map memories, preferably with independent channels for memory access, to enhance performance. In yet a third embodiment, there may be an added gray value frame buffer (GVFB) 3224 to summarize the values in the micro pixel (MPFB). Again, a plurality of gray value memories and independent channels may be used. In a hybrid embodiment, the PMFB may have sufficient values to serve as a GVFB. The frame buffer memories store a full rendering window, which may be oriented with x, y coordinates. These memories store the rendered image in different resolutions. The pixel map PMFB memory stores white, black, gray information in two bits for all bits. The micro pixel MPFB memory stores individual micro pixels corresponding to the pixels. For instance, an array of 8×8, 16×16, 32×32 or 64×64 micro pixels may correspond to a pixel. These micro pixels may hold black or white values or, alternatively, gray scale values. The mode of combining micro pixel caches depends on whether the micro pixels are B/W or gray valued. The gray value GVFB memory is utilized with the MPFB, to summarize the evaluation of micro pixel arrays. The micro pixel arrays can be evaluated into gray values either upon read out or when they are written, and the results stored in a GVFB.

In the read out phase, the gray values are reported for each pixel. In the first embodiment, with just a MPFB memory, this involves evaluating all of the micro pixel arrays. In the second embodiment, with MPFB and PMFB memories, some pixel locations are recorded in the pixel map as black or white. The system can evaluate those locations to an integer value, such as 0 or 64 or as 0 or 256, without accessing the MPFB memory, potentially decreasing demand for MPFB memory access bandwidth. In the third embodiment, the GVFB memory is assigned values each time that an MPFB is written to. Optionally, the GVFB memory can be assigned a value each time the PMFB memory is updated. In one mode, the PMFB is evaluated to determine whether to assign a white or black value or to utilized the GVFB value. In another mode, the GVFB value is used directly. The gray values from the FBIF 3220 are reported to the CABS interface 3231 as a raster image.

In the clear phase, one or memories are set to black/white so that white/black geometry figures can be rendered on a contracting background. In the first embodiment, the MPFB memory is cleared. In the second and third embodiments, the PMFB memories is cleared. With some types of memory, it is less time consuming to clear the smaller PMFB than the MPFB or GVFB, because a single word of memory can represent multiple pixels at low resolution. In the second and third embodiments, it is optional to take the more time consuming step of clearing the MPFB or GVFB memories, as the pixel map memory controls whether the other memories are used to generate gray values. That is, if the pixel map memory indicates that the value of a pixel is black or white, any gray value in the other memories can be ignored, as the other memories may not have been cleared after prior operations. With a memory configuration that supports bulk erasing of memory segments in minimal clock cycles, the overhead for clearing MPFB or GVFB might not slow the process.

More detail regarding the FBIF is depicted in FIGS. 37-39 and 42.

Adjustment Processor Overview

An adjustment processor 3140 receives data via the CABS interface 3231 or another suitable bus structure data from the rendering processors 3120A-B. It may be clocked at twice the frequency of its CABS interface. The adjustment processor includes blocks for edge displacement, illumination compensation and mirror compensation. It further may include logic for correction of minor defects in the optical system. Edge displacement is a method of adjusting the projected image of exposing radiation to adjust line width, instead of adjusting the processing of exposed resist, as explained above. Illumination compensation is a method of handling overlap exposures in single and multiple writing passes and energy variation between desired exposure radiation and actual exposure radiation, also explained above. Mirror compensation translates desired illumination values into drive values for individual mirrors. It also may be used to compensate for changing mirror response as mirrors become aged or between rest cycles for the system using mirrors. In a system utilizing a micromirror array and flashes of exposing radiation, mirror compensation may translate illumination values to input for DACs that charge the individual micromirrors.

The adjustment processor 3141 accesses coefficient memory 3143 via a data path. This memory holds coefficients for mirror compensation and also may hold coefficients for area maps used in illumination compensation. A ZBT-SRAM memory can be used as external memory. Alternatively, an internal memory can be used. The adjustment processor further accesses frame buffer memories 3142. One or more ZBT-SRAM memories can be used as work memory for edge displacement and to hold final values awaiting output on one or more back plane channels 3144-45.

The pixel output controller (POC), provides a format conversion, to adapt data to a physical layer.

Geometry Pre-Processor

Geometry descriptions are received at the geometry pre-processor in so-called FRAC-S format. Below is the BNF grammar of a FRAC-S stream shown. The FRAC-S stream may be stored in a so-called FRAC file that contains various process-dependent header parameters. These parameters, once loaded, may be available to the geometry pre-processor through control registers.

stream in a subset of this format, in which complex geometry descriptions, such as hierarchical and repeated descriptions, are simplified. The record types in the output stream are rectangle, small rectangle, trapezoid, begin layer and end layer. In one implementation, the number of repetition levels is five. One rendering window at a time is pre-processed. Data may be processed with a precision greater than a sub-pixel or micro pixel. A so-called soft pixel is one half of a micro pixel.

The processing rate of a real-time geometry pre-processor depends, in part, on the complexity of the geometry. For a flash exposing radiation system with a flash rate of 1,000 per second and an array of 2048×512 pixels (micromirrors), the overall system processes $104.8*10^6$ pixels per second. This corresponds, for a metal layer pattern of a semi-conductor, to an average geometry rate of 7,000,000 geometries per second. At an average of four records per geometry, the required record output rate would be 28,000,000 records per second.

The geometry pre-processor interfaces to three other modules, namely an SDRAM from which it reads FRAC-S data, a ZBT RAM used for temporary storage and a CABS unit that handles data addressing and framing.

The overall operation of PP is as follows:
1) At RESET, PP awaits a STRIP_SYNC event.
2) At STRIP_SYNC, the first two rendering windows are read in, transformed into the corresponding FRAC-L sequences and transmitted to the two rendering processors. The pre-processor then awaits an RP_DONE event.
3) At RP_DONE, the next rendering window is read in, processed and sent to a first rendering processor. The pre-processor then awaits a new RP_DONE event.
4) At RP_DONE, the next rendering window is read in, processed and sent to a second rendering processor. The pre-processor then awaits a new RP_DONE event and proceeds at 3).

```
FRAC_S_FILE ::=         SUBSTRIP
                        [SUBSTRIP]*
SUBSTRIP ::=            <SUBSTRIP_START>
                        SUBSTRIP_BODY
                        <SUBSTRIP_END>
SUBSTRIP_BODY ::=       RENDERING_WINDOW
                        [RENDERING_WINDOW]*
RENDERING_WINDOW ::=    <RENDERING_WINDOW_START>
                        [REND_WIN_BODY]*
                        <RENDERING_WINDOW_END>
REND_WIN_BODY ::=       GEOMETRY
                        [GEOMETRY]*
                        [LAYER]*
LAYER ::=               <BEGIN_LAYER>
                        [GEOMETRY]*
                        <END>
GEOMETRY ::=            <RECTANGLE>
                    |       <SMALL_RECTANGLE>
                    |       <REPEAT_RECTANGLE_X>
                    |       <REPEAT_RECTANGLE_XY>
                    |       <TRAPEZOID>
                    |       <REPEAT_TRAPEZOID_X>
                    |       <REPEAT_TRAPEZOID_XY>
                    |       <BEGIN_X_REPEAT> [GEOMETRY]*
<END>
                    |       <BEGIN_XY_REPEAT> [GEOMETRY]*
<END>
                    |       <BEGIN_Y_REPEAT> [GEOMETRY]*
<END>
                    |       <BEGIN_INSERT> [GEOMETRY]* <END>
```

The notation [x]* denotes "zero or more occurrences of x". An input stream in this format is converted into an output To be noted, from when a STRIP_SYNC event is received until a SUBSTRIP_END record is encountered, FRAC-S data is pre-fetched into a local input cache. This effectively minimizes the latency contributed from SDRAM accesses. The FRAC-L output is performed in consecutive bursts of double words. Therefore, the pre-processor stores output records into an internal buffer until at least 10 complete FRAC_L blocks has been stored, or an RENDERING_WINDOW end block has been encountered. This 10 block rule implies that the average burst length to RP will be about 32 double words. At the end of each rendering window, a trailing END record is transmitted. The pre-processor keeps track of LAYER record parameters as follows: Layer numbers shall be in consecutive order, starting at 1 for the first LAYER record, 2 for next etc. If this ordering fails, an error is issued. And, if layer operation=IGNORE, the entire layer is discarded.

The various FRAC records and its corresponding block structures that may appear within one rendering window are shown below. For hierarchical structures, {G1 . . . Gn} denotes the parsed geometries inside the hierarchy. That is, a block always encloses the outermost repetition level and may contain any number of underlying levels.

whereas repeated geometry blocks have to be traversed recursively. The traversing procedure is as follows:
1) If the block type is {RECT, SMALL_RECT, TRAP, LAYER, END, REND_WIN END}, then convert the block to a record sequence.
2) If the block type is {REPEAT_X, REPEAT_Y, REPEAT_XY, INSERT}, then:
   Push start address and repetition parameters on stack;
   Traverse the sub-blocks recursively, starting at 1, above; and
   When all repetitions are done, pop stack to previous level.

Figure 40:
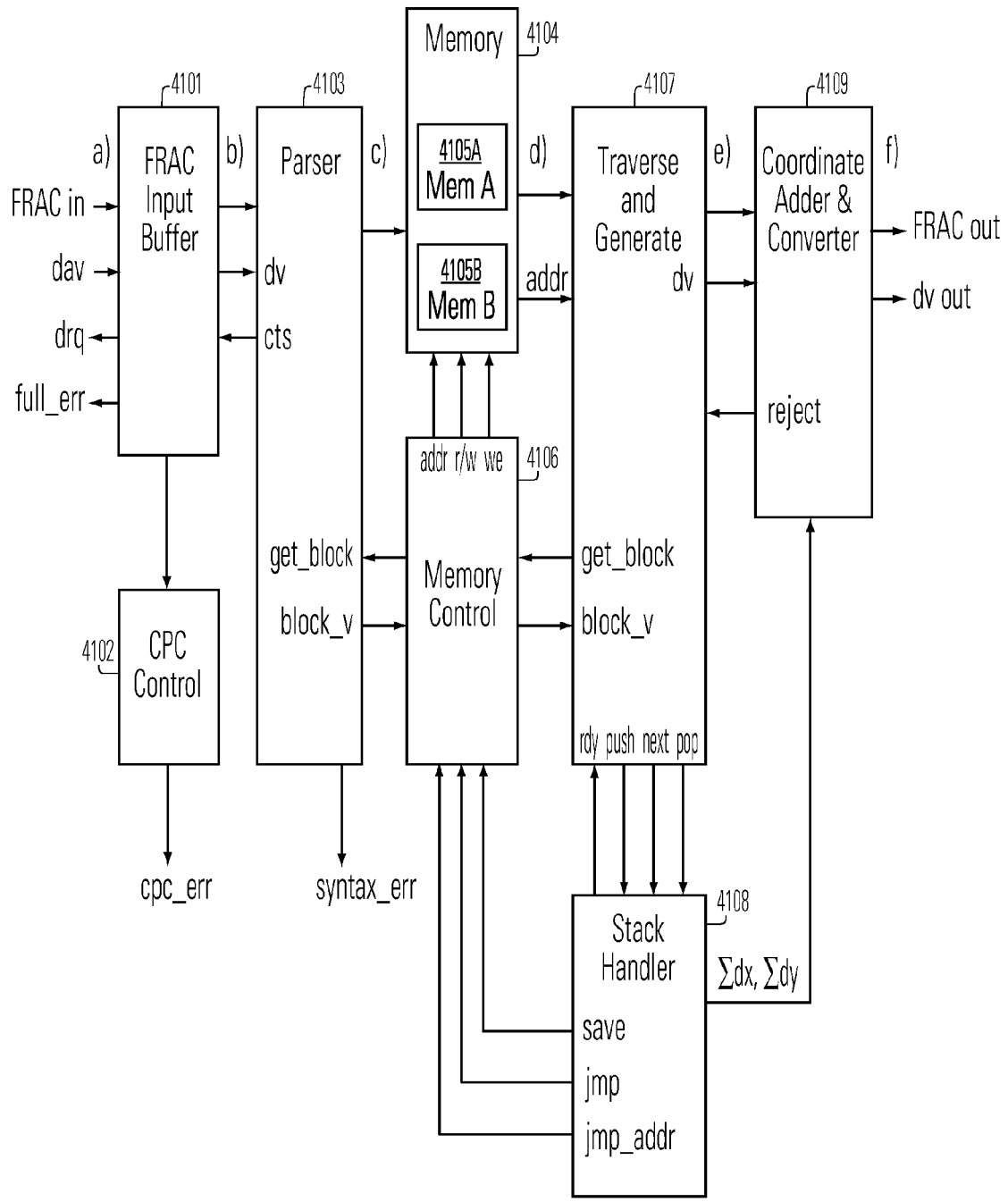
FIG. 40 is a hardware block diagram providing detail regarding one implementation of the pre-processor core.
Figure 41:
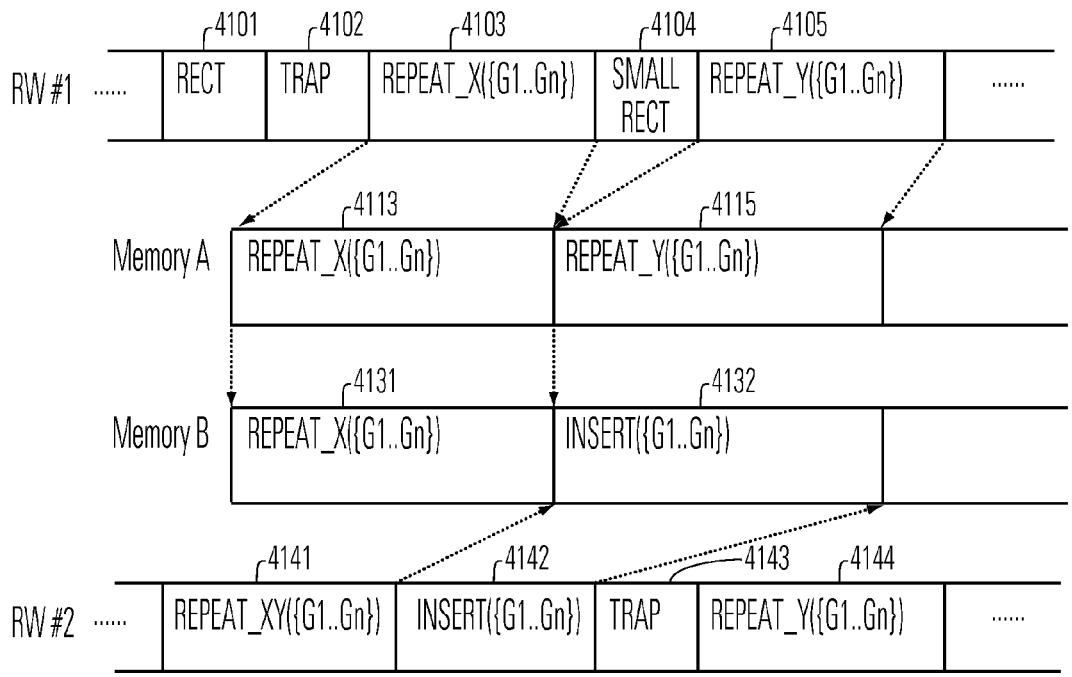
FIG. 41 illustrates handling of memory blocks as memory is traversed.

FIG. 40 is a block diagram of the pre-processor core. The FRAC-S input buffer 4101 avoids or minimizes overflow due to propagation time in the flow control mechanism. New FRAC-S records are requested by setting the DRQ signal high. For every cycle where the DAV signal is set high, a new record is written into the buffer. As long as the CTS input signal is high, records are read out from the buffer and sent to the parser. Setting CTS low stops the output stream. Each of the rendering windows received are associated with a Cyclic

| FRAC Sequence | Block Structure |
|---|---|
| <RECTANGLE> | RECT(x,y,dx,dy) |
| <SMALL_RECTANGLE> | SMALL_RECT(x,y,dx,dy) |
| <TRAPEZOID> | TRAP(x,y,dx,dy,dxl,dx2) |
| <REPEAT_RECTANGLE_X> | REPEAT_X(xrep,xdist,RECT(x,y,dx,dy)); |
| <REPEAT_RECTANGLE_XY> | REPEAT_XY(xrep,xdist,yrep,ydist, RECT(x,y,dx,dy)) |
| <REPEAT_TRAPEZOID_X> | REPEAT_X(xrep,xdist,TRAP(x,y,dx,dy, dxl,dx2)) |
| <REPEAT_TRAPEZOID_XY> | REPEAT_XY(xrep,xdist,yrep,ydist, TRAP(x,y,dx,dy,dxl,dx2)) |
| <BEGIN_LAYER> | LAYER(layer_no,oper) |
| <END> | END |
| <BEGIN_X_REPEAT> [GEOMETRY]* | |
| <END> | REPEAT_X(xrep,xdist,{G1..Gn}) |
| <BEGIN_Y_REPEAT> [GEOMETRY]* | |
| <END> | REPEAT_Y(yrep,ydist,{G1..Gn}) |
| <BEGIN_XY_REPEAT> [GEOMETRY]* | |
| <END> | REPEAT_XY(xrep,xdist,yrep,ydist,{G1..Gn}) |
| <BEGIN_INSERT> [GEOMETRY]* | |
| <END> | INSERT({xoffsl..xoffsm},{G1..Gn}) |
| <SUBSTRIP_START> | — |
| <SUBSTRIP_END> | — |
| <RENDERING_WIN_START> | — |
| <RENDERING_WINDOW_END> | REND_WIN_END(CPC) |

For each rendering window, the two memory areas will be used interchangeably. Geometry blocks that arrive are temporarily stored one by one in current memory area while being traversed. If a block is not needed in succeeding rendering windows (RWs), it is removed from memory after being fully traversed. Blocks that are further needed are queued in memory for use in succeeding RWs. In the example in of, a REPEAT_X 4103 and REPEAT_Y 4105 block remain saved 4113, 4115 from a first RW. For next RW, the REPEAT_X block 4113 from previous RW is saved 4131, along with an INSERT block 4142, 4122 from the input FRAC-S stream.

Traversing a block differs, depending on the type of geometry represented by the block. Blocks that represent simple geometries may be converted to FRAC-L records directly, Parity Check (CRC) code that is stored in the RENDERING_WINDOW_END record. The CPC control block 4102 recalculates this check sum and issues an error signal if the sum differs from the reference value. Various recovery schemes can be used in case of an error signal.

The parser module 4103 reads FRAC-S records from the buffer and groups the records into geometry blocks. When setting the get block signal high, the parser outputs an entire block that will be stored in memory. Repeated geometries (i.e., REPEAT_RECTANGLE and REPEAT_TRAPEZOID) are translated into REPEAT blocks to simplify further processing.

If the parser 4103 is unable to generate a block due to error in the FRAC-S stream syntax, the exception signal syntax_err is asserted and operation on the current rendering window may be aborted. Syntax errors include the following: a <BEGIN_REPEAT>, <BEGIN_INSERT> or <BEGIN_LAYER> without an <END>, or <END> without <BEGIN_REPEAT>, <BEGIN_INSERT> or <BEGIN_LAYER>; a <BEGIN_LAYER> inside a REPEAT or INSERT block; or a <BEGIN_LAYER> inside a layer description.

The memory 4104 comprises two ZBT RAMs organized in 32-bit words 4105A-B, which are used as described above. The memory control 4106 controls whether a new block should be read from memory or from the parser. It selects the memory area and address to read from and write to and performs the read/write operations. To decrease memory read latency, the interface towards the ZBT SRAM modules, may be clocked with double clock frequency.

The traverse and generate module 4107 traverses a geometry block in memory and generates primitive geometries (shapes). A stack 4108 is used for handling multiple hierarchy levels. When entering a new level (i.e., REPEAT . . . END statement), the repeat parameters are pushed on the stack and the stack pointer is incremented. When all repetitions on current level are done, the stack 4108 is popped to the previous level. If a geometry is rejected by the coordinate adder block, the stack is also popped, and the current block will remain in memory for next RW. The stack handler 4108 contains the stack read/write mechanism and logic for incrementing coordinates in repeat loops. It controls whether to save the current block, jump back to the beginning of a loop or proceed with next instruction. The coordinate adder 4109 adds the cumulative Σdx and Σdy increments, stored in the stack, to the current x and y coordinates of the arriving geometry. If a geometry falls outside the current rendering window coordinates, the reject signal is set to indicate that this repetition level should be popped.

Fractured Geometry Converter

FIG. 33 is a block diagram of a fractured geometry converter (FCON). The fractured geometry converter 3212 comprises two main blocks 3321, 3323 and a FIFO memory 3322. The FRAC-L Record Handler block, FLRH 3321, works as an interface towards the CABS block 3211. Its main task is to retrieve geometry information from the FRAC-L records. FRAC records are received as 32-bit words from CABS. The information is analyzed for the type of geometry and stored in records. The Geometry to Corner Converter; GCCON 3323, converts the FRAC representation of a geometry into geometry corner representation. It also splits the data into left and right data stream. The FIFO memory 3322, included in FLRH 3321, ensures that CABS data transfer flows evenly. This FIFO memory can contain up to 255 FRAC-L words. FCON will use control signals to indicate when the buffer is nearly full or needs to be refilled.

In the GCCON block 3323, the geometry start coordinate and length specification are converted into a geometry corner description and divided into top, left and bottom, right coordinate pairs. To simplify the functions of down stream process blocks, top and bottom geometry information is conveniently transmitted first for each new geometry. Thus, top information is present, even if the geometry is a triangle. A FCON fault indication will be initiated if geometry edge coordinates lie outside or on the top or left border of the guard window.

Micro Pixel Cache Generator

FIG. 34 is a block diagram illustrating one embodiment of rendering 212, which is part of the rendering engine in FIG. 2. Sub-pixel arrays or grids are sometimes referred to as micro pixel caches. The micro pixel cache generator includes four blocks: initiation; rendering; table lookup; and translation. The input 3401 may be a renderable fixed-point geometry or, more generally, a polygon to be rendered. The initiation block 3402 calculates starting parameters for application of the Bresenham rendering algorithm to the polygon. Application of the Bresenham algorithm is described in connection with FIGS. 8 through 11. The rendering block 3403 carries out the Bresenham algorithm. The table lookup block 3404 contains a lookup table for converting micro pixel cache coordinates into a sub-pixel image. This process is described in connection with FIGS. 12-14. The last block, translation 3405, translates values for sub-pixel bar values into shaded sub-pixels in the sub-pixel grid. In some instances, rotation or inversion of values in the lookup table may be necessary to shade sub-pixels in the sub-pixel grid. Translation of sub-pixel bar values from the lookup table and rotation of the bars, if necessary, can be performed in hardware using an array of flip-flops that can be addressed both horizontally and vertically. The output 3406 from the micro pixel cache generator is a micro pixel cache set.

Micro Pixel Cache Buffer

The Micro Pixel Cache Buffer 3214 consists of five main blocks, seen in FIG. 35. The FIFO memories left (L) 3512 and right (R) 3514 receive MiPxCaW information from the two MPCGs 3213L-R. The first pair of MiPxCaW received for each new geometry, which include top and bottom edge information, are stored in the top (T) 3511 and bottom (B) 3513 FIFOs. The four MiPxCaW FIFOs are connected to a combined multiplexer and logical and function 3521, generating the final rendered MiPxCaW. There is one Micro Pixel Cache Set Generator, MPCSG, divided in three blocks 3501, 3502, 3504 generating the micro pixel cache set used to control the logical and function 3521 and the information used by the Frame Buffer Interface, FBIF 3215, which describes how the rendered MiPxCaWs are organized on the output.

Frame Buffer Interface

Figure 36:
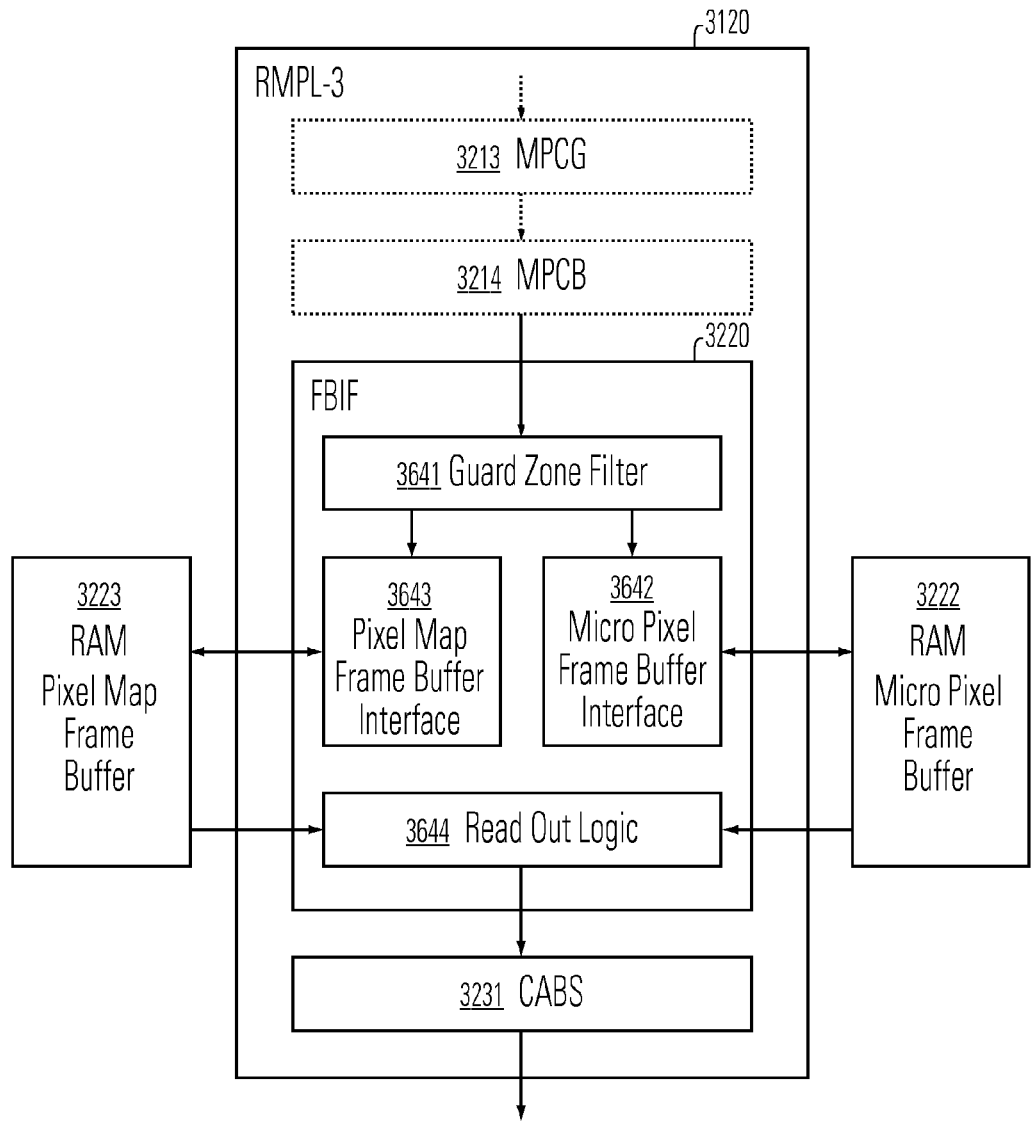
FIG. 36 is a block diagram of a frame buffer interface and related components.
Figure 37:
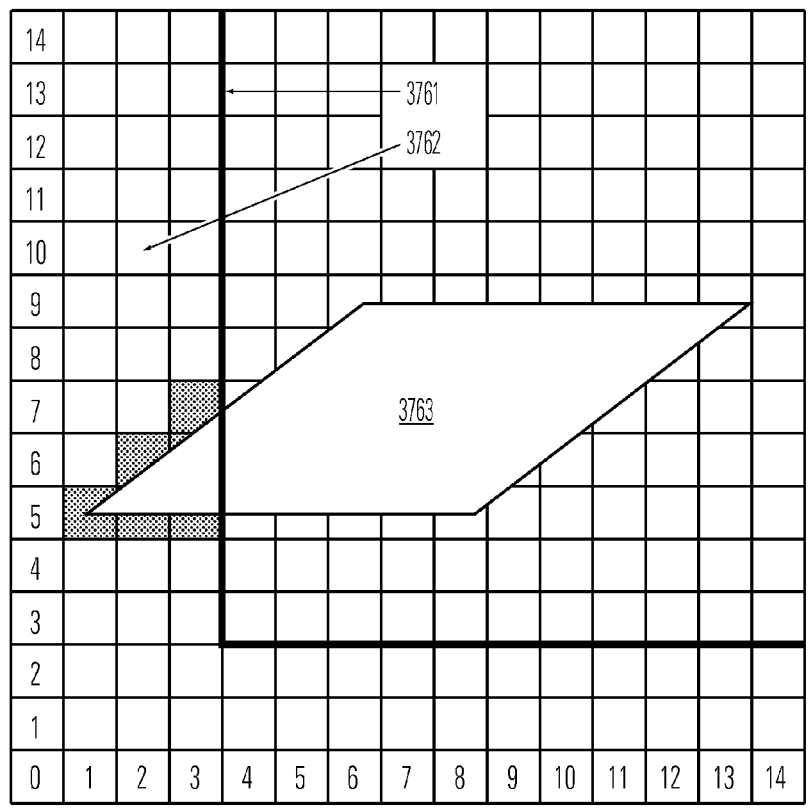
FIG. 37 illustrates the operation of a guard zone filter implemented before data is written to a memory controller.
Figure 37:
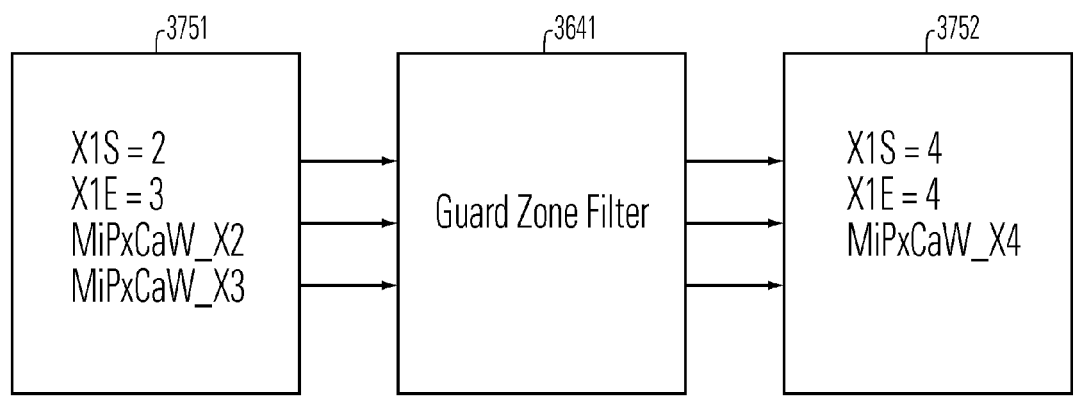

FIG. 36 is a block diagram of one embodiment of the frame buffer interface 3220. As depicted, processing flows from the micro pixel cache generator 3213 to the micro pixel cache buffer 3214 and onto the FBIF 3220. The first element of the FBIF is a guard zone filter 3641, which is one hardware implementation of the guard zone described above. FIG. 37 illustrates the operation of this filter. Consider the geometric figure 3763. It straddles the boundary 3761 between the rendering window and the guard zone 3762. Portions of the left and bottom edges that are in the guard zone are indicated by shading. The guard zone filter 3641 receives in input data set 3751 and generates an output data set 3752. For the portion of figure 3763 in row 6 of the grid, the data 3751 includes an edge start in column 2, an edge end in column 3 and micro pixel caches for pixels 6, 2 and 6, 3. The filter detects that 6, 2 and 6, 3 are in the guard zone. It generates new address sets and a new micro pixel cache 3752. The start and end of the row 6 edge segment are set to 6, 4 and a single, white micro pixel cache MiPxCaW_X4 replaces the input pair of micro pixel caches. The interfaces 3643, 3642 control access to the respective memories 3223, 3222. Read out logic 3644 passes the values from the respective memories to the CABS 3231 interface. The logic depends on the embodiment of the memories, as described above. One read out logic is depicted in FIG. 7. Further detail of one embodiment appears in FIGS. 38-39.

Figure 38:
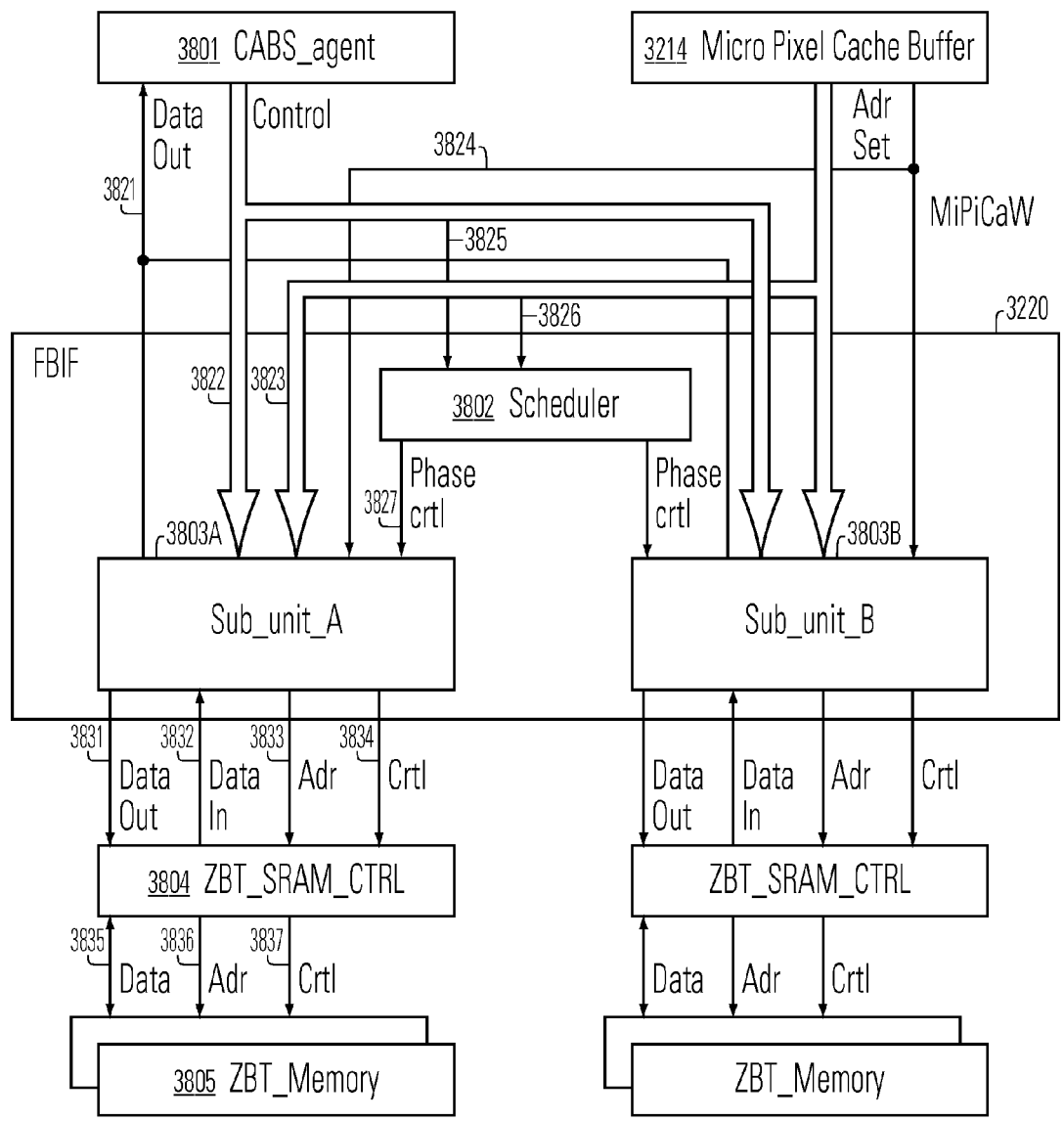
FIGS. 38-39 provide further detail regarding the structure of a frame buffer interface.
Figure 39:
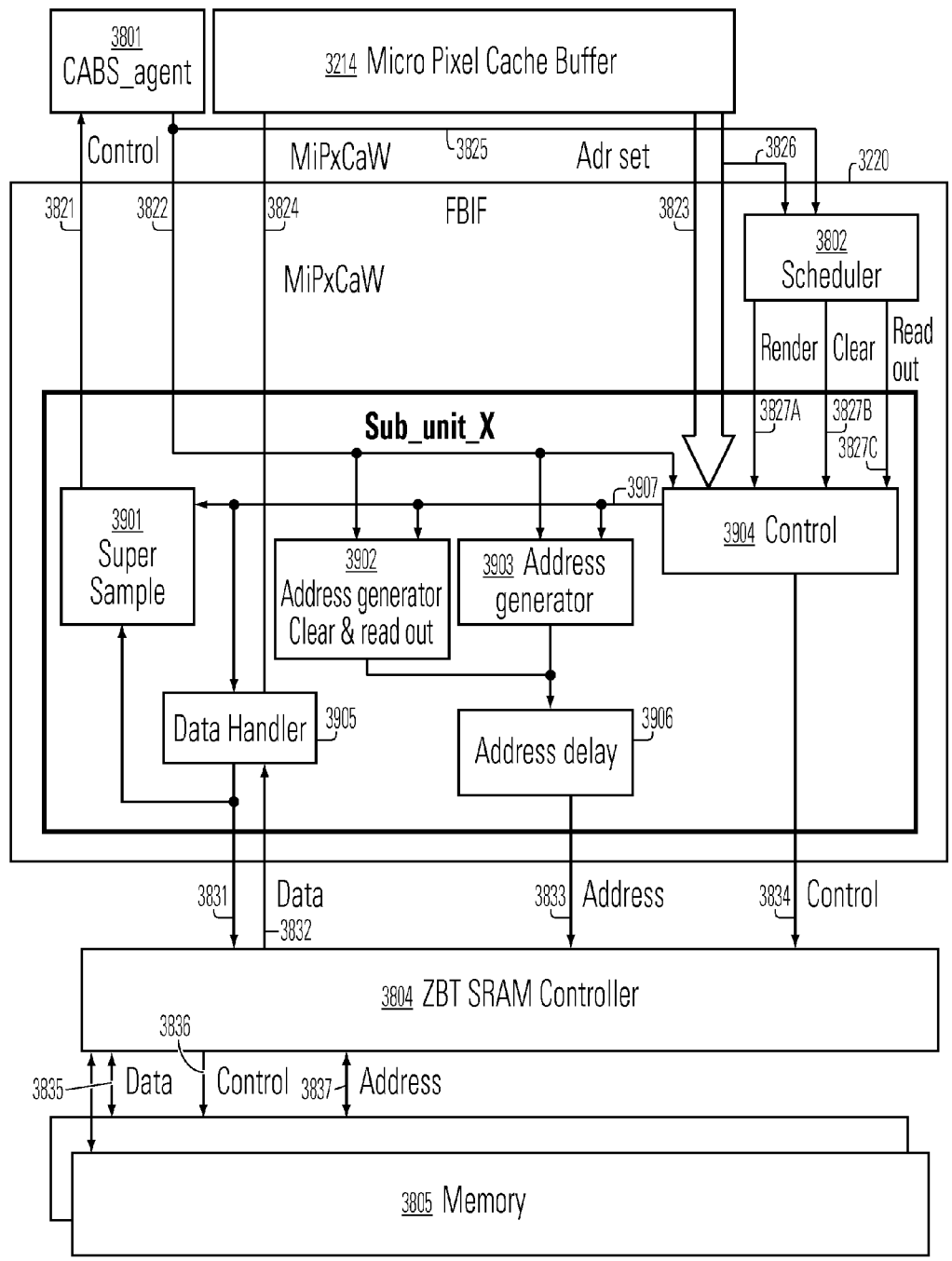

FIGS. 38 and 39 are a block diagram of the first embodiment of FBIF 3220, utilizing MPCB memory 3222, but not PMCB memory 3223. Two subunits 3803A-B are provided for throughput, operating in an interleaved fashion as explained below, to efficiently utilize bandwidth. Fewer or more subunits could be employed, depending on the performance of the subunits and the desired throughput. As described above, the FBIF generation two has three phases: 1) the rendering phase; 2) the read out phase; and 3) the clear phase. A schedule block 3802 schedules the 3 phases. In one embodiment, supersampling is performed as a part of the readout phase. (In another embodiment, supersampling may take place each time a micro pixel array is written.) Supersampling is executed just before the data is written 3821 to the CABS_agent 3801. The CABS_agent 3801 can abort the current operation in all blocks. When the abort signal 3825 is set, FBIF will abort the current function until either: the MPCB signals 3214 new data, then the FBIF 3220 will start in rendering phase and the current memory content will be used in the new rendering operations; or the CABS orders FBIF to readout data with the send_frame_cabs-signal 3822. In general, the FBIF-block may be double clocked.

In FIGS. 38 and 39, the scheduler 3802 schedules the three phases for the two sub_units in a 4-phase interleave schedule:

| Processor | Buffer | Phase 1 | Phase 2 | Phase 3 | Phase 4 |
|---|---|---|---|---|---|
| RP A | MPFB A1 | Clear | Rendering | Readout/super-sampling | Idle |
|  | MPFB A2 | Idle | Clear | Rendering | Readout/super-sampling |
| RP B | MPFB B1 | Readout/super-sampling | Idle | Clear | Rendering |
|  | MPFB B1 | Rendering | Readout/super-sampling | Idle | Clear |

The scheduler 3802 sends the signals 3827 Render, Clear and Read_out to the sub_units 3803A-B. When the data and control 3822, 3823, 3824 from MPCB 3214 & CABS_agent 3801 is received by the sub_units 8303A-B, they respond consistent with the phase that they are in. The scheduler uses signals from other logic units. From MPCB 3214, it uses downward_ready, and WEND. From the CABS_agent 3801, it uses send_frame_CABS. From the sub_units, it uses frame_ done_CABS, clear_done. If an abort signal is received, the scheduler goes to phase 1 and sub_unit_A waits for downward_ready to start render; at the same time, a clear memory process is started in sub_unit_B. If abort is received, all data current processed in FBIF will be lost, but the content of the memory will not be changed due to abort.

The control logic 3904 also responds consistent with the phase that it is in. During the rendering phase, the downward_ready and upward_req signals control the data flow from MPCB 3214 to FBIF 3220. The rendering phase starts when the MPCB signal Downward_ready goes active, indicating that is data available. The FBIF will receive data until there is no more data for the current rendering window and the WEnd signal goes active. As long as the Downward_ready is active there are MiPxCaW to receive from the MPCB-block. If the Downward_ready signal goes in-active and no WEnd signal is received, there are still more MiPxCaWs for this rendering window, but, at the moment, the MPCB-buffer is empty. As long as the FBIF is ready to receive new data, it holds upward_ req active. The rendering phase is finished when the Wend signal goes active. FBIF will then send frame ready_ CABS to the CABS_agent so the CABS_agent can fetch data. Downward_ready can only go inactive after an active WEnd or GEnd pulse. After an active WEnd or GEnd pulse the pipeline in FBIF is flushed. When new MiPxCaW's come from MPCB from a new geometry, there will not be any unprocessed old MiPxCaW's from the old geometry in the pipe. As the address sets are processed the control block checks if the address in the memory has to be increased or decreased and gives up or down count orders to the address generator. When white MiPxCaW are rendered data is only written to memory, no reads are performed.

The read out phase is invoked from CABS_agent 3801 with send_frame_CABS. Data is then sent to the CABS_agent until the frame buffer is emptied. Once the last frame data was sent to the CABS_agent, FBIF sets frame_done_CABS signal active. Also in the read out phase, the controller 3904 gives a start signal to the clear & readout address generator 3902 and the data handler 3905. The data is written to the CABS interface 3801 via the supersampling block 3901.

The clear phase invoked from the scheduler 3802. The controller sends a start signal to the clear & readout address generator 3902 which generates all addresses for the memory. All memory positions will be written with zero (0) for black.

The data handler 3905 includes logic to recognize the three phases and act accordingly. During the rendering phase, MiPxCaW comes from its interface. A new MiPxCaW comes only if the MiPxCaW is gray. If a MiPxCaW is white, this is as implicit information of the address set, and no micro pixel cache is sent along the data path. The control block 3904 tells the data handler 3905 if the current data is white or gray. The data handler executes one or more logical OR/NAND operations, utilizing the logic described above. In general, memory is read to see if stored data is white, gray or black; a logical OR/NAND is performed, and new data is written into memory. To compensate for the delay in the ZBT-memory 3805 and the pipeline in the ZBT-memory controller 3804 when the data from the memory is read, there is a delay function 3906 in the data path and in the control path in the data handler. During the read out phase, the delay is disabled. During the clear phase, the data handler writes 0 to the memory.

The address generator 3903 is responsive to the current phase of execution. In the rendering phase the address is given by the address sets sent from the MPCB to the FBIF. The address sets are read by the control block and then it sends information to the address generator about: x and y information about the current position in the window; and the address sets from MPCB can be orientated in an up/down or in an down/up orientation. The control block tells the address generator if it should count up or down. A full rendering window is Rend_win_ln_x*Rend_win_ln_y MiPxCaW. The rendering window is stored into the frame buffer in a row after row orientation. For example, Rend_win_ln_y=400 or Rend_win_ln_x=200.

| Adr | 0 1 2 3 4 5 6 7 8 9 10 11 ... 199 200 201 202 ... |
|---|---|
| Data | Row 1 | Row 2 |

In rendering phase a new address is generated each second clock cycle when gray data is rendered. When white data is rendered data is only written to memory and not read, therefore a new address is generated each clock cycle. The control signals Rend_win_offs_x, Rend_win_offs_y contains information about the position of the rendering window in the guard window and the Rend_win_ln_x and Rend_win_ln_y tells the about the size of the rendering window. These are used to determine if a MiPxCaW is positioned in the guard window or in the rendering window. All MiPxCaW are handled equal by FBIF, both in guard and rendering window. But if the address generator detects addresses outside the rendering window the memory enable signal will not be active and thus the corresponding MiPxCaW will not be written into memory. During the read out and clear phases, this logic block is not used.

The clear & readout address generator 3902 is not used during the rendering phase. During the read out phase, data is written to the CABS interface line by line, i.e., the address increment for two consecutive data will be Rend_win_ln_x, except when a new line starts. When a new line starts, the current_line_pointer will be incremented with 1. Between two consecutive lines in the case of blanking the address will be halted according to the blanking parameter, see the below example. With the parameters Rend_win_ln_y=400, Rend_win_ln_x=200 and Blanking=2:

| | | | | | Adr | | | | |
|---|---|---|---|---|---|---|---|---|---|
| | 0 | 1 | 2 | 3 | ... | 199 | 199 | 199 | 200 ... |
| Line Data | D0 | D1 | Line 1 D2 | D3 | ... D199 | Blanking D199 | D199 | Line2 D200 | ... |

In readout phase a new address is generated each clock cycle for the 100 Mpixel/s readout rate and for the 50 Mpixel/s readout rate one address per two clock cycles is generated. To generate addresses in interleaved mode, with two sub_units functioning, an offset will be added to the address: Address_1=adr_gen; Address_2=adr_gen+rend_win_length x/2. In interleaved mode, memory access will be alternate between address_1 and address_2, starting with address_1. If an extension zone is used, address_2 will have the following expression: Address_2=adr_gen+rend_win length x/2-2. In clear phase all memory addresses are generated from 0 to 256 k, for clearing. (This function may not be needed for a memory design that allows for a bulk clear function.)

The address delay logic 3906 is enabled during the rendering phase. Old stored data has to be read in order to perform OR/NAND with new MiPxCaW-data. To compensate for the delay in the ZBT-memory and the pipeline in the ZBT-memory controller in the read process, both data and address has to be delayed. The address delay block delays the address. The delay of data is integrated in the data handler. The address delay logic is disabled during the read out and clear phases.

The super sample logic 3901, in this embodiment, is used during the read out phase, as depicted in FIG. 7.

Second and third embodiments of the FBIF utilize logic adapted to having PMFB and GVFB memories, respectively. As FIG. 32 depicts, a plurality pixel map 3223 and gray scale 3224 memories may be advantageous. The impact of added memories and independent channels for memory access is evident from the following interleave discussions. The pixel map PMFB memory serves as an access qualifier, qualifying the need to access the micro pixel memory for particular pixels. The truth table for pixel map symbol modification is depending on the required rendering operator, which can be either "or" or "and-not". An "*" in the tables denotes any symbol value, meaning "don't care" or "wildcard".

| OR-operation | | | | | | |
|---|---|---|---|---|---|---|
| Before | B | * | B | G | W | G |
| Modify | G | W | B | B | * | G |
| After | G | W | B | G | W | G |

| AND NOT-operation | | | | | | |
|---|---|---|---|---|---|---|
| Before | W | * | W | G | B | G |
| Modify | G | W | B | B | * | G |
| After | G | B | W | G | B | G |

Figure 16D:
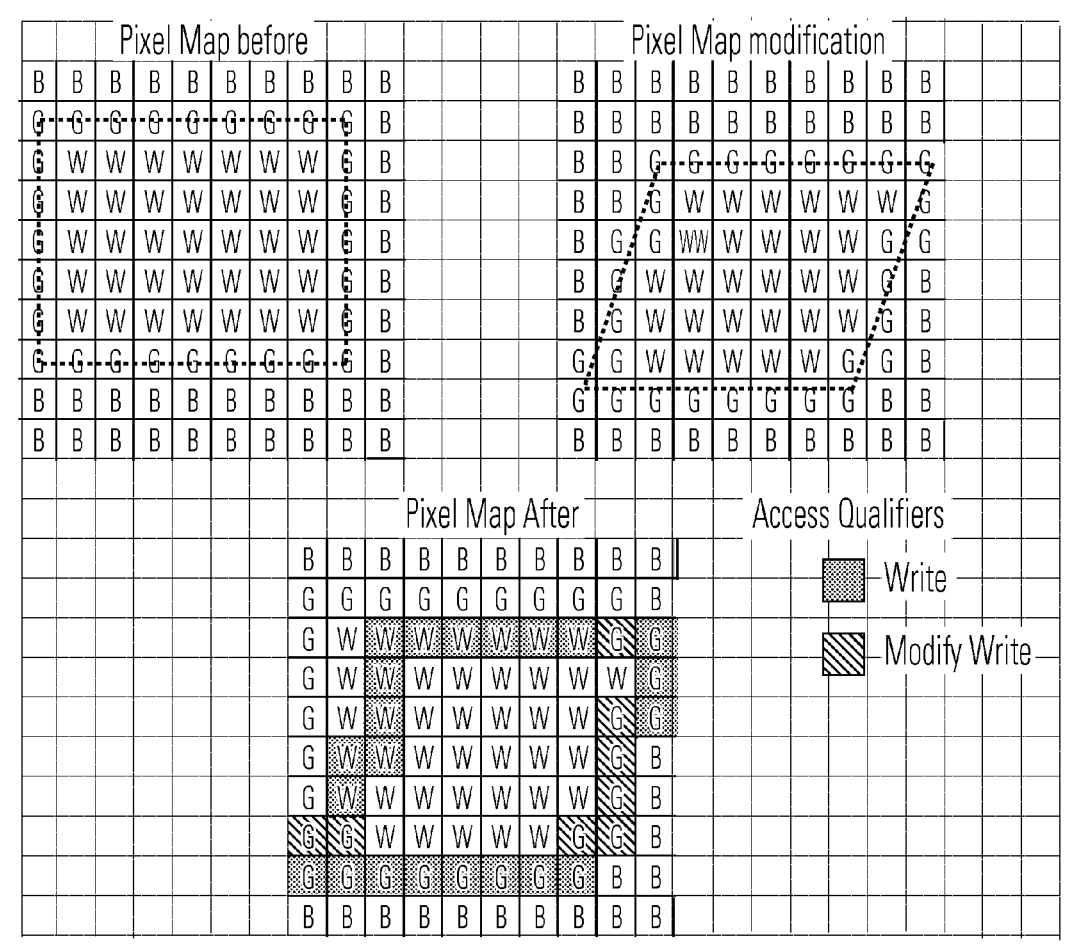

Access qualifiers can be either write, which denotes a single write operation, or modify write, which denotes a read-modify-write operation. For the OR-operation, when the after value for a pixel is W or B, the micro pixel array does not need to be read or written. Instead, the pixel map PMFB memory is set to the appropriate value. When the after value is gray and the before or modify value is black, then either a single write or no write at all will produce the correct gray value in the micro pixel MPFB memory. When a pixel has before and modify values that are gray, the micro pixel array needs to be read, operated on by applying a logical OR- or AND NOT-operation to the before and modify values, followed by a write of the resulting value to the MPFB. Essentially the same access qualifiers can be applied to the AND NOT-operation as to the OR-operation. FIG. 16D illustrates the operation of the access qualifiers. A rectangle is the before value for the pixels. A parallelogram is the modify value for the pixels. A shaded map indicates resulting pixel map values (black, white, gray) after the modify operator. It shows whether the micro pixel MPFB memory was subject to a single write operation, a read-modify-write operation, or was unchanged after the logical OR-operation was applied to modify the rectangle with the parallelogram.

The interleave diagram for the second embodiment is:

| Processor | Buffer | Phase 1 | Phase 2 |
|---|---|---|---|
| RP A | MPFB A | Rendering | Readout/ super-sampling |
| | PMFB A | Rendering | Readout/Clear |
| RP B | MPFB B | Readout/ super-sampling | Rendering |
| | PMFB B | Readout/Clear | Rendering |

The third embodiment, mentioned above, would involve supersampling each time a write or read-modify-write operation was carried out. One or more gray GVFB summary memories would hold the result. Two variations of the third embodiment use pixel map and gray value memories on the same or separate data paths. The first interleave diagram is for two shared PMFB memories (two buffers in same memory, on the same data path) and two shared GVFB memories (two buffers in same memory and data path) (subphases interleaved on a line-by-line bases, one set of four subphases for each readout line, 512 readout lines per overall phase)

|  |  | Phase 1 | | Phase 2 | |
| --- | --- | --- | --- | --- | --- |
| Processor | Buffer | Subphase 1 | Subphase 2 . . . 4 | Subphase 1 | Subphase 2 . . . 4 |
| RP A | MPFB A | Idle (que end) | Rendering | Idle (que end) | Rendering |
|  | PMFB A1 | — | Rendering | Readout/clear | — |
|  | PMFB A2 | Readout/clear | — | — | Rendering |
|  | GVFB A1 | — | Supersampling | Readout | — |
|  | GVFB A2 | Readout | — | — | Supersampling |
| RP B | MPFB B | Idle (que end) | Rendering | Idle (que end) | Rendering |
|  | PMFB B1 | — | Rendering | Readout/clear | — |
|  | PMFB B2 | Readout/clear | — | — | Rendering |
|  | GVFB B1 | — | Supersampling | Readout | — |
|  | GVFB B2 | Readout | — | — | Supersampling |

Que end means that the FIFO buffer prior to the MPFB agent can still be emptied, even though the PM agent is busy reading. This provides load sharing.

In the second variation on the third embodiment, two separate PMFB and two separate GVFB are used, each memory having its own data path or independent channel for memory access.

| Processor | Buffer | Phase 1 | Phase 2 |
| --- | --- | --- | --- |
| RP A | MPFB A | Rendering | Rendering |
|  | PMFB A1 | Rendering | Readout/clear |
|  | PMFB A2 | Readout/clear | Rendering |
|  | GVFB A1 | Supersampling | Readout |
|  | GVFB A2 | Readout | Supersampling |
| RP B | MPFB B | Rendering | Rendering |
|  | PMFB B1 | Rendering | Readout/clear |
|  | PMFB B2 | Readout/clear | Rendering |
|  | GVFB B1 | Supersampling | Readout |
|  | GVFB B2 | Readout | Supersampling |

In the second and third embodiments, the read out and clear phases are combined. The pixel map is cleared when the PMFB and MPFB memories are read. This happens quickly, as the pixel map represents pixels in as few as two bits. There is no need for separate read out and clear phases.

Figure 42:
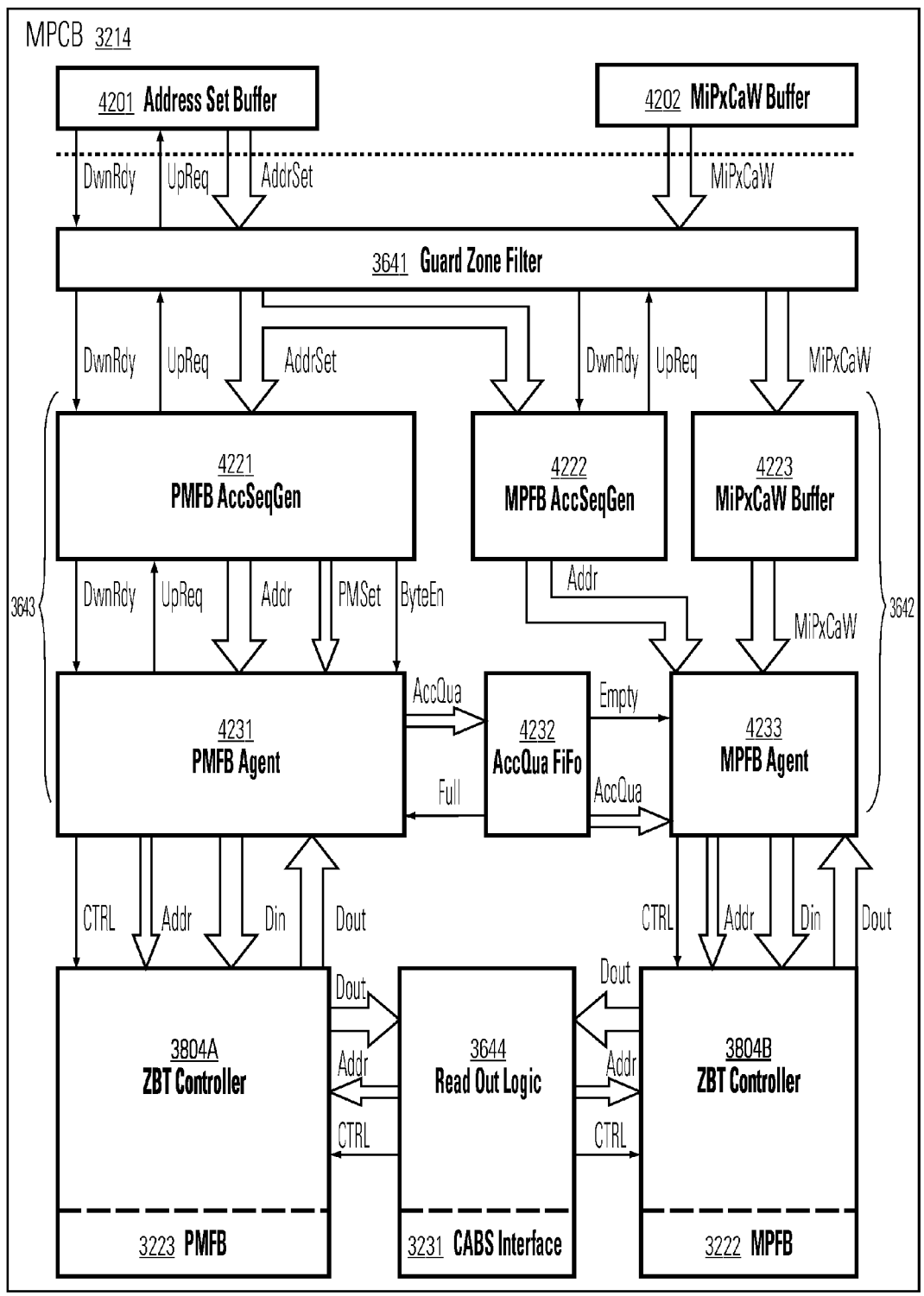
FIG. 42 is a hardware block diagram of a micro pixel cache buffer.

FIG. 42 depicts a rough block structure of the frame buffer interface in the second embodiment. The structural view, in contrast to the functional views, suggests how to incorporate interleaving and pipelining algorithms in order to speed execution. It is useful to separate huge data-buses and to process data in parallel in several smaller logic blocks that not interconnected. Partitioning data into several smaller blocks facilitates physical implementation in a high speed digital device. Block segmentation lends itself to pipelining. The functions of the MPCB 3214 in generating address sets 4201 and micro pixel caches 4202 is as explained above. The guard zone filter, as one embodiment of a guard zone, is 3641. The pixel map frame buffer interface 3643 accesses the PMFB memory 3223 (see FIG. 36.) The micro pixel frame buffer interface 3642 accesses the MPFB memory 3222 (also see FIG. 36.)

In this configuration, the guard zone filter block 3641 shares signals with the MPCB (Micro Pixel Cache Buffer) 3214, the Pixel Map Frame Buffer Access Sequence Generator (PMFB AccSeqGen) 4221, the Micro Pixel Frame Buffer AccSeqGen 4222 and the MiPxCaW Buffer 4223. The following signals are required to determine whether a MiPxCaW is located inside the rendering window or not: Interior_info, MPCS_Y. MPCS_X1S. MPCS_X1E, MPCS_X2S and MPCS_X2E are the coordinates relative to the left corner of the guard window in x- and y-direction; Rend_win_offs_x and rend_win offs_y indicate the position of the origin of the rendering window; Rend_win_ln_x and rend_win_ln_y indicate the dimension of the rendering window; and a pair of handshake signals (Downward_Ready/Up_Request) in order to arbitrate the data flow between this block and the MPCB (Micro Pixel Cache Buffer) 4202.

The pixel map frame buffer access sequence generator 4221 shares signals with the guard zone filter 3641 and the PMFB Agent 4231. It receives including address Sets from (X,Y, interior_info) from Guard zone filter; a pair of handshake signals (Downward_Ready/Up_Request) that arbitrate the data flow between this block and the Guard zone filter; Address and Byte Enable corresponding to the Pixel Map Set to be processed in the PMFB Agent; and a signal used to indicate the presence of data available for processing (PMFB AccSeqGen->PMFB Agent) and a signal used to indicate that PMFB Agent is ready to receive data from PMFB AccSeqGen.

The PMFB agent 4231 reads one Address Set (AS) at a time and generates a sequence of PMFB (Pixel Map Frame Buffer) accesses. For each AS of X1S, X1E, X2S, X2E, Y a sequence of PMFB accesses will be generated. A PMFB access consists of a PM Set access addressed by word position [(0 . . . Xsize/4-1), (0 . . . Ysize/4-1)] and set number [0 . . . 3]. The set number will be used as a byte enable signal in the PMFB Agent.

Figure 43:
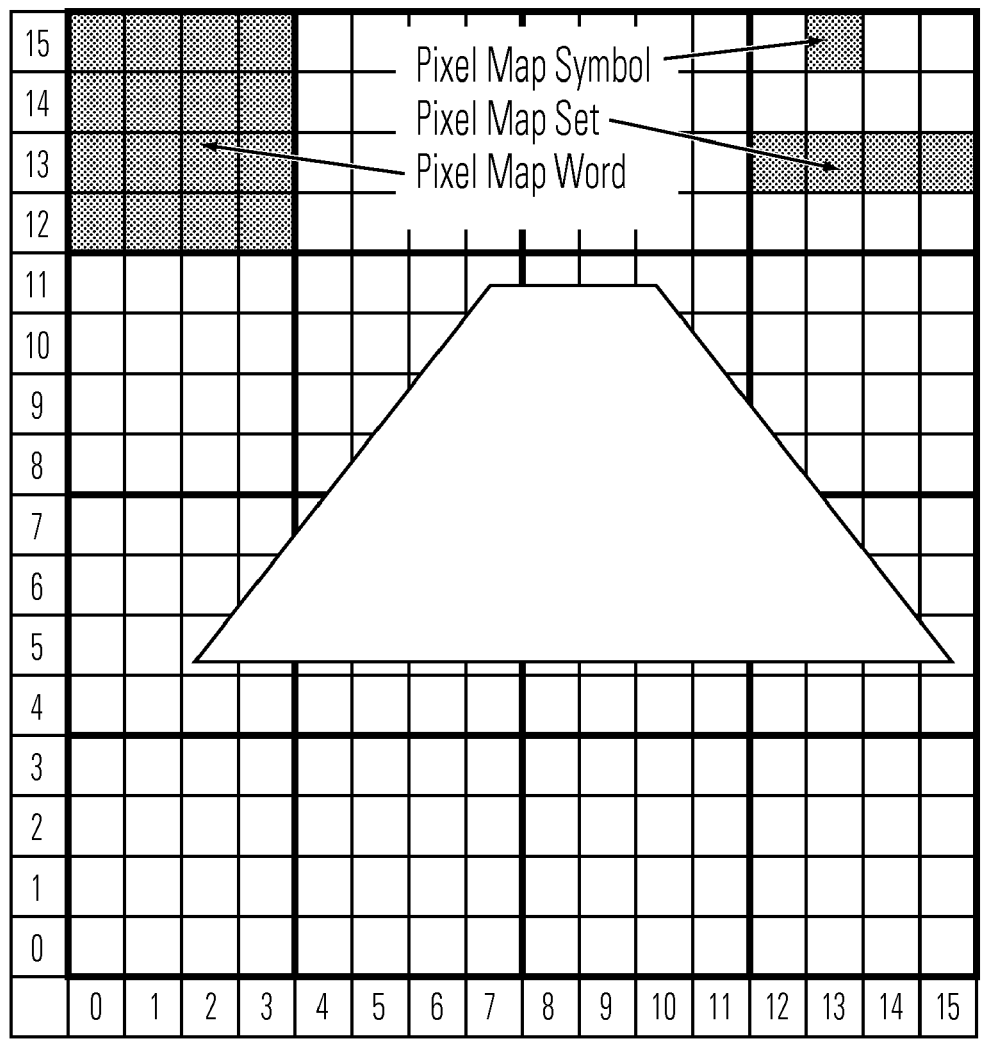
FIG. 43 illustrates memory access in one embodiment of hardware implementing aspects of the present invention.

FIG. 43 illustrates one memory organization that can be used to practice aspects of the present invention. In this organization, a Pixel Map Symbol has a value of W=White, G=Grey, B=Black, a Pixel Map Set includes four Pixel Map Symbols arranged as an 8-bit word, and a Pixel Map Word includes four Pixel Map Sets, arranged as a 32-bit word. The following RMW procedures are supported in this memory organization: Read of 8-bit word (24 remaining bits discarded), Write using a mask (byte enable), and Read of 32-bit word, write of 32-bit word. Referring again to FIG. 43, assume that row number eight is processed by the PMFB AccSeqGen 4221. A sequence of three memory accesses will be generated.

|  | Sequence 1 | Sequence 2 | Sequence 3 |
| --- | --- | --- | --- |
| PM Set | GGWW | WWWW | GGBB |
| Byte Enable corresponding | 0 | 0 | 0 |
| Memory Word Position | (1, 2) | (2, 2) | (3, 2) |

The PMFB agent 4231 constructs a generic pixel map container to handle intermediate storage of either a PM Set or a PM Word. The container contains one to four symbol sets and a word address. The container has one pixel map set entry:

| | Set array | Set valid | Operator |
|---|---|---|---|
| Set 0 | ssss | v | op |
| Set 1 | ssss | v | op |
| Set 2 | ssss | v | op |
| Set 3 | ssss | v | op | s = pixel map symbol [W, G, B]
v = validity state [True, False]
op = operator [Or, AndNot]

Examples

| | Set array | Set valid | Comment |
|---|---|---|---|
| Set 0 | — | False | No modification on set 0 |
| Set 1 | — | False | No modification on set 1 |
| Set 2 | WWWG | True | v |
| Set 3 | — | False | v |
| Set 0 | — | False | No modification on set 0 |
| Set 1 | WWGG | True | Set 1 is modified with symbols WWGG |
| Set 2 | WWWG | True | Set 2 is modified with symbols WWWG |
| Set 3 | — | False | V |

The PMFB agent 4231 shares signals with the ZBT-controller 3804A, PMFB-AccSeqGen 4231 and the Access Qualifier FIFO 4232. The interface between PMFB AccSeqGen and PMFB-Agent is mentioned above. The interface between AccQua FiFo 4232 and PMFB-Agent 4231 includes sending Access Qualifiers to the FiFo. To allow new data to be written, a Write Enable is needed as well as a FiFo status flag, e.g., fifo_full or fifo_overrun. The Interface between PMFB-Agent 4231 and the ZBT-controller 3804A includes: Address, data in, data out, read_write, and byte enable signals. In addition, the Rendering Window Logical Operator (RWLOper), included in the generic container, is needed to determine which logical operator to use to perform the rendering process.

The purpose of the MPFB AccSeqGen 4222 is to generate addresses corresponding to the MiPxCaW stored in the MiPxCaW-buffer 4223. Addresses are generated outgoing from the Y-value, X1S, X1E, X2S and X2E. S indicates start and E indicates end. Below are logical rules for the address set:

X1S<X1E: MiPxCaW are stored in MPCB with the lowest address data first in a region from X1S to X1E. (Left edge)

X1S>X1E: MiPxCaW are stored in MPCB with the highest address data first in the region from X1S to X1E. (Left edge)

X2S<X2E: MiPxCaW are stored in MPCB with the lowest address data first in a region from X2S to X2E. (Right edge)

X2S>X2E: MiPxCaW are stored in MPCB with the highest address data first in the region from X2S to X2E. (Right edge)

Moreover, this block must indicate upward, i.e., to the guard zone filter, that it is ready to receive a new address set as soon as it has sent the last address to the MPFB-Agent 4233, corresponding to the previously received address set.

The MPFB AccSeqGen 4222 has a common interface with the Guard Zone Filter 3641 and with the Micro Pixel Frame Buffer Agent 4233. The Guard Zone Filter sends address sets on request: X1S, X1E, X2S, X2E and the interior_info flag. A pair of handshake signals (Downward_Ready/Up_Request) arbitrate the data flow between this logic block and the Guard zone filter. At the interface between the MPFB-Agent and the MFB access sequence generator block 4222, the address to be used for the corresponding MiPxCaW (stored in the MiPxCaW-buffer) as well as dataflow arbitration signals are transferred.

The MiPxCaW-buffer 4223 is nothing more than a FIFO-buffer. It accommodates a high clock frequency required in this design (100 MHz) and is generally FloorPlanner-friendly. Four DPRAM blocks are provided required to store the largest geometry (253 MiPxCaW), i.e., the 64-bit word is split up in four 16-bit words. The MiPxCaW-buffer 4223 has a common interface with the Guard zone filter and the MPFB-Agent. At the interface between the Guard Zone Filter and this block, the MiPxCaW flow to the buffer and a write enable signal are necessary to supply the FiFo. At the interface between the MPFB-Agent and this block, the MiPxCaW flow from the buffer and a read enable signal are necessary to fetch data from the FiFo.

The MP frame buffer agent 4233 performs operations on the MPFB 3222 on a MiPxCaW by MiPxCaW basis, i.e., one 64-bit word at a time. The Agent performs write or read-modify-write operations depending on the value of the access qualifier, AccQua. The truth table for MiPxCaW modification depends on the logical rendering operator, which can be either "OR" or "AND-NOT". If the AccQua for, a given couple (address, MiPxCaW), is Write, then the MiPxCaW has just to be written to the corresponding address. But if the AccQua is Modify-Write, then the value stored in the MPFB must first be fetched from the position pointed out by the address. After that the data can be modified according to the rendering window operator. However, the data and the address must be stored in a queue while waiting for the data to be retrieved. There is a latency (approximately 10 clock cycles) between the moment the Agent sends address and control signals to the ZBT-controller 3804B and the moment the corresponding data is available on the Dout-bus. This implies that a cache coherency contention can occur if, for instance, two overlapping geometries are written after each other in the MPFB. This can be solved with a CAM structure that monitors the addresses used to access the memory. A possible implementation is to store the last 10 addresses a to issue a match indicator if an address is present twice in the CAM-structure. This implies a temporary interruption in operations until the match indicator disappears.

The micro pixel frame buffer agent 4233 logic block has a common interface with the AccQua FiFo 4232, the MPFB AccSeqGen 4222, the MiPxCaW buffer 4223 and the ZBT controller 3804B. A read enable signal that is common to the FiFo, the buffer and the address generator triggers the release of a new AccQua, address and MiPxCaW. At the interface between the FiFo and this block, there are AccQua and a FiFo-status indicator, for example FiFo-empty flag. At the interface between the MPFB AccSeqGen and this block, there are an address bus and a pair of arbitration signals, for example ready/proceed. At the interface between the MiPxCaW buffer and this block, there are MiPxCaW bus and a pair of arbitration signals, for example ready/proceed. It is possible that the pair of arbitration signals are the same as the ones used between this block and the MPFB AccSeqGen.

Finally, the interface between the ZBT-controller and this block is as discussed above, for the PMFB agent.

The read out logic 3644 has a common interface with both frame buffers (via the ZBT-controllers) and the CABS bus.

The clocking strategy calls for the logic blocks of the FBIF to be clocked with clk_c2 clock, at a doubled frequency of 100 MHz. The read out logic is to be clocked with the clk_c1 clock as well, which has the base frequency of 50 MHz. Two clock frequencies can be used to drive the CABS interface, which uses the clk_c1 clock, and the ZBT-controller, which uses the clk_c2 clock. Both clocks are generated of the same DLL, which means that the skew should be negligible. That is, both clocks can be considered as synchronous clocks. Wherever a transition is to be made between those two clock domains two approaches can be considered: either use only the clk_c2 clock and use multi clock cycle path wherever needed or use both clk_c2 and clk_c1.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

We claim as follows:

1. A method of calculating a value for a multi-valued pixel corresponding to part of an edge of a polygon, including:
   providing an array of sub-pixels;
   providing a set of pre-calculated sub-pixel area maps corresponding to edges having predetermined orientations;
   representing the part of the edge of the polygon by sub-pixels that are filled or empty, by applying the pre-calculated sub-pixel area maps to the array of sub-pixels;
   super-sampling a set of sub-pixels corresponding to a pixel and assigning a value to the pixel corresponding to the number of sub-pixels in the set that are either filled or empty.

2. The method of claim 1, wherein the pre-calculated sub-pixel area map is represented as an array of fill bars; and applying the pre-calculated sub-pixel bar map further includes applying an offset value to the fill bars corresponding to an intersection of the edge and a boundary of an area represented by the array of sub-pixels.

3. The method of claim 1, wherein the multi-valued pixel has discrete positions of potential intercepts for the edge of the polygon and the predetermined orientations are limited to orientations that connect the discrete positions, further including:
   selecting from the set of pre-calculated sub-pixel area maps and applying at least one of the pre-calculated sub-pixel area maps using at least one of the intercepts and an orientation of the edge.

4. The method of claim 1, wherein the multi-valued pixel has discrete positions of potential intercepts for the edge of the polygon and the predetermined orientations are limited to orientations that connect the discrete positions, further including:
   selecting from the set of pre-calculated sub-pixel area maps and applying at least one of the pre-calculated sub-pixel area maps using two intercepts and an orientation of the edge with boundaries of the multi-valued pixel.

5. The method of claim 1, further including pre-calculating and selecting the sub-pixel area maps for the pixel, the pixel having at least first and second edges, by:
   constructing a segment between intercepts along the first and second edges, the segment defining first and second regions of the pixel;
   wherein the intercepts are limited to discrete positions along edges of the pixel;
   forming candidate sets of sub-pixels to represent the first region, the sub-pixels in the set being completely or partially within the first region;
   determining a variance between area coverage of the candidate subsets and area coverage of the first region;
   evaluating corners formed by combining the candidate subsets with sub-pixel bar maps for other segments; and
   selecting from among the candidate subsets based on the determination of variance and the evaluation of corners; and
   storing the selected candidate subset.

6. The method of claim 5, wherein the corners are formed as an intersection of first and second edges of a polygon, further including:
   providing a memory including a first array of sub-pixels and a second array of sub-pixels, both first and second arrays corresponding to a pixel;
   extending the first and second edges into first and second lines;
   setting the sub-pixels of the first array to filled or empty, corresponding to a first region defined by the first line;
   setting the sub-pixels of the second array to filled or empty, corresponding to a second region defined by the second line;
   calculating an intersection of the first array and the second array; and
   super-sampling from the calculated intersection a set of sub-pixels corresponding to a pixel and assigning a value to the pixel corresponding to the sub-pixels.

7. A method of pre-calculating and making available sub-pixel area maps for a pixel, the pixel divided into sub-pixels and having at least first and second edges, by:
   constructing a segment between intercepts along the first and second edges, the segment defining first and second regions of the pixel;
   wherein the intercepts are limited to discrete positions along edges of the pixel;
   forming candidate sets of sub-pixels to represent the first region, the sub-pixels in the set being completely or partially within the first region;
   determining a variance between area coverage of the candidate subsets and area coverage of the first region;
   evaluating corners formed by combining the candidate subsets with sub-pixel bar maps for other segments; and
   selecting from among the candidate subsets based on the determination of variance and the evaluation of corners; and
   storing the selected candidate subset.

8. A method of calculating a value of a pixel corresponding to a corner this is formed as an intersection of first and second edges of a polygon, including:
   providing a memory including a first array of sub-pixels and a second array of sub-pixels, both first and second arrays corresponding to a pixel;
   extending the first and second edges into first and second lines;
   setting the sub-pixels of the first array to filled or empty, corresponding to a first region defined by the first line;
   setting the sub-pixels of the second array to filled or empty, corresponding to a second region defined by the second line;

calculating an intersection of the first array and the second array; and super-sampling from the calculated intersection a set of sub-pixels corresponding to a pixel and assigning a value to the pixel corresponding to the sub-pixels.

9. The method of claim 8, wherein the arrays of sub-pixels correspond to rectangles and setting the sub-pixels corresponding to the regions further includes providing a plurality of pre-calculated sub-pixel bar maps corresponding to potential intercepts and potential orientations of the lines with the rectangles.

10. The method of claim 9, wherein the potential intercepts are limited to discrete positions along edges of the rectangles and the potential orientations are limited to orientations that connect the discrete positions.

11. The method of claim 9, wherein two opposing edges of the rectangles are subdivided by no more than 64 sub-pixels and the discrete positions are limited to no more than 33 positions per sub-pixel.

12. The method of claim 9, wherein the rectangles are subdivided into 32 by 16 sub-pixels and there are 17 discrete positions from along one edge of the sub-pixel.

13. The method of claim 9, wherein the rectangles are subdivided into 16 by 8 sub-pixels and there are 9 discrete positions from along one edge of the sub-pixel.

* * * * *